US011835962B2

(12) United States Patent
Halder

(10) Patent No.: US 11,835,962 B2
(45) Date of Patent: Dec. 5, 2023

(54) ANALYSIS OF SCENARIOS FOR CONTROLLING VEHICLE OPERATIONS

(71) Applicant: SafeAI, Inc., Milpitas, CA (US)

(72) Inventor: Bibhrajit Halder, Sunnyvale, CA (US)

(73) Assignee: SafeAI, Inc., Santa Clara, CA (US)

( * ) Notice: Subject to any disclaimer, the term of this patent is extended or adjusted under 35 U.S.C. 154(b) by 125 days.

(21) Appl. No.: 17/497,202

(22) Filed: Oct. 8, 2021

(65) Prior Publication Data

US 2022/0026921 A1 Jan. 27, 2022

Related U.S. Application Data

(63) Continuation of application No. 16/378,391, filed on Apr. 8, 2019, now Pat. No. 11,169,536, which is a
(Continued)

(51) Int. Cl.
  *G05D 1/02* (2020.01)
  *G05D 1/00* (2006.01)

(52) U.S. Cl.
  CPC ......... *G05D 1/0274* (2013.01); *G05D 1/0088* (2013.01)

(58) Field of Classification Search
  CPC .............. G05D 1/0274; G05D 1/0088; B60W 2520/10; B60W 2520/105;
(Continued)

(56) References Cited

U.S. PATENT DOCUMENTS

| 7,857,760 B2 | 12/2010 | Brister et al. |
| 8,133,178 B2 | 3/2012 | Brauker et al. |
(Continued)

FOREIGN PATENT DOCUMENTS

| BR | 102013007805 A2 | 2/2018 |
| CN | 101784774 A | 7/2010 |
(Continued)

OTHER PUBLICATIONS

U.S. Appl. No. 16/124,176, Non-Final Office Action dated Dec. 27, 2019, 8 pages.
(Continued)

*Primary Examiner* — Michael V Kerrigan
(74) *Attorney, Agent, or Firm* — KILPATRICK TOWNSEND & STOCKTON LLP

(57) ABSTRACT

Techniques are described herein for determining one or more actions for an autonomous vehicle to perform, based on simulation of at least one possible scenario. A possible scenario may involve, for example, the autonomous vehicle interacting with an object in the environment. The possible scenario may be simulated by modifying a first internal map containing information about the autonomous vehicle and the environment. As part of the simulation, one or more parameters of the first internal map can be modified in order to, for example, determine the state of the object at a particular point in the future. Based on the modification of the one or more parameters, a second internal map representing a possible scenario is generated from the first internal map. Both the first internal map and the second internal map can be evaluated to decide which action to take.

20 Claims, 22 Drawing Sheets

Related U.S. Application Data continuation-in-part of application No. 16/124,176, filed on Sep. 6, 2018, now Pat. No. 10,809,735.

(60) Provisional application No. 62/654,526, filed on Apr. 9, 2018.

(58) Field of Classification Search
CPC . B60W 2554/4042; B60W 2554/4044; B60W 2554/802; B60W 2554/806; B60W 2556/50; B60W 60/00; G06F 30/20
See application file for complete search history.

(56) References Cited

U.S. PATENT DOCUMENTS

| | | | |
|---|---|---|---|
| 8,233,959 B2 | 7/2012 | Kamath et al. | |
| 8,930,023 B2 | 1/2015 | Gutmann et al. | |
| 9,187,088 B1 | 11/2015 | Ferguson et al. | |
| 9,247,900 B2 | 2/2016 | Brister et al. | |
| 9,417,637 B2 | 8/2016 | Matsuoka et al. | |
| 9,446,194 B2 | 9/2016 | Kamath et al. | |
| 10,025,316 B1 | 7/2018 | Hilnbrand et al. | |
| 10,182,746 B1 | 1/2019 | Demiralp et al. | |
| 10,809,735 B2 | 10/2020 | Halder | |
| 10,976,178 B2 | 4/2021 | Piemonte et al. | |
| 11,169,536 B2 | 11/2021 | Halder | |
| 11,467,590 B2 | 10/2022 | Halder | |
| 11,561,541 B2 | 1/2023 | Halder | |
| 11,625,036 B2 | 4/2023 | Halder | |
| 2004/0258360 A1 | 12/2004 | Lim et al. | |
| 2007/0112700 A1 | 5/2007 | Den Haan et al. | |
| 2008/0027590 A1 | 1/2008 | Phillips et al. | |
| 2008/0144944 A1 | 6/2008 | Breed | |
| 2008/0236275 A1 | 10/2008 | Breed et al. | |
| 2009/0234499 A1 | 9/2009 | Nielsen et al. | |
| 2010/0106356 A1 | 4/2010 | Trepagnier et al. | |
| 2011/0098922 A1* | 4/2011 | Ibrahim | G01C 21/3697 701/532 |
| 2011/0125323 A1 | 5/2011 | Gutmann et al. | |
| 2011/0141311 A1 | 6/2011 | Varillon | |
| 2011/0190972 A1 | 8/2011 | Timmons et al. | |
| 2012/0089291 A1 | 4/2012 | Halder et al. | |
| 2012/0281907 A1 | 11/2012 | Samples et al. | |
| 2013/0302758 A1 | 11/2013 | Wright | |
| 2014/0142785 A1 | 5/2014 | Fuentes et al. | |
| 2014/0304436 A1 | 10/2014 | Mortensen et al. | |
| 2015/0310281 A1 | 10/2015 | Zhu et al. | |
| 2015/0339570 A1 | 11/2015 | Scheffler | |
| 2016/0096270 A1 | 4/2016 | Ibarz Gabardos et al. | |
| 2016/0221500 A1 | 8/2016 | Sakai et al. | |
| 2017/0060132 A1 | 3/2017 | Chung et al. | |
| 2017/0147722 A1 | 5/2017 | Greenwood | |
| 2017/0151910 A1 | 6/2017 | Sato | |
| 2017/0168146 A1 | 6/2017 | Boehmke | |
| 2017/0178424 A1 | 6/2017 | Wright | |
| 2017/0248963 A1 | 8/2017 | Levinson et al. | |
| 2017/0297576 A1 | 10/2017 | Halder et al. | |
| 2017/0357270 A1 | 12/2017 | Russell | |
| 2018/0032040 A1 | 2/2018 | Sweet, III et al. | |
| 2018/0032042 A1 | 2/2018 | Turpin et al. | |
| 2018/0074493 A1 | 3/2018 | Prokhorov et al. | |
| 2018/0089563 A1* | 3/2018 | Redding | G06N 3/006 |
| 2018/0093676 A1 | 4/2018 | Emura et al. | |
| 2018/0107770 A1 | 4/2018 | Cahoon et al. | |
| 2018/0136000 A1 | 5/2018 | Rasmusson, Jr. et al. | |
| 2018/0136644 A1 | 5/2018 | Levinson et al. | |
| 2018/0233047 A1 | 8/2018 | Mandeville-Clarke | |
| 2019/0025857 A1 | 1/2019 | Luckevich et al. | |
| 2019/0047586 A1 | 2/2019 | Sekine | |
| 2019/0094858 A1 | 3/2019 | Radosavljevic et al. | |
| 2019/0113927 A1 | 4/2019 | England et al. | |
| 2019/0291727 A1 | 9/2019 | Shalev-Shwartz et al. | |
| 2019/0310627 A1 | 10/2019 | Halder | |
| 2019/0310636 A1 | 10/2019 | Halder | |
| 2019/0310650 A1 | 10/2019 | Halder | |
| 2019/0310654 A1 | 10/2019 | Halder | |
| 2019/0361672 A1 | 11/2019 | Odhner et al. | |

FOREIGN PATENT DOCUMENTS

| | | |
|---|---|---|
| CN | 102227612 A | 10/2011 |
| CN | 104380349 A | 2/2015 |
| CN | 102782733 B | 11/2015 |
| CN | 105388801 A | 3/2016 |
| CN | 106144861 A | 11/2016 |
| CN | 106456067 A | 2/2017 |
| CN | 107650795 A | 2/2018 |
| CN | 107650796 A | 2/2018 |
| CN | 108290540 A | 7/2018 |
| CN | 108292134 A | 7/2018 |
| CN | 108292356 A | 7/2018 |
| CN | 108725446 A | 11/2018 |
| CN | 110050455 A | 7/2019 |
| CN | 111950725 A | 11/2020 |
| DE | 102009001242 A1 | 9/2010 |
| DE | 202016004628 U1 | 9/2016 |
| EP | 2733560 A1 | 5/2014 |
| WO | 2005103848 A1 | 11/2005 |
| WO | 2008005659 A2 | 1/2008 |
| WO | 2017091629 A1 | 6/2017 |
| WO | 2019094729 A1 | 5/2019 |

OTHER PUBLICATIONS

U.S. Appl. No. 16/124,176, Notice of Allowance dated Jun. 16, 2020, 8 pages.

U.S. Appl. No. 16/378,204, Corrected Notice of Allowability dated Aug. 11, 2022, 2 pages.

U.S. Appl. No. 16/378,204, Final Office Action dated Jan. 25, 2022, 55 pages.

U.S. Appl. No. 16/378,204, Non-Final Office Action datedS ep. 27, 2021, 53 pages.

U.S. Appl. No. 16/378,204, Notice of Allowance dated Jun. 6, 2022, 5 pages.

U.S. Appl. No. 16/378,257, Final Office Action dated Jan. 18, 2022, 43 pages.

U.S. Appl. No. 16/378,257, Non-Final Office Action dated Apr. 29, 2022, 42 pages.

U.S. Appl. No. 16/378,257, Non-Final Office Action dated Aug. 12, 2021, 46 pages.

U.S. Appl. No. 16/378,257, Notice of Allowance dated Sep. 20, 2022, 11 pages.

U.S. Appl. No. 16/378,387, Final Office Action dated Feb. 15, 2022, 15 pages.

U.S. Appl. No. 16/378,387, Non-Final Office Action dated Jun. 8, 2022, 17 pages.

U.S. Appl. No. 16/378,387, Non-Final Office Action dated Sep. 27, 2021, 23 pages.

U.S. Appl. No. 16/378,387, Notice of Allowance dated Dec. 7, 2022, 9 pages.

U.S. Appl. No. 16/378,391, Non-Final Office Action dated Dec. 24, 2020, 11 pages.

U.S. Appl. No. 16/378,391, Notice of Allowance dated Jun. 16, 2021, 8 pages.

U.S. Appl. No. 16/378,391, Supplemental Notice of Allowability dated Oct. 8, 2021, 2 pages.

Gal, "Uncertainty in Deep Learning", Department of Engineering of University of Cambridge, PhD Thesis, Sep. 2016, 174 pages.

Garcia, "Cosine Similarity Tutorial", Research Gate, Available Online at: https://www.researchgate.net/publication/327248753_Cosine_Similarity_Tutorial, Apr. 2015, 8 pages.

Kardell et al., "Autonomous Vehicle Control via Deep Reinforcement Learning", Department of Electrical Engineering, Chalmers University of Technology, Available online at: http://publications.lib.chalmers.se/records/fulltext/252902/252902.pdf, Oct. 2017, 73 pages.

(56) References Cited

OTHER PUBLICATIONS

Lecun et al., "Gradient-Based Learning Applied to Document Recognition", Proceedings of the Institute of Electrical and Electronics Engineers, vol. 86, No. 11, Nov. 1998, pp. 2278-2324.
Leon et al., "A Generalized Mahalanobis Distance for Mixed Data", Journal of Multivariate Analysis, vol. 92, Jan. 2005, pp. 174-185.
Mahalanobis, "On the Generalized Distance in Statistics", National Institute of Sciences of India, vol. 2, No. 1, Apr. 15, 1936, pp. 49-55.
Martos et al., "On the Generalization of the Mahalanobis Distance", Progress in Pattern Recognition, Image Analysis, Computer Vision, and Applications, Lecture Notes in Computer Science, vol. 8258, Part 1, 2013, pp. 125-132.
Application No. PCT/US2019/026641, International Preliminary Report on Patentability dated Oct. 22, 2020, 7 pages.
Application No. PCT/US2019/026641, International Search Report and Written Opinion dated Jul. 11, 2019, 8 pages.
Application No. PCT/US2019/026645, International Preliminary Report on Patentability dated Oct. 22, 2020, 8 pages.
Application No. PCT/US2019/026645, International Search Report and Written Opinion dated Jul. 3, 2019, 9 pages.
Application No. PCT/US2019/026648, International Preliminary Report on Patentability dated Oct. 22, 2020, 11 pages.
Application No. PCT/US2019/026648, International Search Report and Written Opinion dated Jul. 3, 2019, 12 pages.
Application No. PCT/US2019/026651, International Preliminary Report on Patentability dated Oct. 22, 2020, 11 pages.
Application No. PCT/US2019/026651, International Search Report and Written Opinion dated Jul. 5, 2019, 12 pages.
Application No. PCT/US2019/026653, International Preliminary Report on Patentability dated Oct. 22, 2020, 11 pages.
Application No. PCT/US2019/026653, International Search Report and Written Opinion dated Jul. 2, 2019, 12 pages.

\* cited by examiner

ANALYSIS OF SCENARIOS FOR CONTROLLING VEHICLE OPERATIONS

CROSS-REFERENCES TO RELATED APPLICATIONS

The present application is a continuation of U.S. Non-Provisional application Ser. No. 16/378,391, filed Apr. 8, 2019, which is non-provisional of and claims the benefit and priority from U.S. Provisional Application Ser. No. 62/654,526, filed Apr. 9, 2018, the entire contents of which are herein incorporated by reference for all purposes.

U.S. Non-Provisional application Ser. No. 16/378,391 claims the benefit and priority of and is a continuation-in-part (CIP) application of U.S. Non-Provisional application Ser. No. 16/124,176, filed Sep. 6, 2018, which in turn claims priority from and is a non-provisional of U.S. Provisional Application Ser. No. 62/654,526, filed Apr. 9, 2018. The entire contents of the Ser. No. 16/124,176 application are herein incorporated by reference for all purposes.

The entire contents of the following applications, filed concurrently with the present application, are also incorporated herein by reference for all purposes.
(1) U.S. Non-Provisional application Ser. No. 16/378,204, filed Apr. 8, 2019, titled "TECHNIQUES FOR CONSIDERING UNCERTAINTY IN USE OF ARTIFICIAL INTELLIGENCE MODELS,";
(2) U.S. Non-Provisional application Ser. No. 16/378,257, filed Apr. 8, 2019, titled "DYNAMICALLY CONTROLLING SENSOR BEHAVIOR,"; and
(3) U.S. Non-Provisional application Ser. No. 16/378,387, filed Apr. 8, 2019, titled "USER INTERFACE FOR PRESENTING DECISIONS,".

BACKGROUND

Recent times have witnessed a significant increase in the use of autonomous driving technologies (e.g., autonomous vehicles). This has, in part, been driven by the large scale adoption and application of Artificial Intelligence (AI) based technologies to the autonomous driving domain. Autonomous driving applications are currently using AI-based technologies to perform operations such as identifying objects in an autonomous vehicle's environment, making automatic decisions affecting the motion of the vehicle, and the like. Current autonomous driving solutions using AI systems are however not well equipped for ensuring functional safety. This presents a significant hurdle in the use and adoption of these technologies by consumers.

SUMMARY

The present disclosure relates to the field of autonomous vehicles, and more specifically to techniques, including artificial intelligence and machine learning-based techniques, used by an autonomous vehicle management system of an autonomous vehicle for controlling operations of the autonomous vehicle in a safe manner. Various inventive embodiments are described herein, including methods, systems, non-transitory computer-readable storage media storing programs, code, or instructions executable by one or more processors, and the like.

An infrastructure is provided that improves the safety of autonomous systems such as autonomous vehicles, autonomous machines, and the like. An autonomous vehicle management system (also referred to as a controller system) is described that is configured to automatically control one or more autonomous functions or operations performed by the vehicle or machine such that the autonomous operations are performed in a safe manner. Examples of autonomous operations include, without limitation, autonomous driving or navigation along a path, scooping and dumping operations, moving materials or objects (e.g., moving dirt or sand from one area to another), lifting materials, driving, rolling, spreading dirt, excavating, transporting materials or objects from one point to another point, and the like.

In certain embodiments, the autonomous vehicle management system is configured to receive sensor data from one or more sensors associated with an autonomous vehicle. Based upon this sensor data, the autonomous vehicle management system is configured to generate and keep updated an internal map for the autonomous vehicle, where the internal map includes information representative of the autonomous vehicle's state of the autonomous vehicle's environment (e.g., objects detected in the vehicle's environment). Based upon the internal map and based upon other inputs, such as the goal (e.g., change lanes, turn left/right, perform a specialized operation such as digging, scooping, etc.) to be performed by the autonomous vehicle, safety considerations, and the like, the autonomous vehicle management system is configured to generate a plan of action for the autonomous vehicle such that the goal is achieved in a safe manner. The plan of action may identify a sequence of one or more planned actions to be performed by the autonomous vehicle in order for the autonomous vehicle to achieve the goal in a safe manner. The autonomous vehicle management system may then control one or more vehicle systems (e.g., braking system, steering system, propulsion system for driving the autonomous vehicle, electrical systems, auxiliary systems (e.g., systems for outputting information to a driver or passenger of the autonomous vehicle) to perform the actions in the plan of action.

The autonomous vehicle management system may use various artificial intelligence (AI) based techniques (e.g., neural networks, reinforcement learning (RL) techniques, etc.) and models as part of its processing. For example, the autonomous vehicle management system may use a Convolutional Neural Network (CNN) to identify objects in the autonomous vehicle's environment from sensor data (e.g., images captured by cameras mounted on the autonomous vehicle) captured by one or more sensors of the autonomous vehicle. As another example, the autonomous vehicle management system may use RL-based techniques to identify the set of actions to be included in the plan of action to be performed by the autonomous vehicle to achieve a particular goal in a safe manner.

The autonomous vehicle management system uses various different techniques to improve the overall safety of performing the autonomous operations. For example, as part of its decision-making processing, the autonomous vehicle management system can evaluate and simulate various "what-if" scenarios. These what-if scenarios project various behavioral predictions onto the internal map and can be used to determine a safe sequence of actions to be performed by the autonomous vehicle in order to accomplish a particular goal. For example, if the autonomous vehicle is to make a right turn, the autonomous vehicle management system may run various what-if scenarios to determine an action or a sequence of actions to be performed to achieve this turn in the safest manner. Each what-if scenario may simulate a different behavioral pattern (e.g., simulating different speeds of surrounding vehicles, simulating different paths taken by the surrounding vehicles, occurrences of pedestrians around the autonomous vehicle, and the like). Based upon these what-if simulations, the autonomous vehicle management system can then decide the safest action or sequence of actions to be taken by the autonomous vehicle to make the turn in a safe manner.

In certain embodiments, a controller system may use various techniques to determine, based on simulation of at least one possible scenario, one or more actions for an autonomous vehicle to perform in order to safely accomplish a particular goal. A possible scenario may involve, for example, behavior by the autonomous vehicle or by an object in the environment that results in an undesirable interaction between the autonomous vehicle and the object (e.g., a collision). The possible scenario may be simulated by modifying an internal map containing information about the autonomous vehicle and the environment, where the internal map is generated based on current sensor information. As part of the simulation, one or more parameters of the internal map can be modified in order to, for example, determine the state of an object at a particular point in the future. In this manner, the selection of an action can be based on information about the present situation as well as information about a situation that could develop, for example, as a result of a particular behavior of the object in the environment.

In certain embodiments, a simulation is performed by a controller system configured to control an autonomous operation of a vehicle. The controller system may be communicatively coupled to a plurality of sensors on the vehicle and/or remotely located sensors, and may generate a first internal map comprising a three-dimensional representation of an environment around the vehicle, information on a current state of the vehicle, and information about the environment. The controller system may identify one or more parameters of the first internal map to modify, and then generate at least a second internal map from the first internal map by modifying the identified one or more parameters to simulate a possible future scenario. The controller system may then determine one or more actions for the vehicle to perform in order to achieve a particular goal. The one or more actions can be determined based on analysis of the first internal map and analysis of the second internal map, where the analysis of the second internal map eliminates at least one action from consideration.

In certain embodiments, an action may be determined by obtaining a decision tree comprising nodes that represent conditions to be evaluated for determining the one or more actions, and evaluating the conditions against the second internal map. Prior to determining the one or more actions, the decision tree may be pruned, based on the goal to be achieved, to prevent one or more conditions from being evaluated.

In certain embodiments, multiple internal maps are generated to simulate different possible scenarios. The multiple internal maps can be generated based on different combinations of parameters or different parameter values. A parameter can, in certain embodiments, correspond to an attribute of an object, such as the object's speed, direction, or distance.

In certain embodiments, a second internal map is generated by zooming into a particular region within a three-dimensional representation of a first internal map. The region can be identified based on a particular goal to be achieved. For instance, if the goal is a maneuver in a particular direction, the second internal map can be generated by zooming into a region in that particular direction. This enables the second internal map to be represented more concisely and focuses the determination of an appropriate action on an area which is relevant to the goal.

The foregoing, together with other features and embodiments will become more apparent upon referring to the following specification, claims, and accompanying drawings.

BRIEF DESCRIPTION OF THE DRAWINGS

The present application can be best understood by reference to the following description taken in conjunction with the accompanying figures, in which like parts may be referred to by like numerals.

DETAILED DESCRIPTION

Figure 1A:
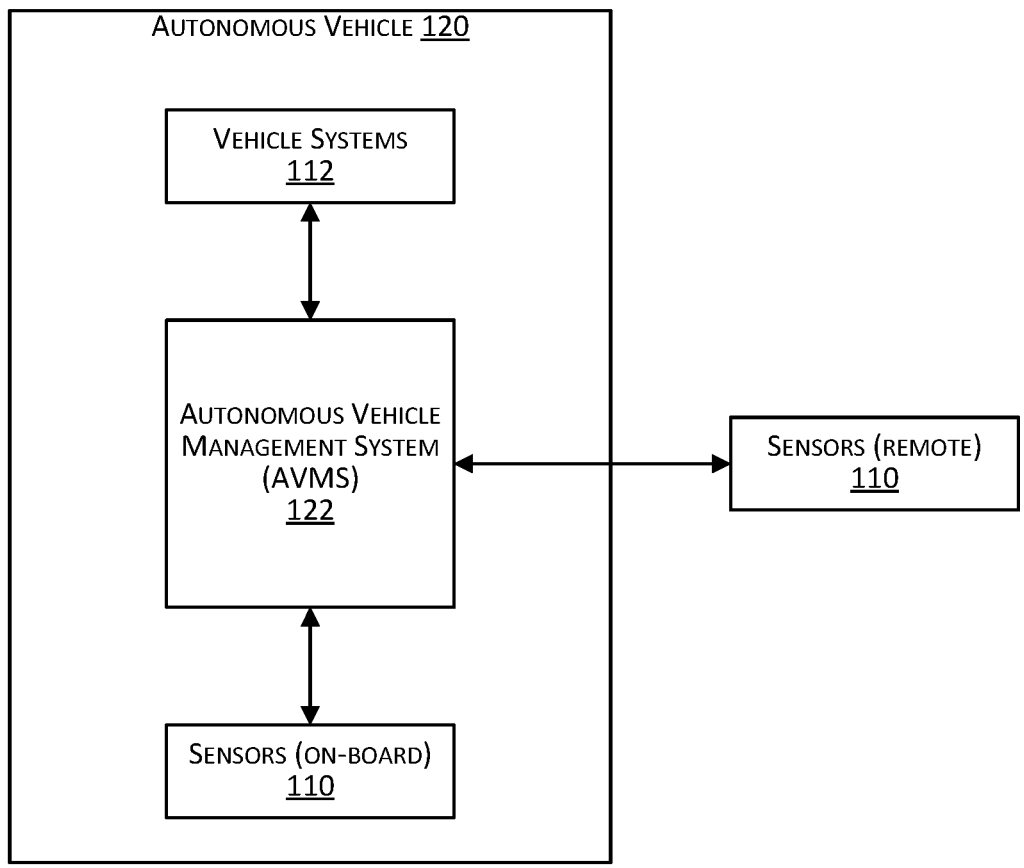
FIG. 1A is a high level simplified block diagram of an autonomous vehicle incorporating a controller system (referred to herein as autonomous vehicle management system (AVMS)) according to certain embodiments.

In the following description, for the purposes of explanation, specific details are set forth in order to provide a thorough understanding of certain inventive embodiments. However, it will be apparent that various embodiments may be practiced without these specific details. The figures and description are not intended to be restrictive. The word "exemplary" is used herein to mean "serving as an example, instance, or illustration." Any embodiment or design described herein as "exemplary" is not necessarily to be construed as preferred or advantageous over other embodiments or designs.

References throughout this specification to "one embodiment," "an embodiment," or similar language mean that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment.

The present disclosure relates to the field of autonomous vehicles, and more specifically to techniques, including artificial intelligence and machine learning-based techniques, used by an autonomous vehicle management system of an autonomous vehicle for controlling operations of the autonomous vehicle in a safe manner.

An infrastructure is provided that improves the safety of autonomous systems such as autonomous vehicles, autonomous machines, and the like. An autonomous vehicle management system (also referred to as a controller system) is described that is configured to automatically control one or more autonomous functions or operations performed by the vehicle or machine such that the autonomous operations are performed in a safe manner. Examples of autonomous operations include, without limitation, autonomous driving or navigation along a path, scooping and dumping operations, moving materials or objects (e.g., moving dirt or sand from one area to another), lifting materials, driving, rolling, spreading dirt, excavating, transporting materials or objects from one point to another point, and the like.

In certain embodiments, the autonomous vehicle management system is configured to receive sensor data from one or more sensors associated with an autonomous vehicle. Based upon this sensor data, the autonomous vehicle management system is configured to generate and keep updated an internal map for the autonomous vehicle, where the internal map includes information representative of the autonomous vehicle's state of the autonomous vehicle's environment (e.g., objects detected in the vehicle's environment). Based upon the internal map and based upon other inputs, such as the goal (e.g., change lanes, turn left/right, perform a specialized operation such as digging, scooping, etc.) to be performed by the autonomous vehicle, safety considerations, and the like, the autonomous vehicle management system is configured to generate a plan of action for the autonomous vehicle such that the goal is achieved in a safe manner. The plan of action may identify a sequence of one or more planned actions to be performed by the autonomous vehicle in order for the autonomous vehicle to achieve the goal in a safe manner. The autonomous vehicle management system may then control one or more vehicle systems (e.g., braking system, steering system, propulsion system for driving the autonomous vehicle, electrical systems, auxiliary systems (e.g., systems for outputting information to a driver or passenger of the autonomous vehicle) to perform the actions in the plan of action.

The autonomous vehicle management system may use various artificial intelligence (AI) based techniques (e.g., neural networks, reinforcement learning (RL) techniques, etc.) and models as part of its processing. For example, the autonomous vehicle management system may use a Convolutional Neural Network (CNN) to identify objects in the autonomous vehicle's environment from sensor data (e.g., images captured by cameras mounted on the autonomous vehicle) captured by one or more sensors of the autonomous vehicle. As another example, the autonomous vehicle management system may use RL-based techniques to identify the set of actions to be included in the plan of action to be performed by the autonomous vehicle to achieve a particular goal in a safe manner.

The autonomous vehicle management system described in this disclosure uses various different techniques to improve the overall safety of performing the autonomous operations. For example, the autonomous vehicle management system is capable of dynamically controlling the behavior of sensors associated with a vehicle that provide the sensor data that is used by the autonomous vehicle management system for its processing. For a sensor, the autonomous vehicle management system can dynamically change and control what sensor data is captured by the sensor and/or communicated from the sensor to the autonomous vehicle management system (e.g., granularity/resolution of the data, field of view of the data, partial/detailed data, how much data is communicated, control zoom associated with the data, and the like), when the data is captured by the sensor and/or communicated by the sensor to the autonomous vehicle management system (e.g., on-demand, according to a schedule), and how the data is captured by the sensor and/or communicated from the sensor to the autonomous vehicle management system (e.g., communication format, communication protocol, rate of data communication to the autonomous vehicle management system). Further, since the internal map is built by the autonomous vehicle management system based upon sensor data received from the sensors, by being able to dynamically control the behavior of the sensors, the information included in and/or used to build and maintain the internal map can also be dynamically controlled by the autonomous vehicle management system.

As another example, as part of its decision-making processing, the autonomous vehicle management system can evaluate and simulate various "what-if" scenarios. These what-if scenarios project various behavioral predictions onto the internal map and can be used to determine a safe sequence of actions to be performed by the autonomous vehicle in order to accomplish a particular goal. For example, if the autonomous vehicle is to make a right turn, the autonomous vehicle management system may run various what-if scenarios to determine an action or a sequence of actions to be performed to achieve this turn in the safest manner. Each what-if scenario may simulate a different behavioral pattern (e.g., simulating different speeds of surrounding vehicles, simulating different paths taken by the surrounding vehicles, occurrences of pedestrians around the autonomous vehicle, and the like). Based upon these what-if simulations, the autonomous vehicle management system can then decide the safest action or sequence of actions to be taken by the autonomous vehicle to make the turn in a safe manner.

As yet another safety improvement example, the autonomous vehicle management system may use various techniques to improve the overall safety of using AI models as part of its decision making process. Building and using an AI model, such as an AI model based upon supervised learning, generally involves a training phase in which the AI model is built and trained using a training dataset, and an inference phase during which the trained AI model is used to make inferences or predictions based upon real time data (also referred to as inferring data or dataset). AI models however at times make unpredictable errors in their predictions made during the inference phase. One factor for this is because the inferring dataset for which the AI model is making a prediction at the time of inference is different from the training dataset (e.g., the data used to train and/or validate the AI model during the training phase) resulting in suboptimal performance of the model at the time of the inference. The autonomous vehicle management system performs processing to account for such a problem. The autonomous vehicle management system checks how statistically similar (or dissimilar) an inferring data point is to the distribution of the training dataset. For an inferring data point, for which a prediction is made by the autonomous vehicle management system using an AI model, the autonomous vehicle management system checks how statistically similar (or dissimilar) the inferring data point is to the distribution of the training dataset. The autonomous vehicle management system generates a score (referred to as a model confidence score) that is indicative of how similar or dissimilar the inferring data point is to the training dataset. For example, a score indicative of a high degree of similarity may be generated where the inferring data point is similar to the training data set, and alternatively, a score indicative of a low degree of similarity may be generated where the inferring data point is different from or dissimilar to the training data set. The confidence score acts as a sanity check that provides a measure of how much the prediction made by the AI model for an inferring data point is to be trusted. The autonomous vehicle management system uses this confidence score to make a decision as to how the prediction made by the AI model is to be used. For example, in instances where the score for certain inferring data point is low, which indicates a high measure of dissimilarity, the prediction made by the AI model based upon that inferring data point may be overridden or not used by the autonomous vehicle management system. This improves the safety of the autonomous operation performed by autonomous vehicle and is not performed by conventional AI systems.

As another example, the autonomous vehicle management system can provide information regarding one or more future actions the autonomous vehicle is planning to perform. For a planned action that is to be executed by the autonomous vehicle, the autonomous vehicle management system can also provide information indicative of one or more reasons for the planned action. This information may then be output to a user or passenger of the autonomous vehicle (e.g., the driver or a passenger). This information makes the user of the autonomous vehicle aware of the actions to be taken and the reasons for the actions. This assures the user that the vehicle is behaving as intended and not behaving erratically or in an out-of-control manner. The user can also anticipate the action or actions to be taken by the vehicle. This goes a long way in making the user of the autonomous vehicle feel safe while being autonomously driven in the autonomous vehicle or while some other operation is being autonomously performed by the autonomous vehicle. This also increases the user's trust in the safety of the autonomous vehicle. It also allows the user to take manual actions (e.g., emergency actions), where appropriate, to override the planned actions. The information may also be output to a person or object or system in the autonomous vehicle's environment (e.g., to a remote user monitoring the operations of the autonomous vehicle).

As yet another example, the autonomous vehicle management system provides an infrastructure for using reinforcement learning (RL) AI models in a safe manner. The functioning of an RL model (e.g., an RL agent) is governed by a rewards function. Given a goal, an RL agent selects an action to be performed to fulfill the goal in a manner that maximizes the cumulative rewards in reaching the goal. For example, the goal for an autonomous vehicle may be to drive to a particular location (e.g., home) as fast as possible. Given this goal, to maximize its reward, an RL agent might literally select actions that cause the autonomous vehicle to drive as fast as possible, which could include breaking red lights, taking unsafe turns at a high speed, possibly overrunning pedestrians, etc. Accordingly, maximizing rewards, which all RL model agents use for selecting actions, does not guarantee safe action for the vehicle. The autonomous vehicle management system provides an infrastructure to address this problem. The infrastructure implements a safety indicator (e.g., an Safety Sanity Index (SSI)) that provides an indication of the safety performance of an RL model. The SSI value provides an indication of a degree of safety given an observed state of the vehicle and one or more safety considerations for the vehicle. Further, the infrastructure provides interruptible commands that can be used to override an action selected by an RL agent when the safety indicator (or a sequence of safety indicator values) indicates an unsafe condition. The SSI values coupled with the interruptible commands provide an infrastructure that maintains vehicle safety even when an RL agent is used to select actions based upon maximizing rewards.

FIG. 1A is a high level simplified block diagram of an autonomous vehicle 120 incorporating a controller system (referred to herein as autonomous vehicle management system (AVMS) 122) according to certain embodiments. For purposes of this disclosure, an autonomous vehicle, such as autonomous vehicle 120, is a vehicle that is capable of performing one or more operations autonomously and substantially free of any human user or manual input. For example, in certain embodiments, the autonomous operation may be the ability of the vehicle 120 to autonomously sense its environment and navigate or drive along a path autonomously and substantially free of any human user or manual input. Examples of other autonomous operations include, without limitation, scooping and dumping operations, moving materials or objects (e.g., moving dirt or sand from one area to another), lifting materials, driving, rolling, spreading dirt, excavating, transporting materials or objects from one point to another point, and the like.

Autonomous vehicle 120 can be of various different types. For example, autonomous vehicle 120 can be a car or mobile machine that can be used to transport people and/or cargo. Autonomous vehicle 120 can be a specialized vehicle for performing specialized operations such as digging, lifting, etc. Examples of autonomous vehicle 120 include without restriction wagons, bicycles, motor vehicles (e.g., motorcycles, cars, trucks, buses), railed vehicles (e.g., trains, trams), watercrafts (e.g., ships, boats), aircrafts, spacecraft, and/or heavy equipment vehicles (e.g. dump trucks, tractors, etc.). Since the environment of autonomous vehicle 120 can include other vehicles, including other autonomous vehicles, for purposes of clarity, in order to differentiate autonomous vehicle 120 from other vehicle's in its environment, autonomous vehicle 120 is also sometimes referred to as the ego vehicle.

Various features have been described below using an autonomous vehicle as an example. However, this is not intended to be limiting. The teachings described herein can be applied to any machine that is capable of performing one or more autonomous operations. For example, the teachings can be used by a loader, a compactor, and the like. The machines may be used in various industries such manufacturing, construction, medical applications, packaging, assembly, surveying, mapping technologies logistics, etc.

As depicted in FIG. 1A, in addition to autonomous vehicle management system 122, autonomous vehicle 120 may include or be coupled to sensors 110, and vehicle systems 112. Autonomous vehicle management system 122 may be communicatively coupled with sensors 110 and vehicle systems 112 via wired or wireless links. One or more different communication protocols may be used for facilitating communications between autonomous vehicle management system 122 and sensors 110 and between autonomous vehicle management system 122 and vehicle systems 112.

Vehicle systems 112 can include various electro-mechanical systems, components, linkages, etc. that enable autonomous vehicle 120 to perform its intended functions such as traveling or navigating along a particular path or course. Vehicle systems 112 may include for example, a braking system, a steering system, a propulsion system for driving the autonomous vehicle, electrical systems, auxiliary systems (e.g., systems for outputting information to a driver or passenger of autonomous vehicle 120), and the like. Vehicle systems 112 can be used to set the path and speed of autonomous vehicle 120. In an autonomous vehicle that is configured to perform a specialized operation (e.g., a dump truck that is specialized to perform lift and dump operations, a tractor, etc.), the vehicle systems 112 may also include systems that are configured to perform such specialized operations.

Figure 4:
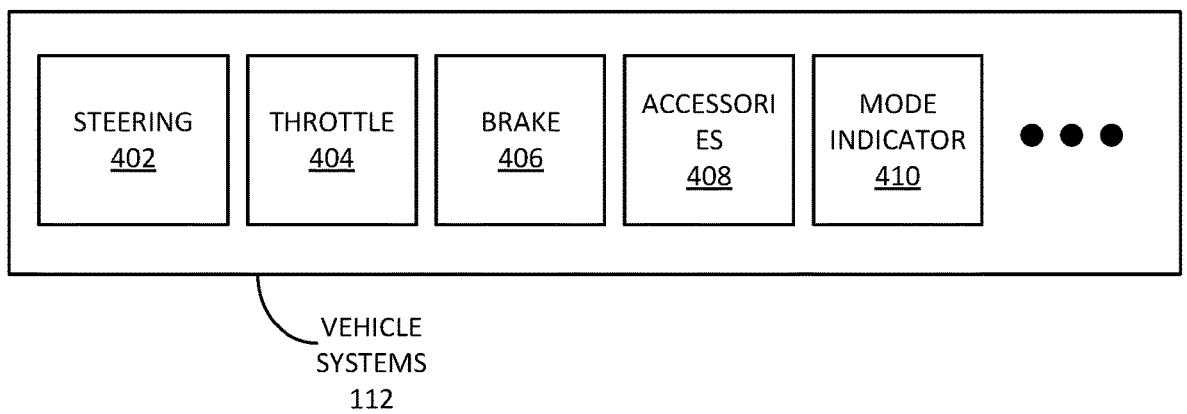
FIG. 4 illustrates an example set of vehicle systems in an autonomous vehicle according to some embodiments.

FIG. 4 illustrates an example set of vehicle systems 112, according to some embodiments. Examples of systems included in vehicle system 112 can include, without limitation, a steering system 402, a throttle system 404, brake system 406, accessories 408, mode indicator system 410, and the like.

Figure 3:
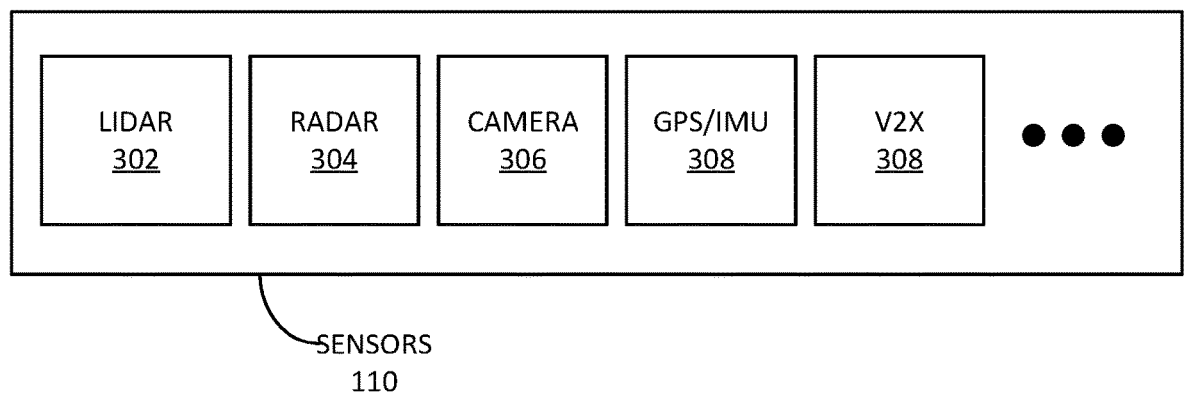
FIG. 3 illustrates an example set of sensors of an autonomous vehicle according to some embodiments.

Sensors 110 may be located on or in autonomous vehicle 120 ("onboard sensors") or may even be located remotely ("remote sensors") from autonomous vehicle 120. Autonomous vehicle management system 122 may be communicatively coupled with remote sensors via wireless links using a wireless communication protocol. Sensors 110 can obtain environmental information for autonomous vehicle 120. This sensor data can then be fed to autonomous vehicle management system 122. FIG. 3 illustrates an example set of sensors 110 of an autonomous vehicle, including, without limitation, LIDAR (Light Detection and Ranging) sensors 302, radar 304, cameras 306 (different kinds of cameras with different sensing capabilities may be used), Global Positioning System (GPS) and Inertial Measurement Unit (IMU) sensors 308, Vehicle-to-everything (V2X) sensors 308, audio sensors, and the like. Sensors 110 can obtain (e.g., sense, capture) environmental information for autonomous vehicle 120 and communicate the sensed or captured sensor data to autonomous vehicle management system 122 for processing. Other sensors may include proximity sensors, SONAR sensors, and other sensors.

Examples of radar sensors 304 may include sensors that are used to detect objects in the environment of autonomous vehicle 120 and to determine the velocities of the detected objects. Examples of LIDAR sensors 302 include sensors that use surveying techniques that measure distances to a target by using light in the form of a pulsed laser light. This is done by illuminating the target to be measured with pulsed laser light and measuring the reflected pulses using the sensor. Examples of V2X sensors include sensors that use V2X communication technology to communicate with moving parts of a traffic system. For example, autonomous vehicle 120 may use a V2X sensor for passing and/or receiving information from a vehicle to another entity around or near the autonomous vehicle. A V2X communication sensor/system may incorporate other more specific types of communication infrastructures such as V2I (Vehicle-to-Infrastructure), V2V (Vehicle-to-vehicle), V2P (Vehicle-to-Pedestrian), V2D (Vehicle-to-device), V2G (Vehicle-to-grid), and the like. An IMU sensor may be an electronic device that measures and reports a body's specific force, angular rate, and sometimes the magnetic field surrounding the body, using a combination of accelerometers, gyroscopes, magnetometers, etc. GPS sensors use a space-based satellite navigation system to determine geolocation and time information.

Autonomous vehicle management system 122 (also referred to as a controller system) is configured to process data describing the state of autonomous vehicle 120 and the state of the autonomous vehicle's environment, and based upon the processing, control one or more autonomous functions or operations of autonomous vehicle 120. For example, autonomous vehicle management system 122 may issue instructions/commands to vehicle systems 112 to programmatically and autonomously control various aspects of the autonomous vehicle's motion such as the propulsion, braking, steering or navigation, and auxiliary behavior (e.g., turning lights on) functionality of autonomous vehicle 120. Autonomous vehicle management system 122 implements the control and planning algorithms that enable autonomous vehicle 120 to perform one or more operations autonomously Autonomous vehicle management system 122 may be implemented using software only, hardware only, or combinations thereof. The software may be stored on a non-transitory computer readable medium (e.g., on a memory device) and may be executed by one or more processors (e.g., by computer systems) to perform its functions. In the embodiment depicted in FIG. 1, autonomous vehicle management system 122 is shown as being in or on autonomous vehicle 120. This is however not intended to be limiting. In alternative embodiments, autonomous vehicle management system 122 can also be remote from autonomous vehicle 120.

Autonomous vehicle management system 122 receives sensors data from sensors 110 on a periodic or on-demand basis. Autonomous vehicle management system 122 uses the sensor data received from sensors 110 to perceive the autonomous vehicle's surroundings and environment. Autonomous vehicle management system 122 uses the sensor data received from sensors 110 to generate and keep updated a digital model that encapsulates information about the state of autonomous vehicle and of the space and environment surrounding autonomous vehicle 120. This digital model may be referred to as the internal map, which encapsulates the current state of autonomous vehicle 120 and its environment. The internal map along with other information is then used by autonomous vehicle management system 122 to make decisions regarding actions (e.g., navigation, braking, acceleration) to be performed by autonomous vehicle 120. Autonomous vehicle management system 122 may send instructions or commands to vehicle systems 112 to cause the actions be performed by the systems of vehicles systems 112.

Figure 1B:
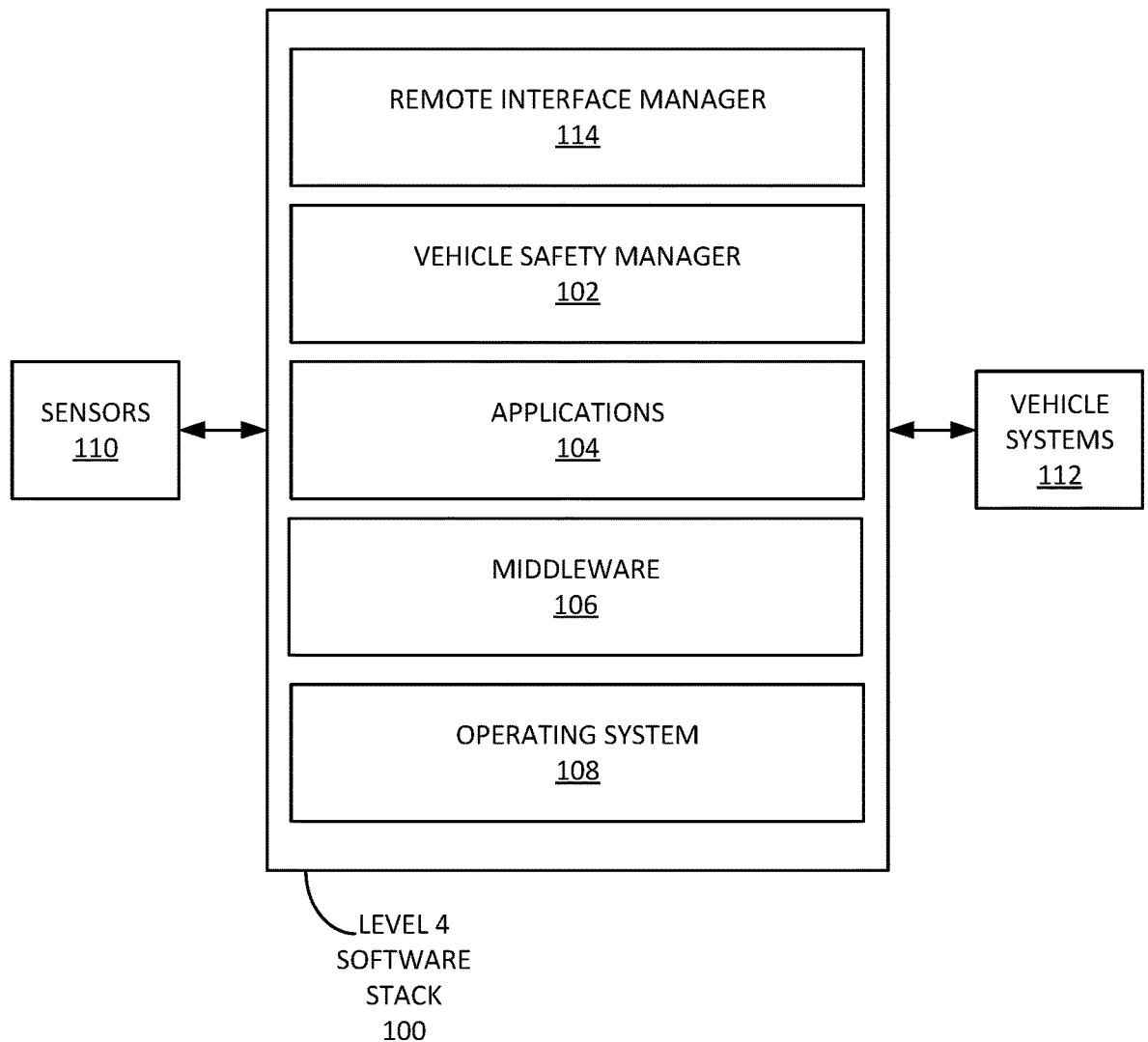
FIG. 1B depicts an example autonomous vehicle management system wherein the autonomous vehicle management system is implemented primarily in software, according to some embodiments.

As indicated above, autonomous vehicle management system 122 may be implemented using software only, hardware only, or combinations thereof. FIG. 1B depicts an example autonomous vehicle management system wherein autonomous vehicle management system 122 is implemented primarily in software, according to some embodiments. Autonomous vehicle management system 122 may be implemented as a fully autonomous vehicle software stack 100. Fully autonomous vehicle software stack 100 can include a vehicle safety manager 102, a remote interface manager 114, applications 104, middleware 106, and operating system 108. Fully autonomous vehicle software stack 100 may be used to implement the functionalities of the various systems and subsystems described above.

Figure 2A:
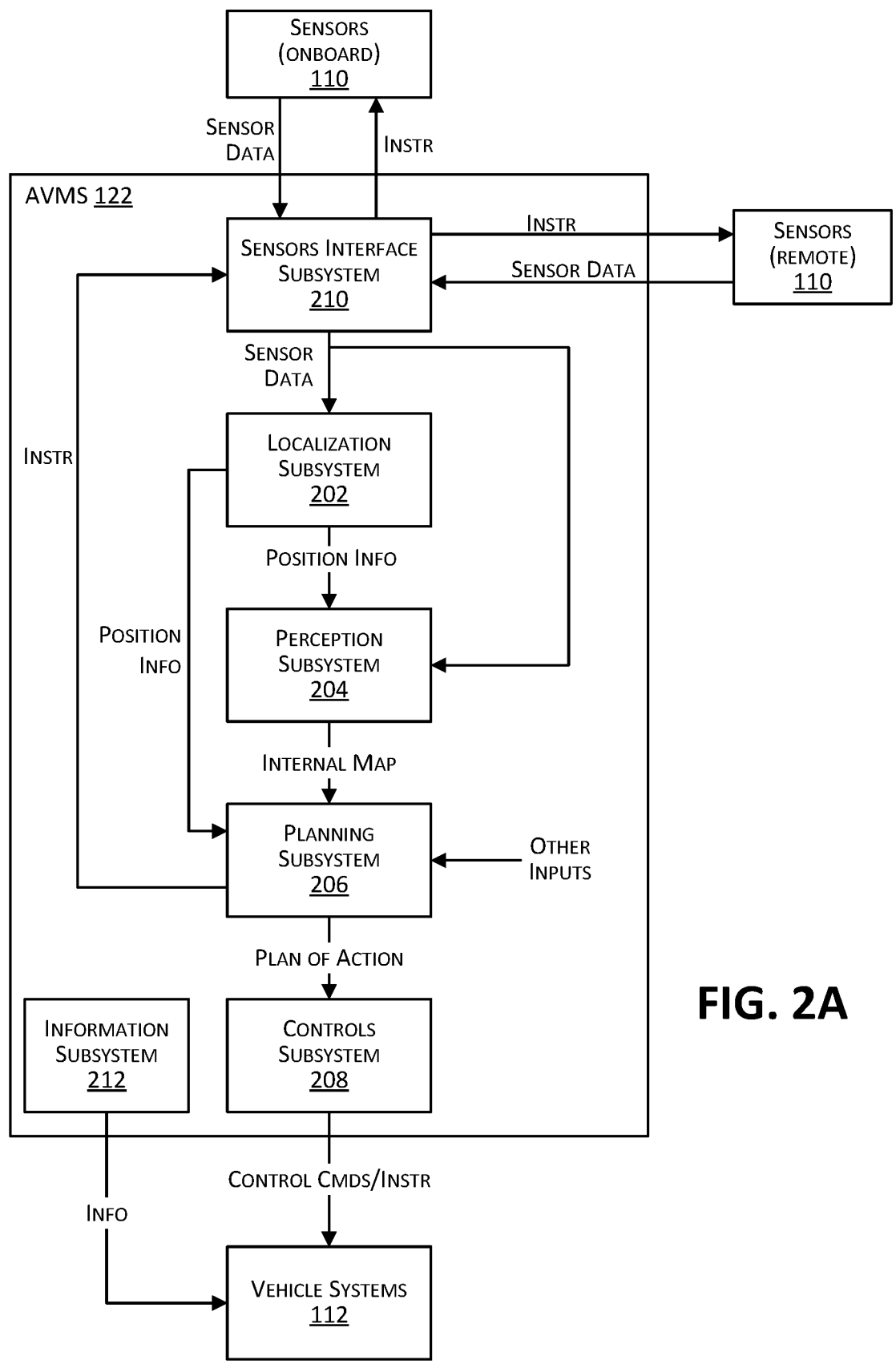
FIG. 2A is a simplified block diagram depicting subsystems of an autonomous vehicle management system according to certain embodiments.

FIG. 2A is a simplified block diagram depicting subsystems of autonomous vehicle management system 122 according to certain embodiments. Autonomous vehicle management system 122 may comprise multiple systems or subsystems communicatively coupled to each other via one or more communication channels. In the embodiment depicted in FIG. 2A, the subsystems include a sensors interface subsystem 210, a localization subsystem 202, a perception subsystem 204, a planning subsystem 206, a controls subsystem 208, and an information subsystem 212.

Autonomous vehicle management system 122 embodiment depicted in FIG. 2A is merely an example and is not intended to unduly limit the scope of claimed embodiments. One of ordinary skill in the art would recognize many possible variations, alternatives, and modifications. For example, in some implementations, autonomous vehicle management system 122 may have more or fewer subsystems or components than those shown in FIG. 2A, may combine two or more subsystems, or may have a different configuration or arrangement of subsystems. The subsystems may be implemented using software only, hardware only, or combinations thereof. In the embodiment depicted in FIG. 2A, autonomous vehicle management system 122 and all its subsystems are shown as being in or on autonomous vehicle 120. This is however not intended to be limiting. In alternative embodiments, all the subsystems of autonomous vehicle management system 122 or certain subsystems of autonomous vehicle management system 122 can also be remote from autonomous vehicle 120.

Sensors interface subsystem 210 provides an interface that enables communications between sensors 110 (including on-board sensors and remote sensors) and autonomous vehicle management system 122. Sensors interface subsystem 210 may receive sensor data from sensors 110 and provide the data to one or more other subsystems of autonomous vehicle management system 122. For example, as depicted in FIG. 2A, sensor data may be provided to localization subsystem 202 and perception subsystem 204 for further processing. The sensor data collected by the various sensors 110 enables autonomous vehicle management system 122 to construct a view or picture of autonomous vehicle 120 and its surrounding environment.

In certain embodiments, autonomous vehicle management system 122 enables one or more subsystems of autonomous vehicle management system 122 to send instructions or commands to one or more sensors 110 to control the operations of the one or more sensors. For example, instructions may be sent to a particular sensor to change the behavior of the particular sensor. For example, instructions may be sent to a sensor to change the information sensed or collected by the sensor and/or to change the sensor data communicated from the sensor to autonomous vehicle management system 122. Using these instructions, autonomous vehicle management system 122 can dynamically control the sensor data that is communicated from sensors 110 to autonomous vehicle management system 122. Further details on this are provided below in the context of functions performed by planning subsystem 206.

Localization subsystem 202 is configured to receive sensor data from sensors 110, and based upon the sensor data, identify the location of autonomous vehicle 120 in it surrounding environment (vehicle localization). Localization subsystem 202 provides current, local position information of the EV with respect to its environment (example: mine). The position of the ego autonomous vehicle 120 may be determined with respect to a pre-defined map that is generated by perception subsystem 204. In certain embodiments, localization subsystem 202 is configured to broadcast the ego vehicle's position information to other systems or subsystems of autonomous vehicle 120. The other systems or subsystems may then use the position information as needed for their own processing.

Localization subsystem 202 may implement various functions such as internal map management, map matching, visual odometry, dead reckoning, location history management, and the like. For example, assume that autonomous vehicle 120 is driving in a mine. Localization subsystem 202 may receive as input a map of the mine. A mine usually has a set path comprising drivable and non-drivable areas and a set road for mining vehicles to follow around a mine. Localization subsystem 202 may determine the position of the ego vehicle along the path. Localization subsystem 202 may do so by utilizing multiple inputs it receives from sensors and maps of the environment. Localization subsystem 202 may use GPS sensor data to determine the global positioning of the ego vehicle. Localization subsystem 202 may receive the GPS sensor data and translate it to a more useful form that is usable by one or more other subsystems of autonomous vehicle management system 122. For example, information, localization subsystem 202 may identify where the ego vehicle is positioned with respect to a map of the environment, such as a mine map (also referred to as map management).

Localization subsystem 202 may also be configured to perform map matching, where what localization subsystem 202 perceives is matched with the information that it has. Map matching can match recorded geographic coordinates to a logical model of the real world, (e.g., using a Geographic Information System (GPS), etc.). In one example, a map matching algorithm can obtain a recorded, serial location points (e.g. from GPS) and relate them to edges in an existing street graph (e.g., as a network). This can be in a sorted list representing the travel of an autonomous vehicle. As part of map matching, localization subsystem 202 is tracking the ego vehicle in its environment and deducing its position based on what localization subsystem 202 sees relative to a map, such as a real world map.

Localization subsystem 202 is also configured to perform visual odometry, which involves determining the orientation and position of the ego vehicle based upon sensor data, such as by analyzing images captured by one or more cameras.

Localization subsystem 202 may also perform dead reckoning processing. Dead reckoning is the process of calculating one's current position by using a previously determined position, or fix, and advancing that position based upon known or estimated speeds over elapsed time and course. This may involve calculating the ego vehicle's position by estimating the direction and distance travelled. For example, autonomous vehicle management system 122 receives and knows certain information about autonomous vehicle 120 such as it wheel speed, steering angle, where autonomous vehicle 120 was a second ago, and the like. Based on the past position information and in combination with speed/steering angle etc., localization subsystem 202 can determine the vehicle's next location or current location. This provides local understanding of the ego vehicle's position as it moves on its path. A path can be a road, highway, rail system, runway, boat route, bike path, etc., according to various embodiments.

Localization subsystem 202 may also perform local history management tracking, where historical information about the ego vehicle's path is analyzed and compared to the current path. For example, if autonomous vehicle 120 drives around a certain path in a mine many number of times, this information can be compared and analyzed by localization subsystem 202.

Localization module 202 may also implement a consistency module that is configured to perform rationality checks, deficiency checks, normalize sensor data, etc. For example, localization subsystem 202 may receive information from different sources of information regarding the ego vehicle's position, location, etc. Rationality check may be used to do a validity check to make sure information from various sensors is consistent and robust. This helps reduce erroneous results. Rationality check can include tests to evaluate whether a sensor data value and/or the result of a calculation can possibly be true. The sensor data received from sensors 110 can also be normalized and the normalized sensor data then provided to localization subsystem 202. Localization subsystem 202 can then utilize the normalized sensor data to generate and/or update the consistent internal map of the real-time (e.g. assuming networking and processing latencies, et.) environment of the autonomous vehicle.

Perception subsystem 204, periodically or on-demand, receives sensor data from sensors 110 and builds and maintains a consistent internal map based upon the received information. Perception subsystem 204 may also receive inputs from other sources, such as from localization subsystem 202, and use the received inputs to build and maintain the internal map. The internal map generated by perception subsystem 204 contains all the information including the ego vehicle's information, state of the ego vehicle and its environment, information about objects in the ego vehicle's environment (e.g., information regarding dynamic and static objects around ego vehicle). Consistent internal map can be a localized map of sensed entities/objects in the autonomous vehicle's environment, for example, around the autonomous vehicle. In certain embodiments, these sensed entities/objects are mapped in three dimensions (3D). In certain embodiments, perception subsystem 204 receives position information from localization subsystem 202 and incorporates the position information in the internal map. The internal map can be maintained even in the event that a sensor falls offline.

Rationality checks and normalization may be performed on the sensor data received by perception subsystem 204. These checks can include tests to evaluate whether a sensor data value and/or the result of a calculation can possibly be true. The sensor data received from sensors 110 can also be normalized and the normalized sensor data then provided to perception subsystem 204. Perception subsystem 204 can then utilize the normalized sensor data to generate and/or update the consistent internal map of the real-time environment of the autonomous vehicle.

Traditionally, internal maps for autonomous vehicles have been represented and stored as arrays. However, such array-based representations are not efficient, are difficult to maintain and store, and are not optimal for representing the detailed information that is required for improving the safety of autonomous vehicles. In certain embodiments, the internal map generated by perception subsystem 204 is built and stored using a complex data structure. The internal map is made up of objects representing entities in the ego vehicle's environment, and for each object, may further include attributes related to the object. The internal map also stores a representation of the 3D environment of the ego vehicle. The internal map can be persisted in non-volatile memory. The data structure is used for storing the internal map is light and holds information in a compact manner such that the internal map can be easily loaded into system memory for runtime operations. The structure of the internal map facilitates efficient and quick querying of the map.

In certain embodiments, the internal map comprises multiple layers, each layer storing information of a particular granularity or resolution. This multilayered approach allows for efficient and quick querying of the internal map, which in turn improves the speed of processing for operations using the internal map. Organizing the internal map in a multi-layered fashion enables fast querying of the internal map, as the information needed for generating a plan of action or for some other process performed by the autonomous vehicle management system 122 might be available in a layer containing less granular or lower resolution information. Thus, processing can, in at least some instances, be performed without having to read the internal map in its entirety. The layered approach also facilitates efficient storing and copying of the internal map. The multilayered internal map can store information for multiple objects including information about attributes and characteristics of the objects. Attributes can include, for example, the shape of an object, a volumetric estimation of the object (e.g., an estimate of the object's actual size), the speed of the object, an indication of whether an object is stationary or moving, an indication of whether a moving object is approaching or moving away from the vehicle, the object's coordinates in the volumetric space, etc. In certain embodiments, the internal map may also store attributes of the vehicle itself, such as the vehicle's position, speed, heading, and/or other state information.

In certain embodiments, the internal map for the ego vehicle is a vector comprising multiple attributes, where the vector represents the ego vehicle's state and its environment. The vector may encapsulate information about the ego vehicle's environment such as information identifying objects (e.g., person, other vehicles, trees, signs, etc.) present in the environment of autonomous vehicle 120. For each object, depending upon the nature or type of the object, the internal map vector may also include information specific to that object. For example, for a surrounding vehicle sensed close to the ego vehicle, the internal map may include information such as the surrounding vehicle's position relative to the ego vehicle, distance of the surrounding vehicle from the ego vehicle, the surrounding vehicle's velocity, the surrounding vehicle's dimensions, and the like.

As indicated above, the internal map for autonomous vehicle 120 (or the ego vehicle), stores information about the environment around the ego vehicle. In certain embodiments, the environment corresponds to an ego volumetric space (e.g., an ellipsoid) surrounding the ego vehicle. The shape of this volumetric space and also the granularity/resolution of the space may change depending upon the situation. The data structures used by autonomous vehicle management system 122 to represent the internal map allow for storing and presenting information at multiple resolutions. For example, for an autonomous vehicle such as a mining truck, the volumetric space around the vehicle may be defined as follows: 30 m from its sides, 50 m in front of the vehicle, and 20 m behind the vehicle. This view of the volumetric space representing the vehicle's environment is represented and stored in the internal map and is periodically updated (e.g., every second, or some other time unit) as the environment around the vehicle changes.

In certain embodiments, the internal map is implemented using a graph data structure. The data structure has a 3D layered architecture where each node of the graph holds attribute information and the links between the nodes hold connection information. Using such as graph data structure enables memory to be used efficiently to store information that is needed and also enables re-use of memory to other/additional information, as needed. The graph data structure architecture also enables meta-data to be efficiently stored and can synthesize a lot of information into a smaller memory space. Additionally, the graph may be multi layered in accordance with the multilayered approach described above. For instance, the graph data structure can include multiple layers that store information for the same features, each layer comprising a set of connected nodes, and with each successive layer increasing in granularity or resolution with respect to the information stored for those features.

The internal map can serve various purposes. It can provide an API to planning subsystem 206 that enables the internal map to be queried and used by planning subsystem 206. The internal map may be used to provide the current state information regarding autonomous vehicle 120 via a user interface, etc.

Internal map information may also be provided to other systems, subsystems, or applications for processing and analysis. For example, autonomous vehicle management system 122 may include a Remote Interface module (RIM) or subsystem that enables the map information to be sent to one or more cloud-based applications. For example, snippets of information from internal map at periodic time intervals (e.g., every 500 ms) that captures the environment of autonomous vehicle 120 may be provided to a cloud application using Remote Interface Module (RIM) for analysis. The internal map information can be stored, aggregated, and/or analyzed in a cloud-computing based application for answering a specific query about the environment where the autonomous vehicle has traveled and captured the information. For example, in a mining truck application, the metadata can be used to answer questions such as how the mine surface and topology has changed over a specified period (e.g. last 24 hours, last week, etc.), the path driven by the mining truck, the operations performed by the mining truck, and the like.

As part of building the internal map, perception subsystem 204 is configured to implement functions such as object detection, object classification, and object tracking based upon the sensor data received from one or more sensors 210. Object detection can include, for example, applying computer vision and/or image processing techniques to the sensor data to detect instances of semantic objects of a certain class (e.g., humans, buildings, other vehicles, etc.) in digital images and videos and other sensor data received from sensors 110. Examples of object detection include vehicle detection, pedestrian detection, and the like. Object tracking can include, for example, processing the sensor data to locate a moving object (or multiple objects) over time. For example, sensor data from sensors such as radar, camera, LIDAR, etc. may be processed to track objects. In some examples, object recognition techniques may be applied for object tracking. Perception subsystem 204 is also configured to perform local world management of the internal map, map information management, and other like functions.

Perception subsystem 204 may use various different algorithms and techniques to perform its functions, including AI and machine learning based techniques. For example, perception subsystem 204 may use a convolutional neural network (CNN) to perform object detection and object classification based upon the sensor data. During a training phase, the CNN may be trained using labeled training data comprising sample images of a vehicle's environment and corresponding ground truth classifications. Labeled data generally includes a group of samples that have been tagged with one or more labels, where the labels represent known results (e.g., ground truth classification, etc.) for the training input samples. Labeling can also be used to take a set of unlabeled data and augments each piece of that unlabeled data with meaningful tags that are informative. A CNN model built based upon the training may then be used in real time to identify and classify objects in the environment of autonomous vehicle 120 based upon new sensor data received from sensors 110.

Planning subsystem 206 is configured to make generate a plan of action for autonomous vehicle 120. The plan may comprise one or more planned actions or operations to be performed by autonomous vehicle 120. For example, the plan may comprise information identifying a trajectory or path to be traversed by autonomous vehicle 120. A path can be a road, highway, rail system, runway, boat route, bike path, etc., according to various embodiments. For example, the trajectory information may indicate how the vehicle should move from point A to point B with a list of points between point A point B marking a trajectory for the vehicle to follow from point A to point B. As another example, the plan generated by planning system 206 may include planned actions with respect to accessories of autonomous vehicle 120, such as turning indicators or lights on or off, producing one or more sounds (e.g., alarms), and the like. In situations where autonomous vehicle 120 has specialized components that are customized to perform specialized operations, the plan generated by planning subsystem 206 may also include planned actions to be performed by one or more of these specialized components. For example, if the autonomous vehicle is a digging truck with a bucket and arm assembly for performing the digging and moving materials, the plan generated by planning subsystem 206 can include actions to be performed by the bucket and arm assembly for performing the digging. For example, the plan may include an angle at which the arm should be raised and or the angle of the bucket with respect to the arm. After a plan of action has been generated, planning subsystem 206 may communicate the plan of action to controls subsystem 208, which may then control one or more systems of vehicle systems 112 to cause the planned actions in the plan of action to be performed in a safe manner by autonomous vehicle 120.

In addition to the internal map generated by perception subsystem 204, planning subsystem 206 may also receive various other inputs that it uses in generating the plan of action for autonomous vehicle 120. These inputs may include, without limitation:

(a) Position or localization information received from localization subsystem 202.

(b) Information identifying one or more goals of autonomous vehicle 120 (e.g., information may be received identifying a final goal of autonomous vehicle 120 to make a right turn). The goal may be set by an end user or operator of the autonomous vehicle or machine. For an automotive example, the user may set a high level to drive from the current location of autonomous vehicle 120 to a particular final destination. Autonomous vehicle 120 may determine a GPS route plan based upon the current and final destination locations and with a goal to autonomously drive from the current location to the final destination according to the GPS route plan. In a mining environment example, a high level goal set by an operator may be to move 10 tons of material (e.g., sand, coal, etc.) from point A and dump the material at point B. In general, one or more different goal may be provided. Examples of categories of goals (some of which may overlap) include, without limitation: goals related to performing an autonomous operation by the autonomous vehicle (e.g., autonomous driving or navigation along a path, scooping and dumping operations, moving materials or objects, lifting materials, driving, rolling, spreading dirt, excavating, transporting materials or objects from one point to another point, etc.), goals related to maneuvering the vehicle, goals related to interaction of the vehicle with various actors, objects, etc. in the vehicle's environment, goals related to the general operations of the vehicles, and the like. Examples of goals: changing lanes, driving from one location to another location, driving to a destination as fast as possible, making a turn, performing a series of steps in a sequence, and others.

(c) High level route information regarding the path or route to be taken by autonomous vehicle 120. This may be provided directly or indirectly by an end use or operator of the autonomous vehicle.

(d) Information identifying safety considerations. These may also be provided to the autonomous vehicle by an end user/operator, etc. using APIs provided by autonomous vehicle 120 or via metadata configured for autonomous vehicle 120. Examples of these considerations include, without limitation: always stay within the lane, maintain certain distance from any object at all time, a dump truck is not to make more than a 30 degree turn, a loader B is not to climb over a grade more than 15 degrees, etc.

(e) Information about how a particular operation was performed in the past. For example, for a particular autonomous vehicle, this could be the past history of how that particular autonomous vehicle performed the operation in the past, how a different autonomous vehicle performed the operation in the past, how the operation was manually performed using a vehicle in the past (e.g., how a driver/operator performed the operation in the past with the vehicle operating under the driver/operator's control). For example, the autonomous vehicle traveled a path in the past, how a manual truck would have driven this path or completed a certain task, and the like.

(f) Other inputs.

Based upon the one or more inputs, planning subsystem 206 generates a plan of action for autonomous vehicle 120. Planning subsystem 206 may update the plan on a periodic basis as the environment of autonomous vehicle 120 changes, as the goals to be performed by autonomous vehicle 120 change, or in general, responsive to changes in any of the inputs to planning subsystem 206.

As part of generating and updating the plan of action, planning subsystem 206 makes various decisions regarding which actions to include in the plan in order to achieve a particular goal in a safe manner. Processing performed by planning subsystem 206 as part of making these decisions may include behavior planning, global planning, path planning, fail-safe path, path history tracking, etc.

In certain embodiments, as part of its decision-making processing, planning subsystem 206 is configured to evaluate and simulate various "what-if" scenarios. These what-if scenarios project various behavioral predictions onto the consistent internal map and are used to determine a safe sequence of actions to be performed for the scenarios. As part of this what-if analysis, planning subsystem 206 may create multiple instances of the internal map, each instance playing out a "what-if" scenario. For example, if the autonomous vehicle 120 is to make a right turn, planning subsystem 206 may run various what-if scenarios to determine the actions to be performed to achieve this turn in the safest manner. Each what-if scenario may simulate a different behavioral pattern (e.g., simulating different speeds of surrounding vehicles, simulating different paths taken by the surrounding vehicles, occurrences of pedestrians around the ego vehicle, and the like). Based upon these what-if simulations, planning subsystem 206 can then decide the safest sequence or set of actions to be taken by autonomous vehicle 120 to achieve the final goal (e.g., to make a turn) in a safe manner. This set of one or more actions may then be included in the plan of action generated by planning subsystem 206. The plan of action generated by planning subsystem 206 may include a sequence of actions to be performed by autonomous vehicle 120 in order for a goal to be performed or achieved in the same manner.

Planning subsystem 206 may use various AI-based machine-learning algorithms to generate and update the plan of action in order to achieve the goal of performing a function or operation (e.g., autonomous driving or navigation, digging of an area) to be performed by autonomous vehicle 120 in a safe manner. For example, in certain embodiments, planning subsystem 206 may use a model trained using reinforcement learning (RL) for generating and updating the plan of action. Autonomous vehicle management system 122 may use an RL model to select actions to be performed for controlling an autonomous operation of autonomous vehicle 120. The RL model may be periodically updated to increase its coverage and accuracy. Reinforcement learning (RL) is an area of machine learning inspired by behaviorist psychology, concerned with how agents ought to take actions in an environment so as to maximize some notion of cumulative reward.

In certain embodiments, in addition to generating a plan of action, planning subsystem 206 is capable of dynamically controlling the behavior of sensors 110. For example, planning subsystem 206 can send instructions or commands to a particular sensor from sensors 110 to dynamically control the sensor data that is captured by the particular sensor and/or control the sensor data that is communicated from the sensor to perception subsystem 204 (or to other subsystems of autonomous vehicle management system 122, such as to localization subsystem 202). Since the internal map built by perception subsystem 204 is based upon the sensor data received by perception subsystem 204 from the sensors, by being able to dynamically control the sensor data received from the sensors, the information included in and/or used by perception subsystem 204 to build and maintain the internal map can also be dynamically controlled by planning subsystem 206. Planning subsystem 206 can dynamically and on-demand direct sensors 110 to obtain specific types of information or behave in specified manners, for example, to provide additional sensor data to update the consistent internal map. For example, planning subsystem 206 can command a Lidar sensor to narrow its range of sensing from a three-hundred and sixty-degree (360°) view to a narrower range that includes a specific object to be sensed and/or tracked in greater detail by the Lidar system. In this way, the consistent internal map is updated based on feedback from and under the control of planning subsystem 206.

Autonomous vehicle management system 122 provides an infrastructure that enables planning subsystem 206 (or other subsystems of autonomous vehicle management system 122) to send one or more instructions or commands to one or more sensors to control the behavior of those one or more sensors. In the embodiment depicted in FIG. 2A, sensors interface subsystem 210 provides an interface for interacting with sensors 110. In the outbound direction (from autonomous vehicle management system 122 to the sensors direction), planning subsystem 206 can send an instruction or command to sensors interface subsystem 210. Sensors interface subsystem 210 is then configured to communicate the received instruction to the intended destination sensor. In the inbound direction (from a sensor to autonomous vehicle management system 122), sensors interface subsystem 210 may receive sensor data from a sensor in response to the instruction sent from planning subsystem 206. Sensors interface subsystem 210 may then communicate the received sensor data to planning subsystem 206 (or to the appropriate subsystem of autonomous vehicle management system 122 which originated the instruction).

Sensors interface subsystem 210 may be capable of communicating with different sensors using one or more different communication protocols. In certain embodiments, in the outbound direction, for an instruction or command received from planning subsystem 206 (or from any other subsystem of autonomous vehicle management system 122) and to be sent to a particular sensor, sensors interface subsystem 210 may translate the instruction to a format that is understandable by and appropriate for communicating with that particular sensor and then use a particular communication protocol that is applicable for that particular sensor.

In certain embodiments, autonomous vehicle management system 122 may have access to information identifying sensors 110 and their capabilities. The subsystems of autonomous vehicle management system 122 may then access and use this stored information to determine the possible capabilities and behaviors of a sensor and to send instructions to that sensor to change its behavior. In certain embodiments, a sensor has to be registered with autonomous vehicle management system 122 before communications that enables between the sensor and autonomous vehicle management system 122. As part of the registration process, for a sensor being registered, information related to the sensor may be provided. This information may include information identifying the sensor, the sensor's sensing capabilities and behaviors, communication protocol(s) usable by the sensor, and other information related to the sensor. Autonomous vehicle management system 122 may then use this information to communicate with and control the behavior of the sensor.

As indicated above, planning subsystem 206 may send instructions to a sensor to control and change the sensor's behavior. Changes in a sensor's behavior can include changing the sensor data that is communicated from the sensor to autonomous vehicle management system 122 (e.g. the sensor data communicated from the sensor to perception subsystem 204, or other subsystems of autonomous vehicle management system 122), changing the data that is collected or sensed by the sensor, or combinations thereof. For example, changing the sensor data that is communicated from the sensor to autonomous vehicle management system 122 can include communicating more or less data than what was communicated from the sensor to autonomous vehicle management system 122 prior to receiving the instruction, and/or changing the type of sensor data that is communicated from the sensor to autonomous vehicle management system 122. In some instances, the data sensed or collected by the sensor may remain the same but the sensor data communicated from the sensor to autonomous vehicle management system 122 may change. In other instances, the data sensed or collected by the sensor may itself be changed in response to an instruction received from autonomous vehicle management system 122. Planning subsystem 206 may also be able to turn a sensor on or off by sending appropriate instructions to the sensor.

For example, planning subsystem 206 may receive inputs including a current internal map generated by perception subsystem 204, position information from localization subsystem 202, and a goal that autonomous vehicle 120 is to make a turn in a certain amount of time (e.g., a right turn in the next 5 seconds). As part of deciding what is the best set of actions to be taken by autonomous vehicle 120 to achieve the goal in a safe manner, planning subsystem 206 may determine that it needs particular sensor data (e.g., additional images) showing the environment on the right side of autonomous vehicle 120. Planning subsystem 206 may then determine the one or more sensors (e.g., cameras) that are capable of providing the particular sensor data (e.g., images of the environment on the right side of autonomous vehicle 120). Planning subsystem 206 may then send instructions to these one or more sensors to cause them to change their behavior such that the one or more sensors capture and communicate the particular sensor data to autonomous vehicle management system 122 (e.g., to perception subsystem 204). Perception subsystem 204 may use this specific sensor data to update the internal map. The updated internal map may then be used by planning subsystem 206 to make decisions regarding the appropriate actions to be included in the plan of action for autonomous vehicle 120. After the right turn has been successfully made by autonomous vehicle 120, planning subsystem 206 may send another instruction instructing the same camera(s) to go back to communicating a different, possibly reduced, level of sensor data to autonomous vehicle management system 122. In this manner, the sensor data that is used to build the internal map can be dynamically changed.

Examples of changes in a sensor's behavior caused by an instruction received by the sensor from autonomous vehicle management system 122 may include, without limitation:

Cause a sensor to reduce, or even shut off, sensor data that is communicated from the sensor to autonomous vehicle management system 122. This may be done, for example, to reduce the high volume of sensor data received by autonomous vehicle management system 122. Using the same example from above, where planning subsystem 206 receives an input indicating that a goal of the autonomous vehicle 120 is to make a right turn, planning subsystem 206 may decide that it requires reduced sensor data with respect to the left environment of autonomous vehicle 120. Planning subsystem 206 may then determine the one or more sensors (e.g., cameras) that are responsible for communicating the sensor data that is to be reduced. Planning subsystem 206 may then send instructions to these one or more sensors to cause them to change their behavior such that the amount of sensor data communicated from these sensors to autonomous vehicle management system 122 (e.g., to perception subsystem 204) is reduced.

Cause a sensor to change its field of view. For example, causing a camera or a LIDAR sensor to zoom in to a narrow location.

Cause a sensor to only send partial information. For example, the sensor may send less than all the information captured by the sensor.

Cause a sensor to send information faster or slower than before or than a regular rate.

Cause a sensor to turn on.

Cause a sensor to capture and/or send information to autonomous vehicle management system 122 at a different resolution or granularity then before.

Figure 11:
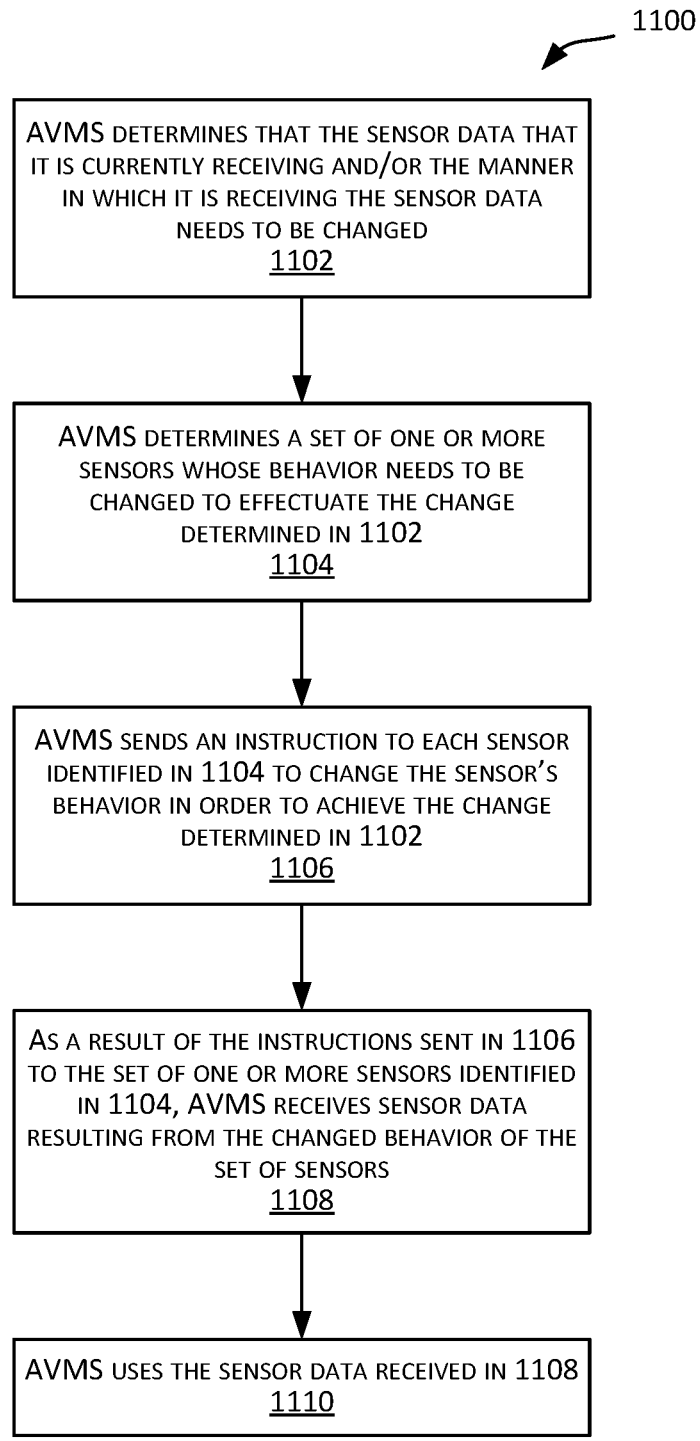
FIG. 11 depicts a simplified flowchart depicting processing performed by an autonomous vehicle management system for controlling the behavior of one or more sensors according to certain embodiments.

FIG. 11 depicts a simplified flowchart 1100 depicting processing performed by autonomous vehicle management system 122 for controlling the behavior of one or more sensors according to certain embodiments. The processing depicted in FIG. 11 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method depicted in FIG. 11 and described below is intended to be illustrative and non-limiting. Although FIG. 11 depicts the various processing steps occurring in a particular sequence or order, this is not intended to be limiting. In certain alternative embodiments, the steps may be performed in some different order or some steps may also be performed in parallel. In certain embodiments, such as in the embodiment depicted in FIG. 2A, the processing depicted in FIG. 11 may be performed by planning subsystem 206. Although, in alternative embodiments, the processing depicted in FIG. 11 may also be performed by other subsystems of autonomous vehicle management system 122.

At 1102, autonomous vehicle management system 122 may determine that the sensor data that it is currently receiving and/or the manner in which autonomous vehicle management system 122 is receiving the sensor data needs to be changed. The change may be in the content of the sensor data received by autonomous vehicle management system 122, or in the manner (e.g., the rate at which the data is received), or both.

There are various situations where this may happen. Some examples:

Example #1: Autonomous vehicle management system 122 may have received information indicative of a particular goal for autonomous vehicle 120, and a change in sensor data is needed to safely facilitate this goal. For example, the particular goal could be a certain operation that is to be performed by autonomous vehicle 120, such as a left/right turn, change traffic lanes, perform a certain specialized task (e.g., digging), and the like. Autonomous vehicle management system 122 may determine that in order to perform the requested operation/goal safely, the current level of sensor data received by autonomous vehicle management system 122 is not sufficient. For example, autonomous vehicle management system 122 may determine that the internal map generated by autonomous vehicle management system 122 needs to show more details about a particular area of the environment of autonomous vehicle 120 (e.g., more details about the right side of the ego vehicle if the ego vehicle is to make a right turn; change the range of sensing of a Lidar sensor from a three-hundred and sixty-degree (360°) view to a narrower range that includes a specific object to be sensed and/or tracked in greater detail). In order to get these details, autonomous vehicle management system 122 may determine in 1102 that additional sensor data, not currently being received by autonomous vehicle management system 122, needs to be received.

Example #2: As a corollary to Example #1, autonomous vehicle management system 122 may determine in 1102 that it no longer needs to receive specific sensor data. For example, after autonomous vehicle 120 has made a right turn, autonomous vehicle management system 122 may decide that it no longer needs to receive the additional sensor data from the right side of autonomous vehicle 120 and the sensor can revert back to sending a regular level of sensor data.

Example #3: Autonomous vehicle management system 122 may determine in 1102 that in order to run certain what-if simulations, specific sensor data is needed from a certain area of the ego vehicle's environment. Accordingly, in 1102, autonomous vehicle management system 122 may determine that the sensor data received by autonomous vehicle management system 122 from the sensors needs to be changed to include that specific sensor data.

Example #4: Autonomous vehicle management system 122 may determine that it is currently not receiving sensor data from a particular sensor. In 1102, autonomous vehicle management system 122 may determine that it requires sensor data received from this sensor to be turned on.

Example #5: As a corollary to Example #3, autonomous vehicle management system 122 may determine in 1102 that it no longer needs to receive sensor data from a particular sensor.

Example #6: The autonomous vehicle management system 122 is currently receiving sensor data at a particular granularity or resolution from a sensor. At 1102, autonomous vehicle management system 122 may determine that, in order to perform certain processing, it needs to receive sensor data from that sensor at a different (higher or lower) granularity or resolution.

Example #7: The autonomous vehicle management system 122 is currently receiving, from a sensor, sensor data corresponding to a certain volume of the vehicle's environment. At 1102, autonomous vehicle management system 122 may determine that, in order to perform certain processing, it needs to change the volume of the vehicle's environment for which the sensor is capturing data. For example, for a camera, autonomous vehicle management system 122 may determine that the camera needs to be panned, or zoomed, etc. to change the volume of the vehicle's environment for which sensor data is captured.

At 1104, autonomous vehicle management system 122 determines a set of one or more sensors whose behavior needs to be changed to effectuate the change determined in

1102. For example, for the situation in Example #1 described above, in order to get more sensor data of the right side environment of autonomous vehicle 120, autonomous vehicle management system 122 may identify specific onboard cameras mounted on the right side of autonomous vehicle 120 in 1104; or may identify the specific Lidar sensor whose sensing view range is to be changed. The one or more sensors identified in 1104 may include onboard sensors, remote sensors, or combinations thereof.

At 1106, autonomous vehicle management system 122 sends an instruction to each sensor identified in 1104 to change the sensor's behavior to effectuate the change determined in 1102. An infrastructure may be provided for communicating the instructions to the intended sensors. As previously described with respect to the embodiment depicted in FIG. 2A, sensors interface subsystem 210 provides an interface for sending the instructions from autonomous vehicle management system 122 to the respective sensors. For example, for an instruction to be sent from planning subsystem 206 to a particular sensor, the instruction may first be communicated from planning subsystem 206 to sensors interface subsystem 210, and sensors interface subsystem 210 may then communicate the instruction to the particular sensor. The instruction may be communicated in a format and using a protocol that is understandable by the particular sensor.

For a sensor receiving such an instruction from autonomous vehicle management system 122, the behavior of the sensor is changed as a result of the instruction. The behavior of the sensor is changed such that the behavior of the sensor after receiving the instruction is different from the behavior of the sensor just prior to receiving the instruction.

At 1108, as a result of the instructions sent in 1106 to the set of one or more sensors identified in 1104, autonomous vehicle management system 122 receives sensor data from the set of sensors resulting from the change in the behavior of the set of sensors caused by the instruction sent in 1106. In some embodiments, the change is made in the content of the sensor data received by autonomous vehicle management system 122. For example, the content of sensor data received by autonomous vehicle management system 122 from a sensor as a result of the instruction sent in 1106 is different from the content of the sensor data received by autonomous vehicle management system 122 from that sensor after sending the instruction in 1106 and the sensor receiving the instruction and changing its behavior based upon the instruction. For example, for the situation in Example #1, autonomous vehicle management system 122 may receive more detailed sensor data about the right side of the ego vehicle's environment. As another example, for the Lidar situation in Example #1, autonomous vehicle management system 122 may receive sensor data corresponding to a narrower range (instead of the previous 360 degrees range) that includes the specific object to be sensed and/or tracked in greater detail.

In some embodiments, the change may be in the manner in which autonomous vehicle management system 122 receives the sensor data from a sensor after receiving the instruction. For example, prior to receiving the instruction, the sensor may be sending sensor data to autonomous vehicle management system 122 at a first rate, and the instruction may cause the sensor to send the sensor data at a second rate, where the second rate is slower or faster than the first rate.

At 1110, the sensor data that is received in 1108 is used by autonomous vehicle management system 122. For example, the sensor data received in 1108 may be used by autonomous vehicle management system 122 to determine an action (e.g., an action in the plan of action) to be performed by autonomous vehicle 120. Autonomous vehicle management system 122 may then cause the action to be performed by autonomous vehicle 120. For example, the sensor data may be used to update the internal map generated by autonomous vehicle management system 122, and the updated internal map may be used to make decisions regarding one or more planned actions to be performed by autonomous vehicle 120 to meet the goal. For example, planning subsystem 206 may use the updated internal map to generate a plan of action for autonomous vehicle 120. The plan of action that is generated may then be communicated to controls subsystem 208, which may then control one or more systems of vehicle systems 112 to cause the actions to be performed by autonomous vehicle 120 in a safe manner.

In the manner described above, autonomous vehicle management system 122 is able to dynamically and on-demand control the behavior of one or more sensors whose sensor data is used by autonomous vehicle management system 122 to make decisions regarding actions to be included in the plan of action for performance by autonomous vehicle 120. This provides substantial benefits over the systems of conventional autonomous vehicles that are not able to control the behavior of sensors as described above. In conventional systems, because there is no ability to control the sensor data received from the sensors as described in this disclosure, a continuous fixed stream of sensor data is received from the sensors. As a result of this fixed stream of sensor data, the aggregate volume of sensor data is typically very large requiring a substantial amount of memory resources to store and processing resources (e.g., processors) to process the data.

The ability to dynamically control the behavior of sensors, as described herein, not only enables autonomous vehicle management system 122 to avoid the problems of sensors in conventional autonomous vehicles but also enables new functionalities. For a sensor, autonomous vehicle management system 122 can dynamically change and control what sensor data is captured by the sensor and/or communicated from the sensor to autonomous vehicle management system 122 (e.g., granularity/resolution of the data, field of view of the data, partial/detailed data, how much data is communicated, control zoom associated with the data, and the like), when the data is captured by the sensor and/or communicated by the sensor to autonomous vehicle management system 122 (e.g., on-demand, according to a schedule), and how the data is captured by the sensor and/or communicated from the sensor to autonomous vehicle management system 122 (e.g., communication format, communication protocol, rate of data communication to autonomous vehicle management system 122). This improves the overall safety of autonomous vehicle 120. For example, in certain scenarios, more detailed data (which translates to more detailed information about the ego vehicle's environment) can be used to make decisions regarding actions to be performed by autonomous vehicle 120. In some other scenarios, the amount of sensor data received from a sensor may be reduced for more efficient use of the sensor (e.g., to save power used by the sensor) without overwhelming autonomous vehicle management system 122 with unnecessary data. All this is done without comprising any safety considerations. The overall safety of autonomous operations performed by autonomous vehicle 120 is improved while making efficient use of memory/processing resources and of the sensors.

Referring back to FIG. 2A, control subsystem 208 is configured to receive the plan of action generated by planning subsystem 206 and control the subsystems of vehicle systems 112 to cause the actions to be performed by controlling autonomous vehicle 120. For example, if the plan of action received from planning subsystem 206 identifies a particular trajectory to be followed by autonomous vehicle 120, controls subsystem 208 may convert that action to specific operations to be performed by the steering, throttle, and braking vehicle systems of autonomous vehicle 120 to cause autonomous vehicle 120 to traverse the specified trajectory. For example, controls subsystem 208 may communicate steering angle information, throttle pedal position, and other like information to one or more systems in vehicle systems 112. The one or more systems in vehicle systems 112 are then configured to follow the instructions received from controls subsystem 208. In this way, controls subsystem 208 can manage the speed, direction, turning, braking, acceleration, etc. of autonomous vehicle 120.

In certain embodiments, controls subsystem 208 may receive feedback information from vehicle systems 112. This feedback information may include, for example, information related to the actions performed by vehicle systems 112 and current vehicle mode or status information. Controls subsystem 208 is configured to monitor the dynamics and kinematics (e.g., basic physics of the vehicle, such as velocity, acceleration, brake pressure etc.) of autonomous vehicle 120. Based upon this monitoring, controls subsystem 208 can estimate how autonomous vehicle 120 is supposed to perform and then check if autonomous vehicle 120 is performing or has performed as expected or estimated.

Functions performed by controls subsystem 208 may also include performing vehicle state estimates, dynamic bound, motion control, fail-safe control action, CAN communication, etc. Dynamic bound processing may include determining information about the ego vehicle's stability and capability. For example, if the plan of action generated by planning subsystem 206 indicates that autonomous vehicle 120 is to take a 30 degree sharp turn, the dynamic bound processing performed by controls subsystem 208 enables it to estimate whether if autonomous vehicle 120 takes this sharp turn now at this speed, will it go off track. In general, dynamic bound processing enables controls subsystem 208 to do a bounds check for autonomous vehicle 120. Motion control processing enables controls subsystem 208 to control autonomous vehicle 120 based on the plan of action received from planning subsystem 206. For example, if the plan of action generated by planning subsystem indicates that the speed of the car is to be increased to 30 mph, motion control processing sets in to ensure that a subsystem of vehicle systems 112 presses enough gas to go 30 mph. Fail-safe control action processing is performed by controls subsystem 208 to perform safe or corrective actions when an unexpected event occurs. For example, autonomous vehicle 120 may encounter a ditch on a road, or may experience some failure in the brake system, etc. In such a situation, controls subsystem 208 determines what sort of action is to be taken by one or more systems of vehicle systems 112. Controlled area network (CAN) is a standard protocol that is used to communicate with other vehicles or equipment.

Information subsystem 212 is configured to provide information (e.g., render feedback information) to a user (e.g., a safety driver, passenger, or a person remotely observing autonomous vehicle activity) of autonomous vehicle 120. Information subsystem 212 may determine the information to be output and communicate that information to a system (e.g., vehicle dashboard system) of vehicle systems 112, which may then output the information to a user of autonomous vehicle 120 via an output device (e.g., a touch screen, speaker system, etc.) of the autonomous vehicle. In certain embodiments, information subsystem 212 may be communicatively coupled with other subsystems of autonomous vehicle management system 122 and may receive information from these subsystems. Based upon the received information, information subsystem 212 may then determine the information to be output a user of the autonomous vehicle. This information may then be communicated to vehicle systems 112.

Various different types of information may be communicated from information subsystem 212 to be output to a user of autonomous vehicle 120. For example, the information that is output can include information about the current state of autonomous vehicle 120 or about the vehicle's environment. In certain embodiments, the information that is output can also include information about future planned actions to be performed by autonomous vehicle 120. These actions may correspond to actions included in the plan of action generated by planning subsystem 206. For example, if the plan of action generated by planning subsystem 206 indicates that a right turn is planned for the autonomous vehicle, then information indicative of the upcoming turn may be communicated from information subsystem 212 to vehicle systems 112 to be output to the user of the autonomous vehicle. As another example, if the speed of the autonomous vehicle is going to be reduced, information may be output to the user of the autonomous vehicle indicative of the current speed of the autonomous vehicle and information indicative of the lower speed to which the autonomous vehicle's speed will be reduced in the next few time units (e.g., seconds, minutes).

In certain embodiments, in addition to outputting information identifying future actions of autonomous vehicle 120, the information that is determined by information subsystem 212 and that is output to the user of the autonomous vehicle can include information indicative of one or more reasons for the planned future action. For example, in addition to outputting information indicative of a future action of lowering the speed of the autonomous vehicle, information may also be output indicating why the speed is going to be lowered. Reasons could be, for example, because a slower speed zone is sensed, because it is determined that another vehicle in front of the autonomous vehicle is slowing down, or because the presence of one or more people is sensed in the autonomous vehicle's environment (e.g., presence of a road working crew or a pedestrian), and the like.

Outputting or displaying information indicative of future actions and reasons for the future actions provides several benefits aimed at improving the safety of autonomous vehicle 120. By displaying this information, the user of the autonomous vehicle is made aware of the actions to be taken and the reasons for the actions. This assures the user of the autonomous vehicle that the vehicle is behaving as intended and not behaving erratically or in an out-of-control manner. The user can also anticipate the action or actions to be taken by the vehicle. This goes a long way in making the user of the autonomous vehicle feel safe while being autonomously driven in the autonomous vehicle or while some other operation is being autonomously performed by the autonomous vehicle. This also increases the user's trust in the safety of the autonomous vehicle. It also allows the user to take manual actions (e.g., emergency actions), where appropriate, to override the planned actions.

In certain embodiments, the information regarding the planned future actions and the reasons for the actions may also be displayed such that the information is consumable (e.g., viewable) by an entity in the autonomous vehicle's environment. For example, the information may be displayed by autonomous vehicle 120 such that it can be viewed by drivers or passengers in other vehicles in the ego vehicle's environment and/or by people in the ego vehicle's environment. This increases the overall safety and trust of the traffic system environment that includes the ego vehicle and other entities (e.g., other vehicles, people, etc.) in the ego vehicle's environment.

Figure 2B:
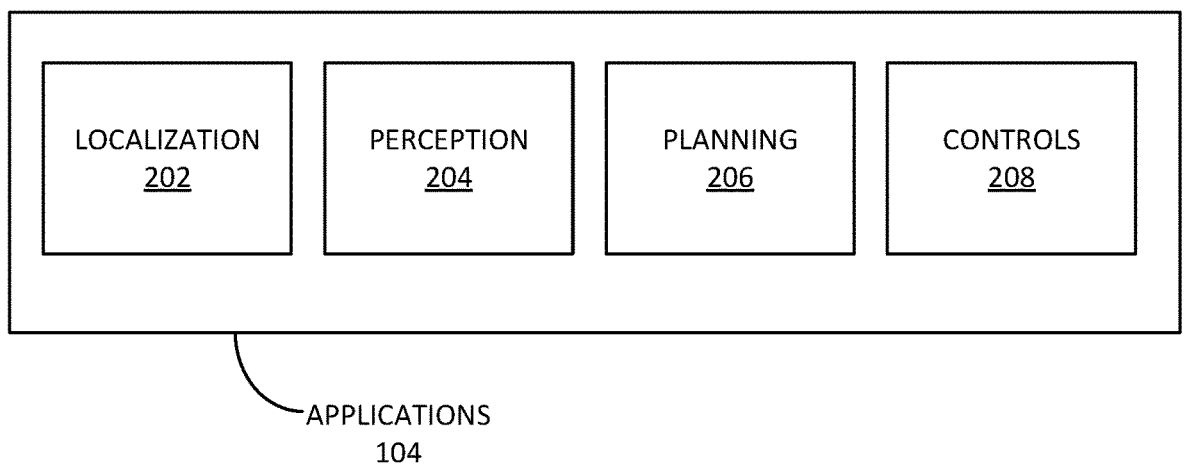
FIG. 2B illustrates software modules (e.g., program, code, or instructions executable by one or more processors of an autonomous vehicle) that may be used to implement the various subsystems of an autonomous vehicle management system according to certain embodiments.

FIG. 2B illustrates software modules (e.g., program, code, or instructions executable by one or more processors of autonomous vehicle 120) that may be used to implement the various subsystems of autonomous vehicle management system 122 according to certain embodiments. The software modules may be stored on a non-transitory computer medium. As needed, one or more of the modules or executable images of the modules may be loaded into system memory (e.g., RAM) and executed by one or more processors of autonomous vehicle 120. In the example depicted in FIG. 2B, software modules are shown for implementing localization subsystem 202, perception subsystem 204, planning subsystem 206, and controls subsystem 208.

Figure 5:
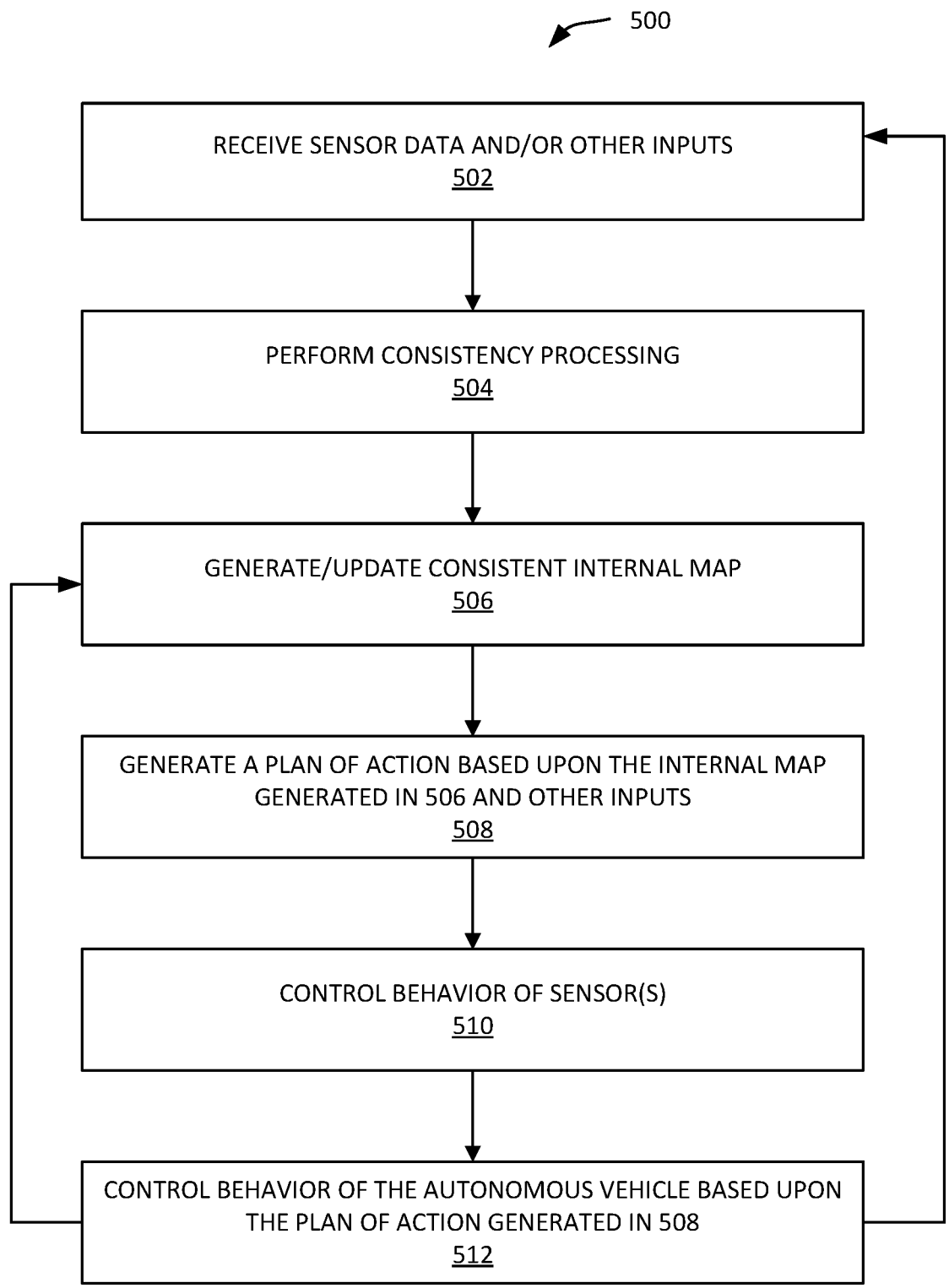
FIG. 5 illustrates an example process performed by an autonomous vehicle management system according to some embodiments.

FIG. 5 illustrates an example process 500 performed by autonomous vehicle management system 122, according to some embodiments. The processing depicted in FIG. 5 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method presented in FIG. 5 and described below is intended to be illustrative and non-limiting. Although FIG. 5 depicts the various processing steps occurring in a particular sequence or order, this is not intended to be limiting. In certain alternative embodiments, the steps may be performed in some different order or some steps may also be performed in parallel.

At 502, sensor data sensed by one or more sensors and/or other inputs are received by autonomous vehicle management system 122. For example, sensor data may be received from a GPS sensor, one or more cameras mounted on the autonomous vehicle, from LIDAR, and the like.

At 504, consistency checks (e.g., performed by a consistency module) are performed on the received sensor data, including performing rationality checks and deficiency checks on the received sensor data and normalizing the received sensor data to generate normalized sensor data.

At 506, a consistent internal map is generated and/or updated by autonomous vehicle management system 122 based upon the sensor data received in 502 and normalized in 504. In certain embodiments, perception subsystem 204 is configured to receive the sensor data and generate the internal map. If an internal map has already been previously generated, generating the internal map in 506 may include updating the consistent internal map based on newly received sensor data. As previously described, the consistent internal map can be a 3D map of the autonomous vehicle's environment.

The internal map generated in 506 may be continually updated as the state of autonomous vehicle 120 and the state of the environment around the autonomous vehicle changes. The processing in 506 ensures that a consistent internal map is kept up to date.

At 508, autonomous vehicle management system 122 generates a plan of action using the internal map generated in 506 and based upon other inputs such as the goal to be achieved by autonomous vehicle 120, safety considerations, localization information, and the like. In certain embodiments, processing in 508 may be performed by planning subsystem 206 of autonomous vehicle management system 122. There are various ways in which planning subsystem 206 may access the internal map generated in 506. In one instance, an application programming interface (API) may be provided that enables planning subsystem 206 to access and query the internal map. In other instances, other mechanisms may be provided that enable planning subsystem 206 to access and use the internal map.

At 510, planning subsystem 206 sends instructions to one or more sensors to control the behavior of the sensors. For example, the sensor data captured by the sensors and/or communicated from the sensors to autonomous vehicle management system 122 may be dynamically and on-demand controlled by autonomous vehicle management system 122. This may result in autonomous vehicle management system 122 receiving changed sensor data (in 502), and the internal map may be regenerated or updated based upon the changed sensor data.

At 512, the behavior of autonomous vehicle 120 is controlled based upon the plan of action generated in 510. As described above, in some embodiments, the plan of action generated by planning subsystem 206 may be communicated to controls subsystem 208, which may then control one or more systems of vehicle systems 112 to control the behavior of autonomous vehicle 120 to achieve a goal in a safe manner.

Autonomous vehicle management system 122 may use various AI and deep learning based models and techniques to perform its processing. For example, AI based techniques (e.g., a CNN model) may be used by perception subsystem 204 to identify objects in the autonomous vehicle's environment. As another example, planning subsystem 206 may use AI based techniques (e.g., an RL-based model) to generate a plan of action comprising a sequence of one or more actions to be performed by the autonomous vehicle in order to meet a certain goal.

At a high level the AI models used by autonomous vehicle management system 122 can be categorized into supervised learning models, unsupervised learning models, and reinforcement learning (RL) models. Building and using a supervised learning model, such as a neural network or neural network model, generally involves two phases:

(1) A training phase—In this phase, the AI model is built and trained using a training dataset. The training can include iteratively training the AI model using a portion of the training dataset and then validating the trained model using another portion (also referred to as the validation dataset) of the training dataset. The training and validation steps are iteratively performed until the AI model is sufficiently trained for real-time use during the inference or runtime phase.

(2) An inference or runtime phase—In this phase, an AI model that has previously been trained is used to make inferences or predictions based upon real time data (also referred to as the inferring data or dataset to differentiate it from the training dataset). The inferences or predictions may correspond to various operations such as segmentation, pattern recognition, classification, etc. For example, perception subsystem 204 may use a neural network model to make predictions identifying objects in an autonomous vehicle's environment. For example, perception subsystem 204 may use a Convolutional Neural Network (CNN) model to predict whether an object in an image(s) received from a sensor associated with the autonomous vehicle (e.g., a remote sensor or an onboard sensor) is a person or a tree, or another vehicle, etc.

AI models however at times make unpredictable errors in their predictions made during the inference phase. There are several factors that cause AI models to predict incorrectly. One factor is because the inferring dataset for which the AI model is making a prediction at time of inference is different from the training dataset (e.g., the data used to train and/or validate the AI model during the training phase) resulting in suboptimal performance of the model at the time of the inference. Autonomous vehicle management system 122 performs processing to account for such a problem. Autonomous vehicle management system 122 is configured to verify if an inferring data point (i.e., an input data point used by an AI model to make an inference or prediction during the inference phase) is statistically similar to the training or validation dataset. If the input inferring data point is determined to be statistically different compared to the training/validation dataset, autonomous vehicle management system 122 flags the prediction made by the AI model for that data point (or dataset) as potentially not being accurate, and may not use the particular prediction made by the AI model for downstream processing and decision-making.

In some embodiments, autonomous vehicle management system 122 generates a score (also referred to as a model confidence score) that is indicative of how similar or dissimilar the inferring data point is to the training dataset. For example, a high score may be generated where the inferring data point is similar to the training data set, and alternatively, a low score may be generated where the inferring data point is different from or dissimilar to the training data set. The confidence score acts as a sanity check that provides a measure of how much the prediction made by the AI model is to be trusted. This sanity check is used by autonomous vehicle management system 122 to make a decision as to how the prediction made by the AI model is to be used. For example, in instances where the score for certain inferring data point is low, which indicates a high measure of dissimilarity, the prediction made by the AI model based upon that inferring data point may be overridden or not used by autonomous vehicle management system 122.

Figure 6:
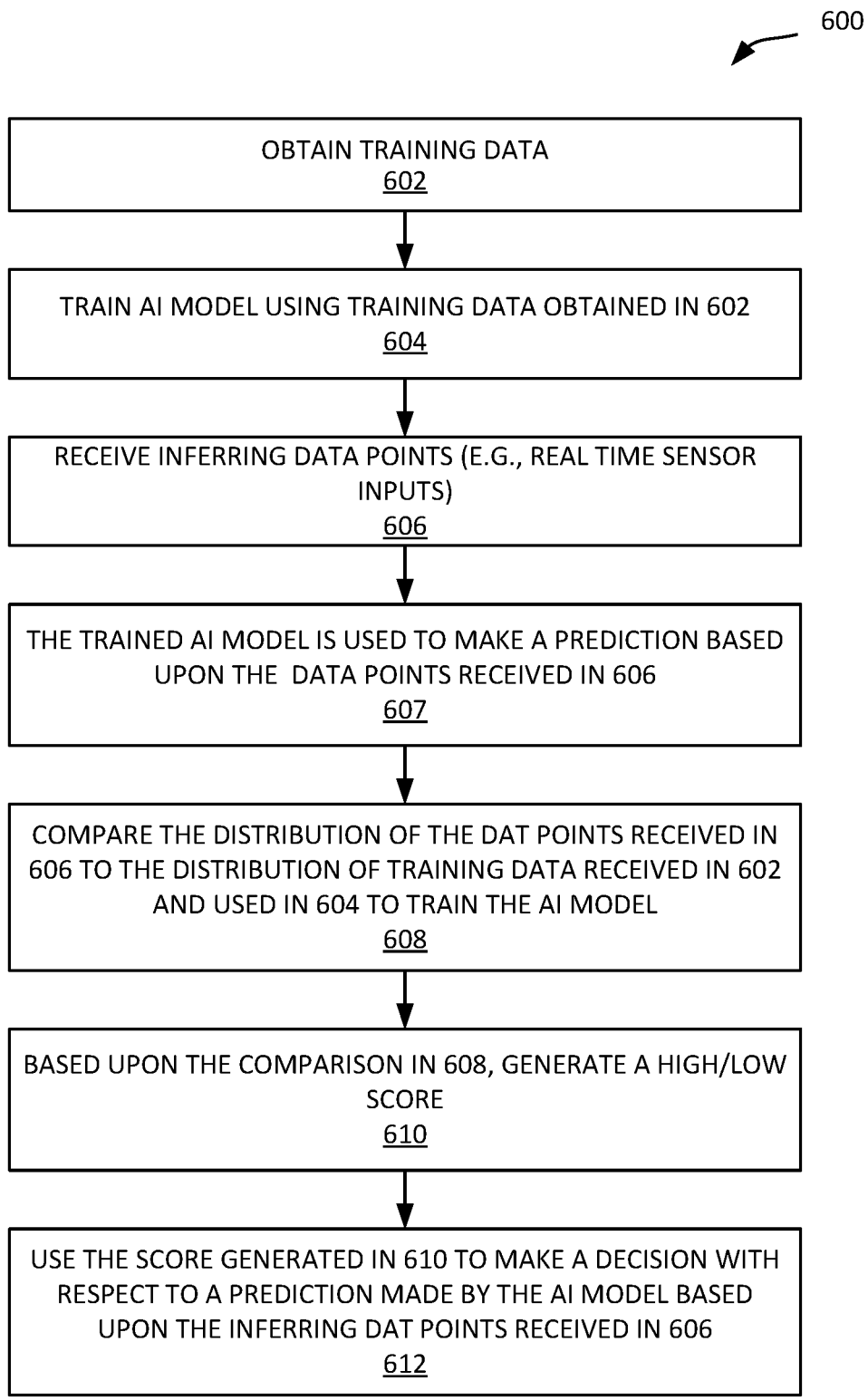
FIG. 6 illustrates an example method performed by an autonomous vehicle management system for generating confidence scores or weights for inferring data points where the autonomous vehicle management system uses a supervised learning AI model to make a prediction based upon the inferring data points according to certain embodiments.

FIG. 6 illustrates an example method 600 performed by autonomous vehicle management system 122 for generating confidence scores or weights for inferring data points where autonomous vehicle management system 122 uses a supervised learning AI model to make a prediction based upon the inferring data points according to certain embodiments. The inferring data points may, for example, correspond to sensor inputs received from sensors 110 associated with autonomous vehicle 120.

The processing depicted in FIG. 6 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method depicted in FIG. 6 and described below is intended to be illustrative and non-limiting. Although FIG. 6 depicts the various processing steps occurring in a particular sequence or order, this is not intended to be limiting. In certain alternative embodiments, the steps may be performed in some different order or some steps may also be performed in parallel.

The processing depicted in FIG. 6 may be performed whenever autonomous vehicle management system 122 uses a supervised learning AI model (e.g., a neural network model) model) to make predictions using inferring data points such as real-time sensor inputs. For example, the processing may be performed when perception subsystem 204 uses an AI model (e.g., a neural network) to make predictions (e.g., identify objects or other entities present in the vehicle's environment) based upon sensor data inputs received from sensors 110. The processing depicted in FIG. 6 may be performed by these subsystems during the inference or runtime phase when such AI models are being used to make predictions or inferences based upon inferring data points, such as sensor data inputs received from sensors 110. In FIG. 6, blocks 602 and 604 represent processing performed during the training phase and blocks 607, 608, 610, and 612 represent processing performed during the inference or runtime phase.

In 602, during a training phase, training data is received or obtained. The training data can include labelled test data, where inputs and labels (ground truths) associated with those inputs are known. For example, the training data may include inputs x(i), and for each input x(i), a target value or right answer (also referred to as the ground truth) y(i) that the AI model is to be trained to predict. A pair of (x(i), y(i)) is called a training example, and the training data may comprise multiple such training examples. The space of all the inputs x(i) in the training data obtained in 602 may be denoted by X, and the space of all the corresponding targets y(i) may be denoted by Y.

For example, the training examples in training data may include a set of sensor inputs (e.g., images captured by one or more cameras associated with autonomous vehicle 120), each sensor representing x(i). For each input image x(i), a labeled result y(i) (ground truth) for the input is provided, where y(i) identifies an object (e.g., a person, a tree, another vehicle, etc.) present in the x(i) image.

At 604, the training data received in 602 is used to train an AI model. The training performed in 604 may include, iteratively, performing training and validation until the AI model has been sufficiently trained for use in the inference phase. For example, for a supervised learning-based AI model, the goal of the training is to learn of function "h( )" (also sometimes referred to as the hypothesis function) that maps the training input space X to the target value space Y, h: X→Y, such that h(x) is a good predictor for the corresponding value of y. Various different techniques may be used to learn this hypothesis function. In some techniques, as part of deriving the hypothesis function, a cost or loss function may be defined that measures the difference between the ground truth value for an input and the predicted value for that input. As part of training, techniques such as back propagation are used to minimize this cost or loss function.

The training technique used in 604 may also depend on the type of AI model that is being trained. For example, there are different types of supervised learning AI models, such as different types of neural network models, support vector machine (SVM) models, and others. Various different training techniques may be used. For example, as previously indicated, a loss or cost function may be defined for the model and back propagation techniques may be used to minimize this loss or minimization function. For example, autonomous vehicle management system 122 may perform training to build and train a neural network model. A neural network or neural network model represents a computational model that is inspired by the way neurons and networks of neurons work in the human brain. A neural network comprises multiple nodes arranged in layers. Each node receives an input from some other nodes, or from an external source, and computes an output. Each input to a node has an associated weight that is assigned based upon the relative importance of that input to other inputs. The node applies a function (activation function) to the weights sum of its inputs and to a bias input to generate the output. The activation function can introduce non-linearity in the output of the node. The layers of a neural network can comprise an input layer comprising one or more input nodes, an output layer comprising one or more output nodes, and zero or more hidden layers sandwiched between the input and output layers, each hidden layer comprising one or more nodes. The outputs of nodes at one layer can be provided or connected as inputs to nodes of another layer. The outputs of the output layer represent the results or predictions made by the neural network processing. A neural network can be implemented using code executing on one or more processors, where the code implements the nodes, the connections between the nodes, the functions performed by the nodes, and the processing flow through the nodes. A neural network may be trained using, for example, back propagation training techniques where the weights associated with inputs to the nodes in the neural network are manipulated with the goal to minimize the loss function associated with the output(s) provide by the output layer of the neural network.

After the AI model has been trained according to 602 and 604, the model may then be used for inferencing or making predictions during the inference or runtime phase based upon real time or inferring data points. For example, perception subsystem 204 may use a trained CNN to identify objects in the ego vehicle's environment based upon sensor data inputs (e.g., images captured by one or more cameras in sensors 110) based on real-time inputs received from sensors 110 of the autonomous vehicle.

In 606, autonomous vehicle management system 122 receives inferring data points (e.g., real time sensor inputs from sensors 110). In 607, the model trained in 604 may be used to make one or more predictions based upon the inferring data points received in 606. For example, an inferring data point received in 606 may be a sensor reading or sensor input from a sensor associated (e.g., on-board or remote sensor) with the autonomous vehicle, such as a reading from a radar sensor, a LIDAR sensor, a camera, a Global Positioning System (GPS) sensor, a Inertial Measurement Unit sensor, a Vehicle-to-everything sensor, an audio sensor, a proximity sensor, a SONAR sensor, or other sensor associated with the autonomous vehicle. For example, in one instance, the inferring data point received in 606 may be an image captured by a camera associated with the autonomous vehicle, and perception subsystem 204 may, in 607 use a CNN model trained using a set of training data images to make a prediction (e.g., identify an object in the inferring data point image) for the inferring data point.

In 608, autonomous vehicle management system 122 compares the distribution of the inferring data points (e.g., real time sensor data) received in 606 with the distribution of the training sensor data obtained in 602 and used to train the model in 604. In 610, based upon the comparison performed in 608, autonomous vehicle management system 122 generates a score indicative of how similar (or different) the inferring data points (e.g., the real time sensor inputs) received in 606 are to the training data obtained in 602 and used to train the model in 604. The score is also referred to as the confidence score. In certain embodiments, a high score indicates that a data point received in 606 is similar to data in the training data used to train the AI model, while a low score indicates that the data point received in 606 is different from the data in the training data used to train the AI model.

In certain embodiments, each input ($x(i)$) in training data received in 602 may be represented by a vector comprising "N" attributes or dimensions, where $N>=1$. The training data may comprise "M" inputs, each represented as a vector of N dimensions. Each training input vector can be mapped to a point in N-dimensional space. All the training data inputs taken together and mapped in the N-dimensional space define a distribution of training data inputs. This distribution can define a certain volume in the N-dimensional space. This volume is defined by a boundary based upon the set of training data. This volume represents the distribution of training inputs in space X. In certain embodiments, this volume is used in 608 for the comparison. The inferring data points received in 606 may also each be represented by a vector comprising N attributes or dimensions. Each inferring data point can be mapped to a point in the N-dimensional space based upon the attributes or dimensions of the vector.

In certain embodiments, a Principal Component Analysis (PCA) may be applied to the training data to generate the vectors corresponding to the training data. PCA analysis may also be applied to the inferring data points to generate vectors for them. PCA allows a reduction in the data without compromising on the structure of the data, such that the vectors can be plotted in vector space.

As part of the comparison performed in 608, for an inferring data point received in 606, autonomous vehicle management system 122 maps or plots the inferring data point to a point in vector space and determines a distance of that data point to a distribution of points in vector space representing the distribution of the data points in the training data obtained in 602 and used to train the AI model in 604. If the point in vector space corresponding to the inferring data point falls within the volume, then a high score may be generated in 610 for that inferring data point to indicate the close similarity between the inferring data point and the training data. On the other hand, if the point in vector space corresponding to the inferring data point falls outside the volume, then a low score may be generated in 610 for that inferring data point to indicate the dissimilarity between the inferring data point and training data distribution. The further the distance of the inferring data point from the volume, the lower the score generated for that input in 610.

In certain embodiments, the confidence score generated in 610 may have a value in the range of 0 and 1 (both inclusive), with a score of 1 representing high confidence and a scope of zero "0" representing low confidence. In certain embodiments, if the point representing the inferring data point falls within or on the surface of the volume representing the training data, then a score of "1" is generated for that inferring data point. If, however, the point in vector space representing the inferring data point is not on or inside the volume representing the training data, then a score between zero "0" and one "1" is generated based upon the distance of the point from the volume surface. For example, longer the distance, the score is closer to zero; shorter the distance, the score is closer to one. Accordingly, the value of the score is inversely proportional to the distance of the point in vector space, corresponding to the inferring data point, from the volume representing the distribution of the training data.

In 612, the score generated in 610 may then be used to decide whether the prediction made in 607 by the AI model (e.g., identification of an object based on input images received in 606) is to be used or not. For example, a low degree of similarity represented by, for example, a low score, may indicate a high variance or difference between the inferring data point and the training data and thus a prediction made by the AI model based upon the inferring data received in 606 is potentially not accurate because the inferring data point is quite different from and potentially not included in the training data used to train the AI model. Since the AI model was not trained using such data, the prediction made by the AI model with respect to such inferring data may also be considered not to be accurate or trustworthy. Accordingly, in some instances, as part of 612, if the degree of similarity represented by the score generated in 610 is below some threshold degree of similarity, it may be decided that any prediction made by the AI model based upon the inferring data point received in 606 is not to be used. For example, autonomous vehicle management system 122 may determine that, based upon the score generated in 610, the degree of similarity between the inferring data point received in 606 and the training data is below a threshold degree of similarity. In such a scenario, autonomous vehicle management system may decide not to use the prediction made in 607 for controlling an autonomous operation of the vehicle.

Accordingly, the score generated in 608 reflects a level of confidence for the prediction or inference made using the trained AI model based upon how similar or dissimilar the inferring data is to the training data. For example, if the inferring data point corresponds to digital camera data captured by a sensor of autonomous vehicle 120, the processing depicted in FIG. 6 may be used to determine how reliable is the prediction made by the AI model, such as predicting that an object in the autonomous vehicle's environment is a pedestrian or an object. The training data can be millions of images using RGB values as the distribution. Based on the comparison of the RGB value distribution of the training set with the RGB value distribution of the present digital camera data, process 600 can determine a confidence score of the AI model to accurately predict that the output is a pedestrian.

The score generated in 610 is not to be confused with the probability score or value associated with the prediction made using the AI model. The probability score associated with a prediction indicates the confidence with which the prediction was made using the AI model. This probability score does not indicate how similar the real time input is to the distribution of the training data that is used to train the AI model.

A described above, in certain embodiments, the processing depicted in FIG. 6 involves measuring the distance between the real time inferencing data and the training data. As an example, let's assume that the training data comprises a set of images that are used to train an AI model and the inferring data point is also an image, potentially captured by a camera or other sensor associated with the autonomous vehicle. The first task is to define what is meant by distribution of images on which the model was trained on. Next, different approaches can be used to measure similarity or distance of the inferring image to the training images.

The distribution of set of images can be perceived to be a multivariate distribution of pixel values. However, the dimensionality of even a small 28×28 sized image across three channels (e.g., RGB channels) can be quite large (28×28×3). The covariance matrix of all pixel values may not be non-singular, i.e., an inverse of the matrix may not exist. For some techniques or approaches for measuring the distance/similarity, matrix inversion is an important needed characteristic. In order to reduce dimensionality, Principal Component Analysis (PCA) may be performed on both the training data points and on the inferring data points. For example, in some embodiments, PCA analysis explaining 90% of the variance in the original pixel data may be selected. Selecting PCA explaining 90% of the variance, the covariance matrix turns out to be positive determinant or non-singular. This then allows computation of an inverse of the covariance matrix.

Various different distance or similarity measuring techniques can be used. For each of these techniques, instead of comparing the pixel level values, the distance/similarity is computed between the Principal Components vector (PC or PC vector) of the new inferring image and the distribution of the PC vectors of the training set of images. Examples of measuring techniques include:

(1) Mahalanobis Distance between the PC of the new inferring image and the distribution of PCs across the training set of images.
(2) Cosine Similarity between PC of the new inferring image and the distribution of PCs across the training set of images.
(3) Generalized Mahalanobis Distance between the PC of the new inferring image and the distribution of PCs across the training set of images under non-normal distribution assumption.

(1) The Mahalanobis Distance

The Mahalanobis Distance technique can be used for classification and outlier detection tasks. This is a scale-invariant metric that provides a measure of distance between a data point and a given set of observations following normal distribution. The distance is measured from the central point (mean) of the distribution. This is a unit free measure that takes into account the correlation matrix of the observations. The Mahalanobis distance of an observation $$\vec{x} = (x_1, x_2, x_3, \ldots, x_N)^T$$

from a set of observations with mean $$\vec{\mu} = (\mu_1, \mu_2, \mu_3, \ldots, \mu_N)^T$$

and covariance matrix S is defined as:

$$D_M(\vec{x}) = \sqrt{(\vec{x}-\vec{\mu})^T S^{-1} (\vec{x}-\vec{\mu})}.$$

The Mahalanobis distance is preserved under full-rank linear transformations of the space spanned by the data. This means that if the data has a nontrivial nullspace, Mahalanobis distance can be computed after projecting the data (non-degenerately) down onto any space of the appropriate dimension for the data.

The Mahalanobis distance is a multi-dimensional generalization of the idea of measuring how many standard deviations away a point P is from the mean of a distribution D. This distance is zero if P is at the mean of D, and grows as P moves away from the mean, the Mahalanobis distance measures the number of standard deviations from P to the mean of D. In some embodiments, a Mahalanobis distance may be used to measure the distance between a point representative of the inferring data point received in 606 and the volume or distribution of the training data.

(2) Cosine Similarity

The cosine of two non-zero vectors can be derived by using the Euclidean dot product formula:

$$a \cdot b = \|a\| \|b\| \cos \theta$$

Given two vectors of attributes, A and B, the cosine similarity, $\cos(\theta)$, is represented using a dot product and magnitude as $$\text{similarity} = \cos(\theta) = \frac{A \cdot B}{\|A\| \, \|B\|} = \frac{\sum_{i=1}^{n} A_i B_i}{\sqrt{\sum_{i=1}^{n} A_i^2} \sqrt{\sum_{i=1}^{n} B_i^2}}$$

where Ai and Bi are components of vectors A and B respectively.

(3) Generalized Mahalanobis Distance

Sometimes a drawback of using the Mahalanobis Distance is the underlying assumption that the distribution is Gaussian. In case of non-normal distribution, the Mahalanobis Distance can potentially provide an incorrect measure of the distance. A Generalized Mahalanobis distance, which is distribution agnostic, can be used instead in many cases.

As indicated above, Principal Component Analysis (PCA) may be performed in certain instances to reduce the dimensionality of the data being analyzed. Principal component analysis (PCA) is a statistical procedure that uses an orthogonal transformation to convert a set of observations of possibly correlated variables into a set of values of linearly uncorrelated variables called principal components. If there are "n" observations with "p" variables, then the number of distinct principal components is min (n−1, p). This transformation is defined in such a way that the first principal component has the largest possible variance (i.e., accounts for as much of the variability in the data as possible), and each succeeding component in turn has the highest variance possible under the constraint that it is orthogonal to the preceding components. The resulting vectors are an uncorrelated orthogonal basis set. PCA is sensitive to the relative scaling of the original variables.

In certain embodiments, Singular Value Decomposition (SVD) may be used to perform PCA. Data X can be decomposed using SVD, i.e., $X=U F V^T$ and the covariance matrix can be written as $S=1/n \, (XX)^T=1/n \, (UF^2U^T)$. In this case, U is a n×m matrix. Following from the fact that SVD routines order the singular values in descending order, if n<m, the first "n" columns in U correspond to the sorted eigenvalues of S, and if m≥n, the first "m" corresponds to the sorted non-zero eigenvalues of S. The transformed data can thus be written as $$Y=U^T X=U^T U\Gamma V^T,$$

where $U^T U$ is a simple "n×m" matrix which is one on the diagonal and zero everywhere else. The transformed data can thus be written in terms of the SVD decomposition of X.

Figure 14:
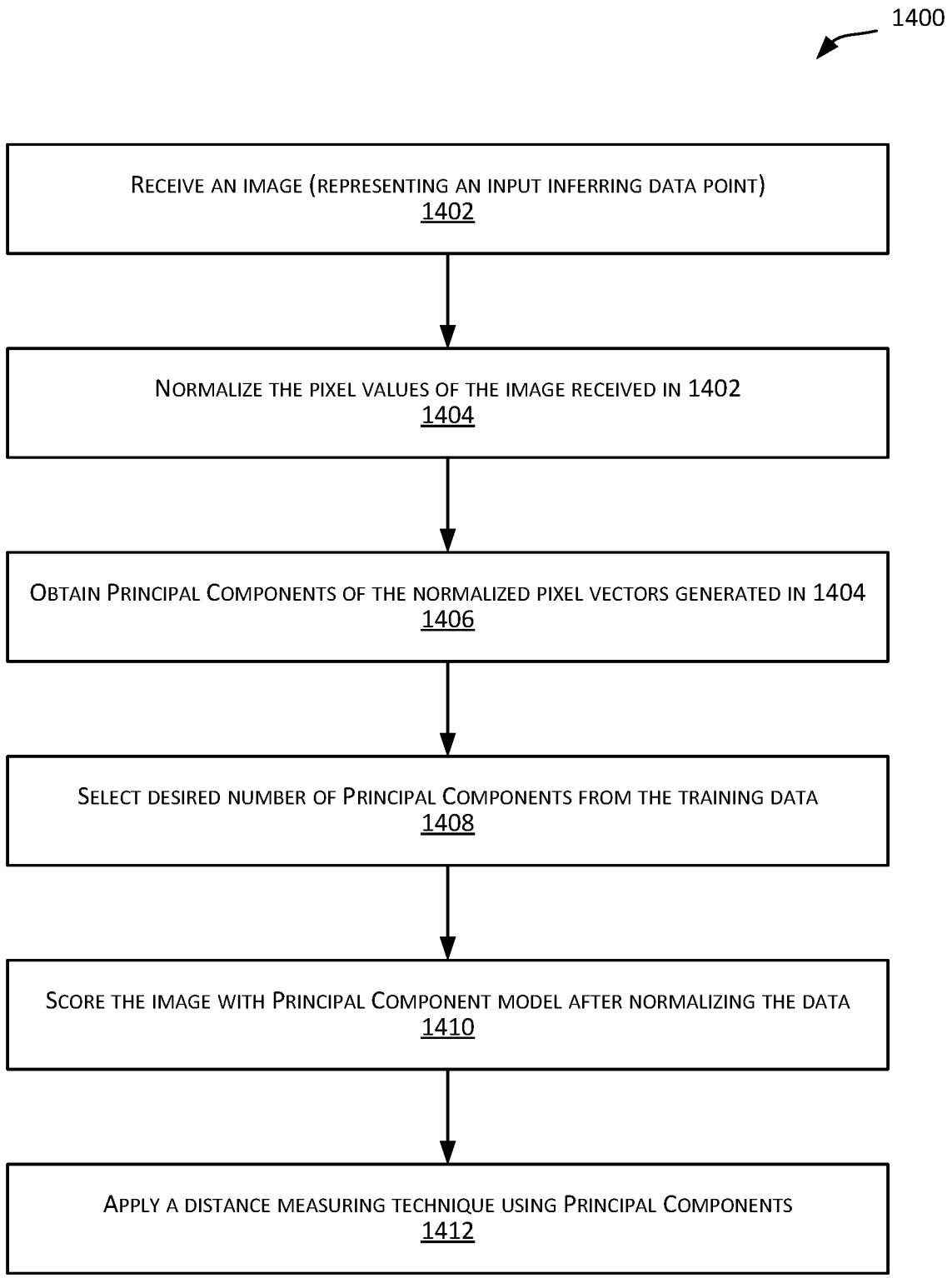
FIG. 14 illustrates an example method performed by an autonomous vehicle management system for measuring a distance between an inferring data point and a training dataset according to certain embodiments.

FIG. 14 illustrates an example method 1400 performed by an autonomous vehicle management system for measuring a distance between an inferring data point and a training dataset according to certain embodiments. For the example depicted in FIG. 14 and described below, it is assumed that the inferring data point is an image and the training data set also comprises a set of images that have been used to train an AI model. The processing depicted in FIG. 14 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method depicted in FIG. 14 and described below is intended to be illustrative and non-limiting. Although FIG. 14 depicts the various processing steps occurring in a particular sequence or order, this is not intended to be limiting. In certain alternative embodiments, the steps may be performed in some different order or some steps may also be performed in parallel.

At 1402, an input image, which represents an inferring data point, is received. The input image may, for example, be an image captured by one or more sensors of autonomous vehicle 120. At 1404, the pixel values of the image received in 1402 are normalized. For example, the pixel values may be normalized by dividing their values by 255. At 1406, principal components are obtained of the normalized pixel vectors generated in 1404. In some embodiments, the Scikit-learn machine learning library (in Python) may be used to perform the processing in 1406. At 1408, the desired number of principal components (e.g., explaining 90% of variances) may be selected from the training data. At 1410, the received image with principal component model is scored often normalizing the data. At 1412, a distance measuring technique (e.g. Mahalanobis Distance, Cosine Similarity, Generalized Mahalanobis Distance, etc.) may be used to measure the distance between the vectorized input inferring image and the training data.

Figure 7:
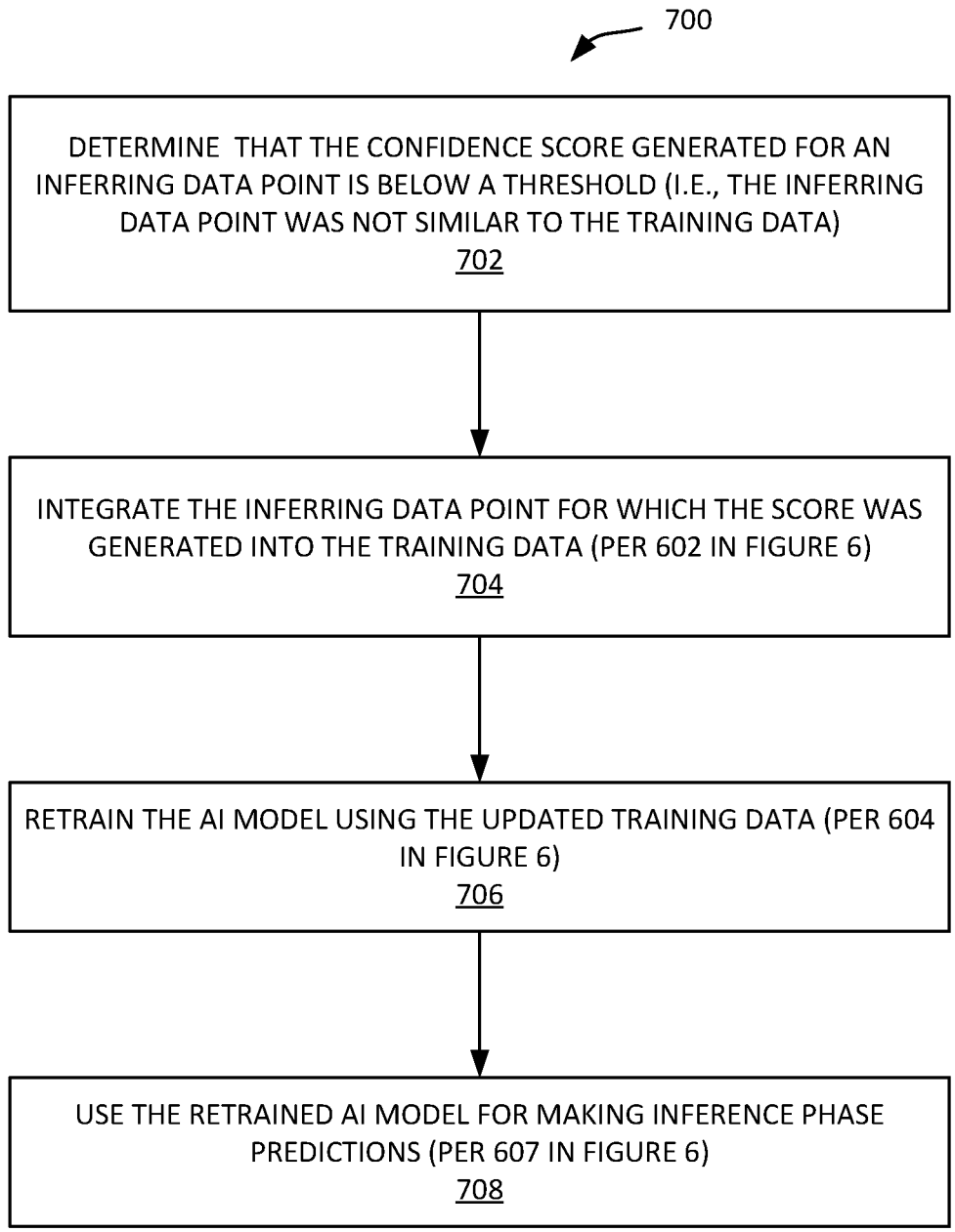
FIG. 7 illustrates an example method depicting processing performed in response to a low confidence score according to certain embodiments.

FIG. 7 illustrates an example method/process 700 depicting processing performed in response to a low confidence score according to certain embodiments. The processing depicted in FIG. 7 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method depicted in FIG. 7 and described below is intended to be illustrative and non-limiting. Although FIG. 7 depicts the various processing steps occurring in a particular sequence or order, this is not intended to be limiting. In certain alternative embodiments, the steps may be performed in some different order or some steps may also be performed in parallel. The processing depicted in FIG. 7 may be performed, for example, by perception subsystem 204, etc.

The processing depicted in FIG. 7 may be triggered after an inferring data point (e.g., a real time sensor input) has been received and a score, according to the processing depicted in FIG. 6 and described above, has been generated for that inferring data point. In 702, autonomous vehicle management system 122 may determine that the degree of similarity, as represented by the confidence score generated for the inferring data point, is below a threshold preconfigured degree of similarity (e.g., a threshold value), thereby indicating that the inferring data point is not similar to the training data that was used to train the AI model that makes a prediction based upon the inferring data point. In 704, the inferring data point is integrated into the training data that is used for training the AI model. In some embodiments, the ground truth for inferring data point may be provided, thereby converting the inferring data point into a training example (x(i), y(i)) for training the AI model, where x(i) is a vector representation of the inferring data point and y(i) is the ground truth (e.g., information identifying the identity of an object in the real time input image) for that inferring data point. The training data received in 602 in FIG. 6 is thus updated to now include the inferring data point. In 706, the AI model is retrained using the updated training data. The training may be performed as per the processing shown in 604 in FIG. 6. In 708, the retrained AI model may then be used for making predictions (per 607 in FIG. 6) for new inferring data points during the inference phase.

Per the processing depicted in FIG. 7 and described above, inferring data points that have received low scores may be converted to training data to retrain the AI model. The training data used to train the AI model is thus expanded with new training examples. The retrained AI model is now better at making decisions for an expanded scope of inferring data points.

For example, if the inferring data point was a particular digital camera input that has been assigned a low confidence score per the processing depicted in FIG. 6, that particular digital camera input can be integrated into the training data set and a new AI model generated, where the new AI model is a retrained better version of the previous AI model. Accordingly, in the future when the particular digital camera input is encountered during real-time processing, the AI model can now generate a predication and the score generated for that input is now high because the input is part of the training data used to train the model. In this way, the AI model can be improved based on encountered needs.

In certain embodiments, instead of just adding the inferring data point to the training data as per 704 in FIG. 7, the inferring data point may be used to generate additional new data points that are also added to the training data. These additional data points may be variations of the inferring data point. In this manner, the inferring data point may be used to generate additional data points that are also added to the training data and used to retrain the AI model.

Figure 9:
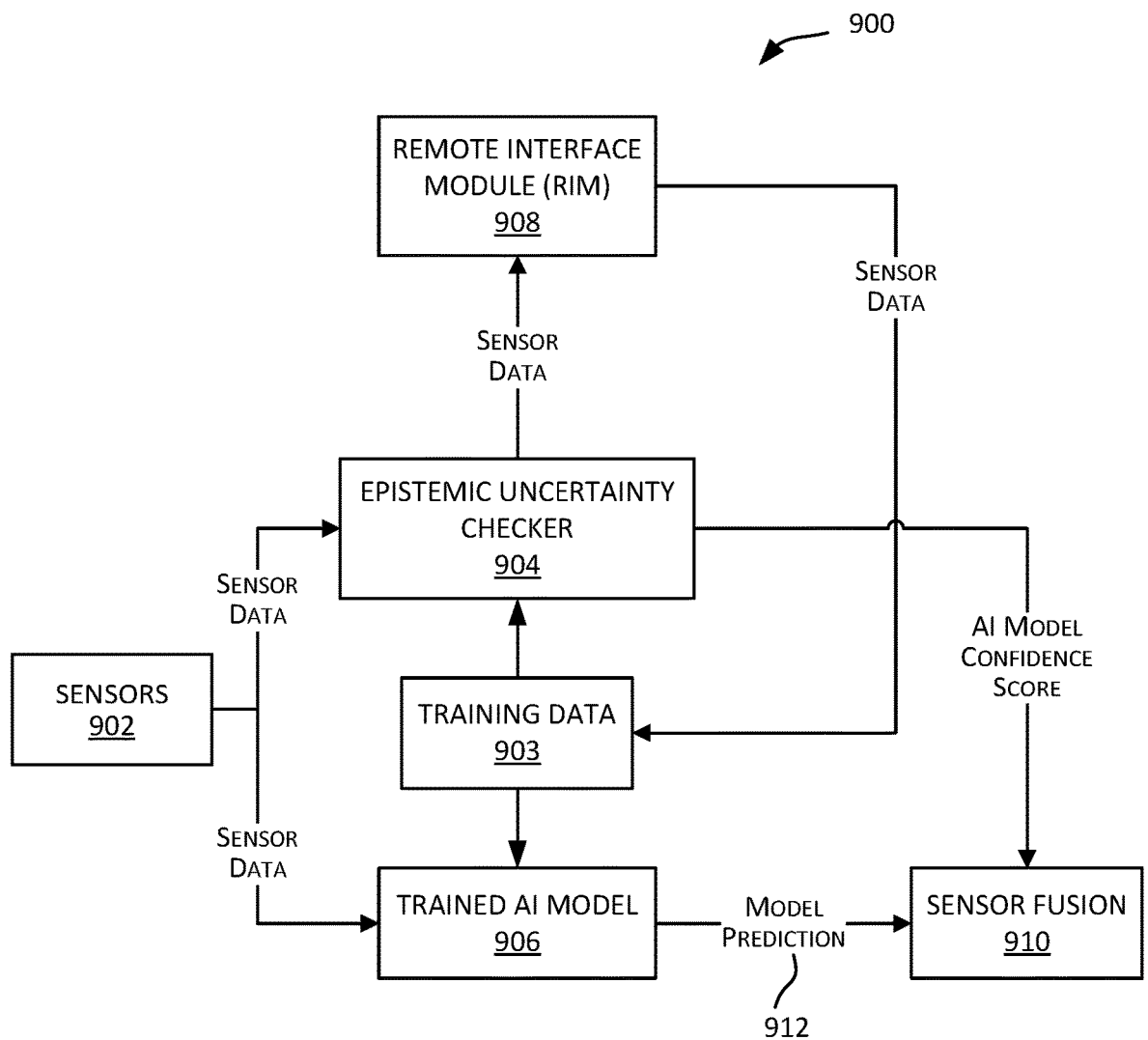
FIG. 9 depicts a simplified dataflow diagram showing processing and flow of data between various subsystems of an autonomous vehicle management system that may implement the processing depicted in FIGS. 6 and 7 according to certain embodiments.

FIG. 9 depicts a simplified dataflow diagram 900 showing processing and flow of data between various subsystems of autonomous vehicle management system 122 that may implement the processing depicted in FIGS. 6 and 7 according to certain embodiments. The embodiment depicted in FIG. 9 is merely an example and is not intended to unduly limit the scope of claimed embodiments. One of ordinary skill in the art would recognize many possible variations, alternatives, and modifications. For example, alternative embodiments may use more or fewer subsystems or components than those shown in FIG. 9, may combine two or more subsystems, or may have a different configuration or arrangement of subsystems. The subsystems may be implemented using software only, hardware only, or combinations thereof.

As shown in FIG. 9, during a training phase, training data 903 may be used to train an supervised learning AI model 906. For example, AI model 906 may be a neural network model. After model 906 has been satisfactory trained, the trained model may then be used to make predictions based upon real time sensor data inputs received from sensors 902.

During the runtime processing, as shown in FIG. 9, real time sensor data from sensors 902 may be communicated to trained AI model 906 and also to epistemic uncertainty checker (EUC) subsystem 904. The trained AI model 906 may make a prediction 912 (e.g., identification of an object in the ego vehicle's environment) based upon the received real time sensory data inputs. The model prediction may be communicated to a sensor fusion subsystem 910.

EUC subsystem 904 is configured to compare the distribution of real time sensory data inputs received from sensors 902 to the distribution of training data 903 used to train the AI model. EUC subsystem 904 may generate a confidence score based upon the comparison. EUC subsystem 904 may communicate the confidence score to sensor fusion subsystem 910.

EUC subsystem 904 may then determine, based upon the calculated confidence score, whether the input data is sufficiently different from the training data such that the input data is to be added to the training data for training the AI model. For example, EUC subsystem 904 may check whether the calculated degree of similarity, as represented by the confidence score, is sufficiently low (e.g., below a preconfigured user-configurable threshold level of similarity), and if so, may cause the input data to be added to training data 903 for retraining the AI model.

The training data 903 may be stored in a location that is remote from autonomous vehicle 120. EUC subsystem 904 may communicate the real time input data to be added to training data 903 to a remote interface module (RIM) subsystem 908, which may then communicate the input data to a location where the training data is stored. The real time input can then be added to training data 903 and the updated training data 903 can then be used to retrain AI model 906.

As depicted in FIG. 9 and described above, sensor fusion subsystem 910 receives model prediction 912 from trained AI model 906 and also receives the confidence score generated for the AI model from EUC subsystem 904. Sensor fusion subsystem 910 may then determine, based upon the confidence score, whether or not the prediction 912 is to be used for downstream decision-making. In some instances, if the score is below a certain threshold, thereby indicating that the real time sensor data input is different from the training data used to train the AI model, sensor fusion subsystem 910 may determine that the model prediction 912 is not to be used.

In certain embodiments, the processing depicted in FIG. 9 may be performed by perception subsystem 204. Subsystems 904 and 910 may be part of perception subsystem 204 and the AI model 906 may be a convolutional neural network (CNN) model that is used by perception subsystem 204 to identify objects or entities in the ego vehicle's environment based upon sensor data (e.g., camera images, LIDAR data) received by perception subsystem 204. EUC subsystem 904 may be configured to generate a confidence score for the CNN model based upon a comparison of the distribution of the training data used to train the CNN model and a distribution of the real time sensor data inputs received from sensors. A low confidence score may indicate that the real time sensor data inputs are different from the training data used to train the CNN model, it may provide a measure of the level of confidence in the prediction made by the CNN model. Sensor fusion subsystem 910 may then use this confidence measure to determine whether or not to rely upon or use the prediction made by the CNN model.

Figure 10:
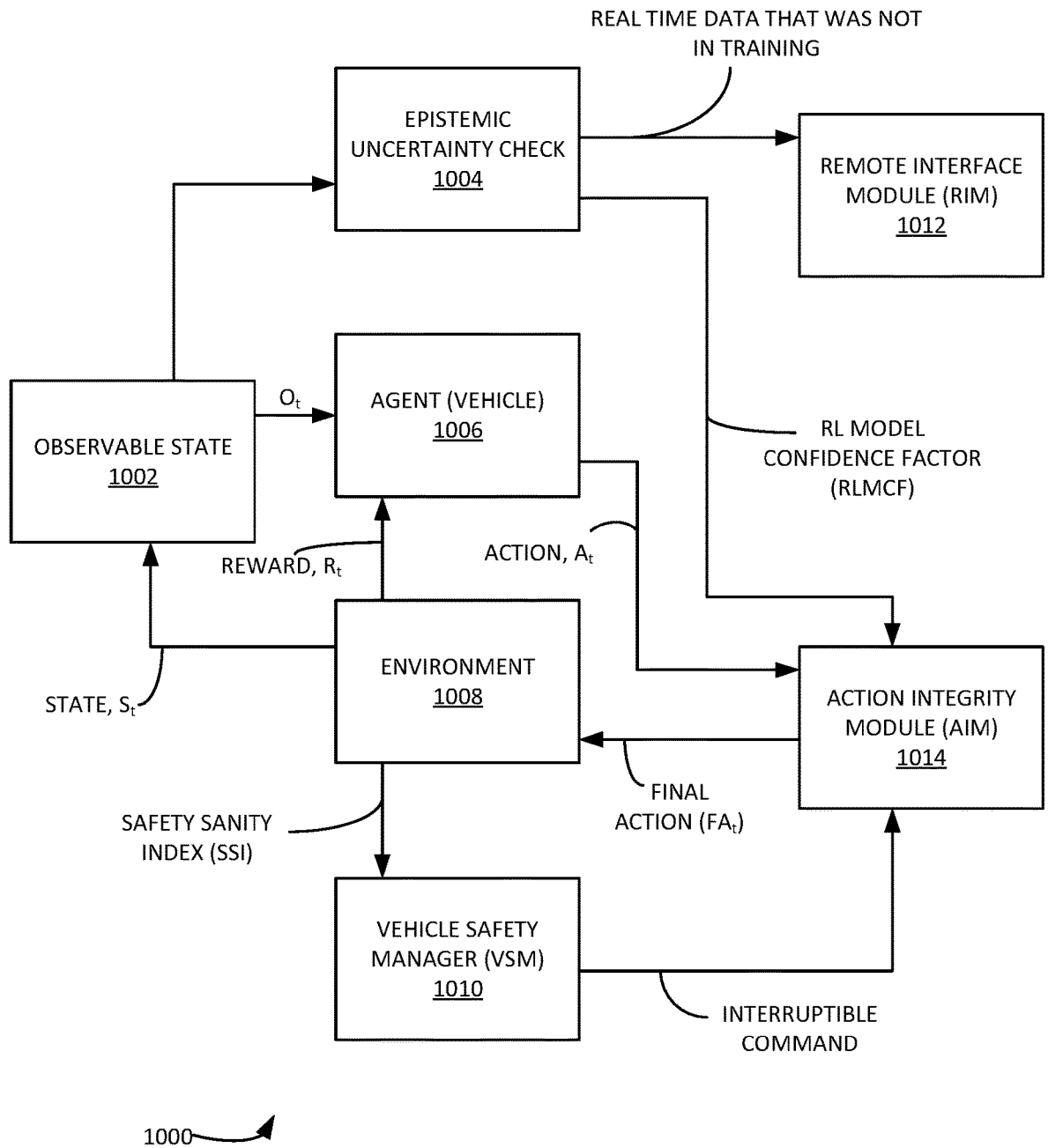
FIG. 10 illustrates subsystems and a data flow for using a reinforcement learning (RL) based AI model according to some embodiments.

FIG. 10 illustrates subsystems and a data flow for using an reinforcement learning (RL) based AI model according to some embodiments. The embodiment depicted in FIG. 10 is merely an example and is not intended to unduly limit the scope of claimed embodiments. One of ordinary skill in the art would recognize many possible variations, alternatives, and modifications. For example, alternative embodiments may use more or fewer subsystems or components than those shown in FIG. 10, may combine two or more subsystems, or may have a different configuration or arrangement of subsystems. The subsystems may be implemented using software only, hardware only, or combinations thereof. In certain embodiments, the processing depicted in FIG. 10 may be performed by planning subsystem 206 that is configured to generate a plan of action using an RL trained model in certain embodiments.

In FIG. 10, agent 1006 (also referred to as a learning agent or RL agent) represents the RL model that is built and trained using a reinforcement learning (RL) framework. Agent 1006 interacts with an environment (represented in FIG. 10 by environment 1008) through actions determined by the agent in order to fulfill a particular goal. Agent 1006 learns based upon a reward function, which indicates to the agent when it is doing well and when it is doing poorly. An RL agent learns and is trained by maximizing the rewards function. The agent's sole objective is to maximize the total reward it receives over the long run in achievement of the particular goal. The rewards function can be designed to specifically learn a specific decision making process. For example, in an autonomous vehicle, agent 1006 may learn when to perform an autonomous function, such as when to change lanes, etc. Agent 1006 learns to choose actions over time in response to specific input states so as to maximize the reward.

Environment 1008 is typically a set of states that the agent is attempting to influence via its choice of actions. In certain embodiments, the environment is a modeled as a stochastic finite state machine and receives actions as inputs and outputs observations about the environment (e.g., a state of the environment) and rewards that are sent to the agent. Environment 1008 models the behavior of the environment, especially how the environment will behave (or change states) in response to an action. For a given state and a given action, environment 1006 predicts what the next state will be and the next reward.

RL agent 1006 can be trained in a simulation environment and also in a runtime environment. Typically, RL agent 2006 is pre-trained in a simulation environment, then used in a runtime phase where it makes decisions regarding actions to be performed and continues its learning process.

Reinforcement learning agent 1006 interacts with environment 1008 in discrete time steps. In operation, for the embodiment depicted in FIG. 10, at each time "t", agent 1006 receives an observable state 1002 ($O_t$) and a reward ($R_t$) from environment 1008. The reward $R_t$ is a scalar feedback signal which indicates how well agent 1006 is doing at time t. Based upon the observable state 1002 $O_t$ and reward $R_t$, agent 1006 then chooses an action ($A_t$) from a set of available actions. In selecting the action $A_t$, the goal of agent 1006 is to maximize total future reward towards achieving the goal. Agent 1006 can choose any action as a function of the history of past states, actions, and rewards. Agent 1006 communicates the action $A_t$ to Action Integrity Module subsystem (AIM) 1014. AIM 1014 also receives an RL model confidence factor (RLMCF) input from Epistemic Uncertainty Check (EUC) subsystem 1004 and an interruptible command input (IC) from Vehicle Safety Manager subsystem 1010 (further description provided below). AIM subsystem 1014 determines a final action ($FA_t$) to be performed based upon inputs $A_t$ (from agent 1006), RLMCF (from EUC 1004), and IC (from VSM 1010) and communicates that final action to environment 1008. Environment 1008 moves to a new state $S_{t+1}$ (from state $S_t$) in response to the final action $FA_t$ and determines a reward $R_{t+1}$ associated with the transition ($S_t$, $FA_t$, $S_{t+1}$). Environment may send information regarding the next state ($S_{t+1}$) to observable state 1002 to update the observable state. At time (t+1), the observable state $O_{t+1}$ and reward $R_{t+1}$ is communicated to agent 1006 and the processing is repeated.

Accordingly, an observed state is provided as feedback to agent 1006 to decide the next action along with reward function. The reward function is generated by a mathematical function. The reward function captures the immediate indication if the action selected by the agent is good for the final goal or not. The agent receives a positive reward if the action moves the agent towards the goal (by moving the agent, it also affects the environment) and negative if it takes it away from the goal.

In one example, an observable state 1002 can include a set of parameters that are used to define the state of a system. For example, for an autonomous vehicle, an observable state at time "t" may include parameters such as the GPS location of the autonomous vehicle at time "t", speed of the autonomous vehicle at time "t", and other parameters. The observable state may include, for example, an image from a camera in vectorized form, the vehicle speed, position, and heading, offline map data in vectorized form, and the like. In a driving scenario, the observed state can be the set of states/actions of all the actors around the vehicle. The observed state can include a snapshot of a perception view and a vehicle's current state. It can include a snapshot of what all actors around the vehicle are doing currently. In one example, the observed state can be that the vehicle has moved ahead on the road five (5) feet along with its current speed, position, acceleration, lane position, nearby objects and their respective motions, etc. An observable state may include readings and input from one or more sensors associated (e.g., on-board or remote sensor) with an autonomous vehicle, such as a reading or input from a radar sensor, a LIDAR sensor, a camera, a Global Positioning System (GPS) sensor, a Inertial Measurement Unit sensor, a Vehicle-to-everything sensor, an audio sensor, a proximity sensor, a SONAR sensor, or other sensor associated with the autonomous vehicle.

As depicted in FIG. 10, the observed state 1002 is also fed to Epistemic Uncertainty Check (EUC) subsystem 1004. EUC subsystem 1004 determines how similar or dissimilar the input state distribution (i.e., the observable state $O_t$ 1002 received by EUC 1004) is to the training data state distribution that was used to train the RL agent. The training data in this case may include the historical set of observed states and actions taken by agent 1006. The training set distribution can be a multivariate distribution. Based on the comparison, the EUC subsystem outputs a confidence score or factor for the RL model (RL model confidence factor or RLMCF) that is indicative of a measure of the degree of similarity between the input state distribution and the training data distribution. RLMCF also provides an indication of how well RL agent model 1006 can predict an action given the current state. In certain embodiments, the greater the difference between the received observable state 1002 and the training data distribution, the lower the RLMCF. Likewise, the greater the similarity between the received observable state 1002 and the training data distribution, the higher the RLMCF. The RLMCF is communicated by EUC 1004 to AIM 1014.

For example, agent 1006 may have been trained on residential US streets based upon certain traffic patterns (e.g., left-hand drive, etc.). If agent 1006 is used to drive a car on a busy street in Mumbai, India, with heavy congestion and different traffic patterns (e.g., right-hand drive), the observed state received by EUC subsystem 1004 in Mumbai may be very different from the training data used to train agent 1006. In this scenario, EUC subsystem 1004 may generate and output an RLMCF that is indicative of a very low degree of similarity (or high degree of dissimilarity) between the observed state and the training data distribution. The RLCMF may then be communicated to AIM 1014.

As described above, since the functioning of agent 1006 is governed by the rewards function, agent 1006 is configured to determine an action so as to maximize the cumulative rewards in reaching a particular goal. For example, the goal for the autonomous vehicle may be to drive to a particular location (e.g., home) as possible. Given this goal, to maximize its reward, agent 1006 might literally select actions that cause the autonomous vehicle to drive as fast as possible, which could include breaking red lights, taking unsafe turns at a high speed, possibly overrunning pedestrians, etc. As can be seen, maximizing rewards, which all RL model agents use for selecting actions, does not guarantee safe action for the autonomous vehicle. This is a big problem with conventional RL-based system. Autonomous vehicle management system 122 addresses this problem by implementing a Safety Sanity Index (SSI) that provides an indication of the safety performance of the RL model (i.e., of agent 1006), and by providing VSM subsystem 1010 that is configured to monitor the SSI signal and take appropriate measures that impact the final action that is selected by AIM 1014 and performed by the autonomous vehicle.

As depicted in FIG. 10, SSI is computed by environment 1008 and communicated to VSM subsystem 1010. In certain embodiments, safety rules or considerations are configured for the autonomous vehicle and made available to environment 1008. Examples of such safety consideration include: maximum speed of the autonomous vehicle cannot exceed 65 MPH on a highway; maximum speed of the autonomous vehicle cannot exceed 30 MPH in a residential zone; a minimum allowable distance between the ego vehicle and an object in the ego vehicle's environment (e.g., another vehicle, a pedestrian) should be "D" meters; etc. Further, the safety considerations themselves may be prioritized such that some considerations are considered more (or less) important than other considerations. Given these safety considerations, based upon the current state of the autonomous vehicle, and potentially also based upon the past states (e.g., past "N" number of states), environment 1008 computes the SSI. In certain embodiments, environment 1008 applies a mathematical function (e.g., a dot product) to the state of the environment, including current states and past states, to compute an SSI value. For example, the SSI may have a range of "1" to "10", with "1" representing most safe and "10" representing a most unsafe condition. Environment 1008 may be configured to calculate the SSI at each time "t", and communicate the SSI values to VSM 1010. The SSI value provides an indication of a degree of safety given an observed state of the vehicle and one or more safety considerations for the vehicle.

As an example, if the autonomous vehicle is travelling at over 30 MPH in a residential zone, then an SSI indicative of an unsafe situation may be computed. As another example, if a transition of a traffic signal from yellow to red is detected and if the autonomous vehicle's speed is determined to be excessive given the stopping distance to the traffic light, then an SSI indicative of an unsafe situation may be computed. In the traffic light scenario, with successive states, if the speed of the autonomous vehicle does not go down and the distance to the traffic light keeps decreasing, then higher SSIs may be computed indicating an increase in the unsafe condition.

VSM 1010 is configured to determine and send commands (also referred to as interruptible commands) to AIM subsystem 1014 based on SSI values, both current and past, received from environment 1008. In certain embodiments, VSM 1010 sends an interruptible command to AIM 1014 only when there is a need for such a command (i.e., the interruptible command may not be sent at each time "t"). These commands are then used by AIM 1014 to determine a final action. In certain embodiments, the interruptible commands provided by VSM 1010 fall into one of the following categories:

(Category #1) Commands instructing AIM 1014 to override the action selected by agent 1006.
(Category #2) Commands instructing AIM 1014 to take a "safe" action from a set of safe actions (e.g., change speed to 10 MPH, do not change lanes).
(Category #3) Commands instructing AIM 1014 to take an "emergency" action from a set of emergency actions (e.g., stop the vehicle).

In determining which interruptible command to send to AIM 1014, VSM 1010 may consider the current (or latest) SSI received from environment 1008 and a history of past SSIs. For example, let's assume the SSIs can have a range of "1" to "10", with "1" representing most safe and "10" representing a most unsafe condition. If VSM 1010 receives a series of SSIs in the 1-3 range, VSM 1010 may not send any interruptible command to AIM 1014. Now consider a situation where current SSI is 5, compared to values between 1-3 in the past. In such a situation, VSM 1010, based upon the current SSI value and a sequence of past SSI values, VSM 100 may note a trend of increasing unsafe conditions (or a trend in the degree of safety of the vehicle) and send a Category #1 command to AIM 1014. This is to let AIM 1014 know that whatever actions the agent is selecting has increased unsafe conditions with respect to the autonomous vehicle. If the next few SSI values received by VSM 1010 are even higher than a 5 (e.g., values of 6s and 7s), then VSM 101 may send a Category #2 command to AIM 1014. If the next few SSI values received by VSM 1010 do not reduction in the unsafe conditions or show a further increase in unsafe conditions, then VSM 1010 may send a Category #3 to AIM 1014.

In the manner described above, the SSI signal provides an indication of a state of safety with respect to the autonomous vehicle. VSM 1010 monitors these safety signals and sends interruptible commands to AIM to maintain and prevent unsafe conditions, such as by overriding the actions chosen by agent 1006. Thus, even though the selection of actions by agent 1006 is based upon maximizing rewards, the SSI signals and the interruptible commands communicated by VSM 1010 to AIM 1014 provide mechanisms to override the actions selected by the agent and to, instead, take actions to maintain safety of the autonomous vehicle.

As described above, AIM subsystem 1014 receives as inputs an action selected by agent 1006, RLMCF generated by EUC 1004, and any interruptible command from VSM 1010. Based upon these commands, AIM 1014 decides a final action to be performed, Based upon these inputs, AMI subsystem 1014 then decides if the action suggested by agent 1006 is okay to send to environment 1008 as the final action, or whether some other action that overrides the action selected by agent 1006 should be sent to environment 1008 as the final action.

As an example, AIM 1014 may determine that the RLMCF received from EUC 1004 indicates a high degree of similarity between observable state 1002 and training data used for training agent 1006 (e.g., RLMCF is above some threshold value of similarity), and there is no interruptible command from VSM 1010. In such a situation, AIM 1014 may determine that the final action is the same as the action suggested by agent 1006. AIM 1014 may communicate the action selected by agent 1006 as the final action to environment 1008 where the action is performed.

As another example, AIM 1014 may determine that the RLMCF received from EUC 1004 indicates a low degree of similarity between observable state 1002 and training data used for training agent 1006 (e.g., RLMCF is below some threshold value of similarity), and as a result, the action suggested by agent 1006 may not be accurate. In such a situation, and further given that there is no interruptible command received from VSM 101, AIM 1014 may determine a final action that is different from the action suggested by agent 1006, thereby overriding the action suggested by agent 1006. AIM 1014 may communicate the final action to environment 1008 where the action is performed.

As another example, AIM 1014 may determine that the RLMCF received from EUC 1004 indicates a high degree of similarity between observable state 1002 and training data used for training agent 1006, and there is a Category #1 interruptible command received VSM 1010. In such a situation, AIM 1014 may determine a final action that is different from the action suggested by agent 1006, thereby overriding the action suggested by agent 1006, as per the interruptible command received from VSM 1010. AIM 1014 may communicate the final action to environment 1008 where the action is performed. In this example, even though there is a high degree of similarity between observable state 1002 and training data used for training agent 1006, the interruptible command received from VSM 1010 influences the final command that is selected by AIM 1014 to be sent to and executed by environment 1008.

As yet another example, AIM 1014 may determine that the RLMCF received from EUC 1004 indicates a high degree of similarity between observable state 1002 and training data used for training agent 1006, and there is a Category #2 interruptible command received VSM 1010. In such a situation, AIM 1014 may select one of "safe" actions as the final action and override the action suggested by agent 1006, as per the interruptible command received from VSM 1010. AIM 1014 may communicate the final action to environment 1008 where the action is performed.

In another example, AIM 1014 may determine that the RLMCF received from EUC 1004 indicates a high degree of similarity between observable state 1002 and training data used for training agent 1006, and there is a Category #3 interruptible command received VSM 1010. In such a situation, AIM 1014 may select one of "emergency" actions as the final action and override the action suggested by agent 1006, as per the interruptible command received from VSM 1010. AIM 1014 may communicate the final action to environment 1008 where the action is performed.

The framework depicted in FIG. 10 and described herein provides a robust and safe framework for handling of decisions decided based upon an RL model for autonomous vehicle 120. The inherent problems potentially associated with decisions made by an RL agent based upon maximizing rewards are now handled in a safe manner. By using EUC 1004, differences between the training data and inferring date (e.g., observed state for which an action is to be selected) are measured and used in the decision making. Additionally, by using SSI values and interruptible commands communicated by VSM 1010, the safety aspect of the autonomous vehicle is maintained. The interruptible commands enable actions selected by an RL agent to be overridden so as to maintain the overall safety of an autonomous vehicle.

The processing depicted in FIGS. 6, 7, 9, and 10, and described above helps to substantially increase the safety of autonomous vehicle 120. Autonomous vehicle management system 122 is now able to automatically and autonomously make judgments regarding AI model based predictions; when to use the predictions made using the AI model and when not to use the predictions because of various factors such as dissimilarities between the real time inputs and the training data, and safety considerations for the autonomous vehicle. This leads to the autonomous operations performed by autonomous vehicle 120 to be performed more safely than in conventional systems.

Current AI model based implementations do not provide such capabilities. Currently, if an AI model is being used for inferencing predictions, there is no guarantee whether the model output (i.e., the prediction) is accurate or not. This is because when an AI model is trained in or trained using data representative of a particular environment, its predictions are probably going to be inaccurate when the model is made to operate and make predictions in a completely different environment from which it was trained in. If the AI model was not trained on the real time input for which it is making predictions, its predictions are likely not going to be accurate.

For supervised learning AI models, the processing depicted in FIGS. 6 and 7 enables autonomous vehicle management system 122 to generate a confidence score that can be used to check the output predictions made using the AI model. The confidence score provides a value that can be used to determine the confidence with which a prediction made by the AI model can be trusted. In a similar manner, the RLMCF generated in FIG. 10 by EUC 1004 enables such processing to be applied for RL AI models.

As an example, consider an AI model that has been trained in a particular geographical environment involving animate (e.g., trees, animals, birds, and people on the street) and inanimate objects (e.g., surrounding infrastructure, etc.). The training data thus includes information pertaining to that particular geographical environment. Let's further assume that the AI model is being used for autonomous driving performed by a self-driving vehicle. If this trained AI model is used for making predictions for an environment that has a wide diversity of features in its objects (e.g., different ethnicity and features of people, different features of trees, different features of birds/animals, etc.). The chances that the AI model makes correct predictions in this new environment might range from very low to wrong predictions because it was trained on a data set with completely different features. Conventional systems do not provide any mechanism to check this.

As another example, consider an AI model that was trained to identify a pickup truck on a bright sunny day on a regular road. Now, if this AI model were taken to a mining environment, involving dusty roads, the confidence of that AI model predicting a pickup truck in this environment is much lower than in a regular trained environment.

The confidence score generated by an EUC subsystem (subsystem 904 in FIGS. 9 and 1004 in FIG. 10) enables such a situation to be automatically identified. The confidence score provides a measure of how likely a prediction made using an AI model is likely to be accurate. This confidence score can then be used to decide how to use the prediction made using the AI model. This increases the overall safety of the autonomous decision-making system. For example in the pickup truck example described above, if the AI model was used in a dusty mining environment, the confidence score generated for real time inputs received in such an environment would be low. This information can then be used to make decisions regarding predictions made by the AI model. For example, if the confidence score is low and below some threshold, the prediction made by the AI model may not be used. In this case, instead of making the autonomous vehicle perform an incorrect and potentially dangerous action decision based upon an inaccurate prediction, autonomous vehicle management system 122 instead is able to identify the low confidence nature of the prediction and take appropriate safe actions. This improves the safety of the autonomous operation performed by autonomous vehicle 120.

Additionally, as a result of the processing depicted in FIG. 7, training data for a supervised learning AI model can be automatically expanded to make the AI model better, i.e., better equipped to make predictions regarding a wider range of inputs. Generating sufficient training data for an AI model has always been a problem for training conventional AI systems. As a result, the abilities of these AI systems to make predictions regarding real time data are limited. The teachings described herein go a long way in addressing this problem. Per the processing depicted in FIG. 6 and described above, training data is automatically expanded by integrating real time sensor inputs having a low confidence score. In this manner, new input data, which has been identified based on the associated confidence score as being different from the training data, is now automatically identified for inclusion in the training data for retraining the AI model. Automatic expansion of the training data translates to a better trained AI model, which in turn translates to a more intelligent AI model that is now capable of making safer and better decisions for a wider range of inputs. In some embodiments, the AI model may be retrained during the runtime using the updated training data. This provides real-time updating of the AI model.

With respect to safety consideration, by using SSI values and interruptible commands communicated by VSM 1010, the safety aspect of the autonomous vehicle is maintained where RL models are used for decision making. The SSI values coupled with the interruptible commands provide an infrastructure that maintains vehicle safety even when an RL agent is used to select actions based upon maximizing rewards. Accordingly, for the example scenario discussed earlier where the goal for the RL model is for the autonomous vehicle to drive to a particular location (e.g., home) as fast as possible. Even if the RL model selects unsafe actions due to its goal to maximize its reward, autonomous vehicle management system 122 provide an infrastructure (including SSI values, VSM 1010, and AIM 1014) that prevents such unsafe actions from being performed and without compromising the overall goal of drive to a particular location (e.g., home) as fast as possible. The goal is achieved using an RL model but within certain configurable safety parameters or conditions.

Figure 12:
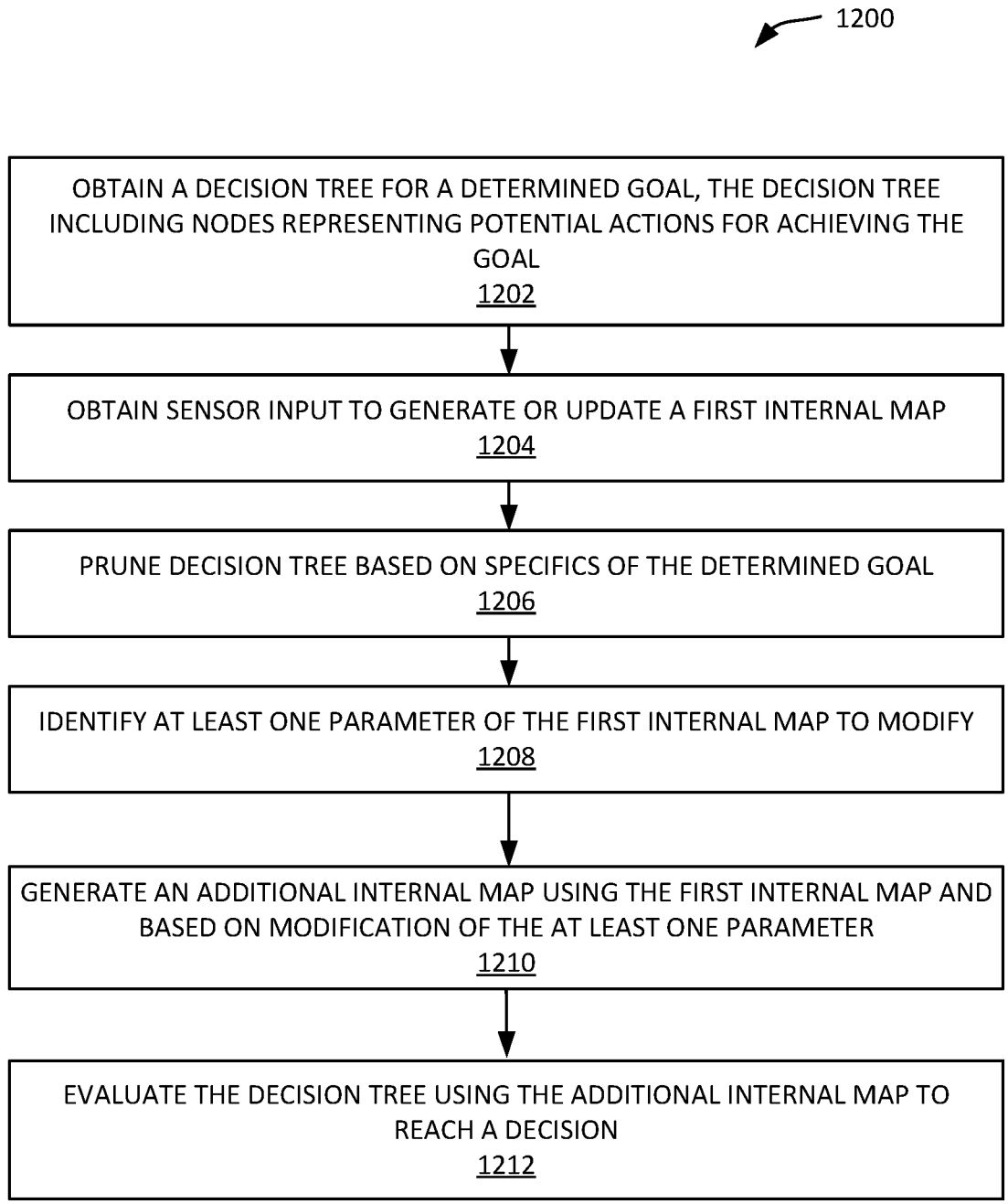
FIG. 12 depicts a simplified dataflow diagram showing processing performed by an autonomous vehicle management system for determining an action to perform based on analysis of a possible scenario according to certain embodiments.

FIG. 12 illustrates an example process 1200 for performing a "what-if" analysis. As discussed earlier in connection with the example of FIG. 2, the decision-making process can include evaluating and simulating various alternative scenarios that could potentially occur based on predictions regarding the behavior of actors or objects in the environment around the autonomous vehicle. Accordingly, the processing depicted in FIG. 12 can, in some embodiments, be performed by autonomous vehicle management system 122 and, in particular, the planning subsystem 206. The processing depicted in FIG. 12 can be incorporated into the processing in FIG. 5 including, for example, generating a plan of action at 508. The processing depicted in FIG. 12 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method presented in FIG. 12 and described below is intended to be illustrative and non-limiting. Although FIG. 12 depicts the various processing steps occurring in a particular sequence or order, this is not intended to be limiting. In certain alternative embodiments, the steps may be performed in some different order or some steps may also be performed in parallel.

At 1202, a decision tree is obtained for a particular goal that has been determined, for example, by planning subsystem 206 based on previously obtained sensor input. The decision tree can include a plurality of nodes representing conditions to be evaluated to make a decision on what action to take in order to achieve the goal. The decision tree can be stored as a data structure in a memory accessible to the autonomous vehicle management system, for example, memory 810 in FIG. 8. To obtain the decision tree, the autonomous vehicle management system may read from its storage location, for example, after the goal has been identified. After reading the decision tree, a copy of the decision tree may be written to a separate memory, e.g., a temporary work space, to facilitate the pruning process at 1206 (described below). In certain embodiments, multiple decision trees may be stored. For instance, each goal supported by the autonomous vehicle management system could have a separate decision tree stored for the goal.

Figure 13A:
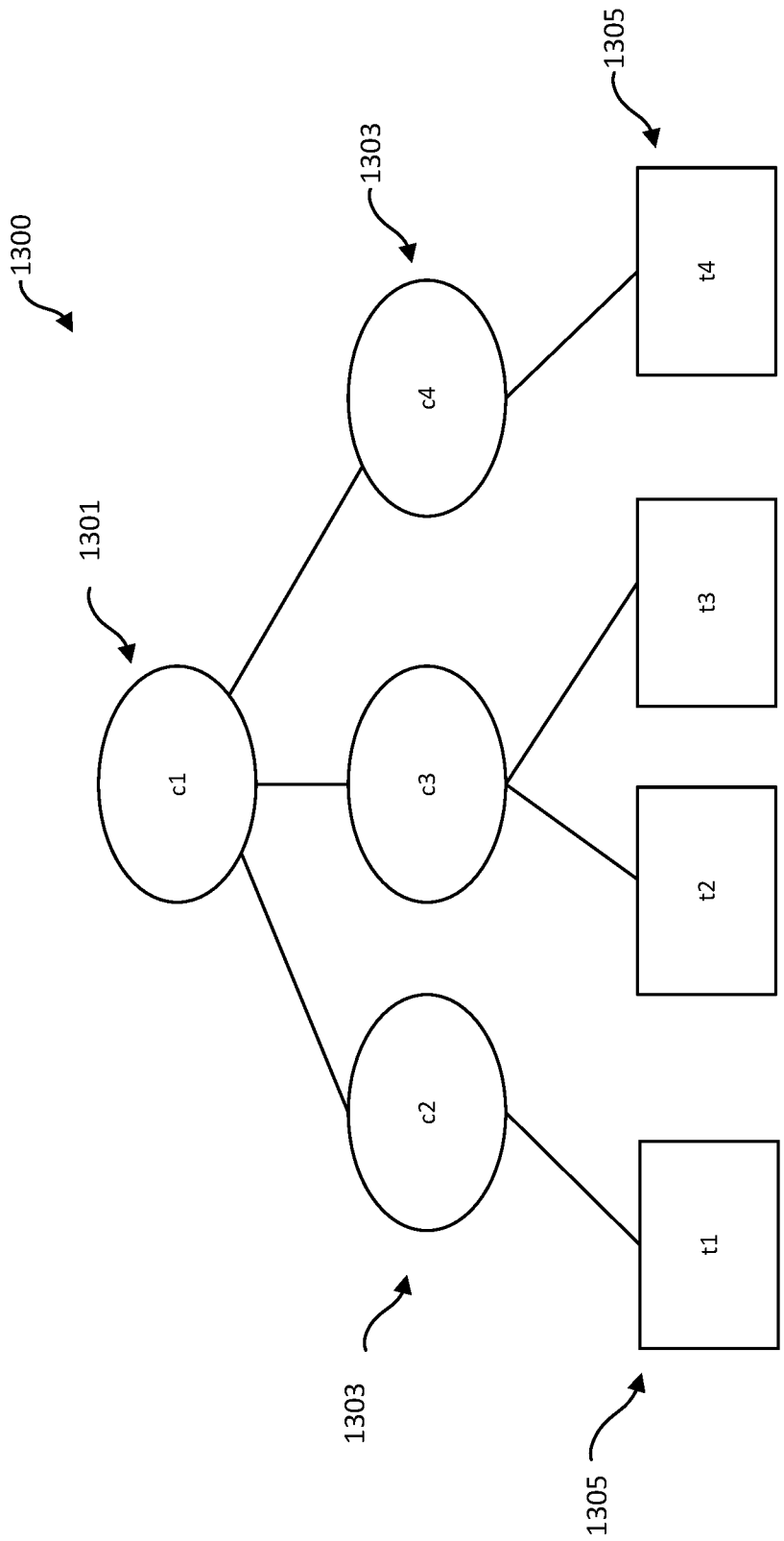
FIG. 13A depicts an example decision tree that can be used with the process depicted in FIG. 12 according to certain embodiments.

FIG. 13A shows an example of a decision tree 1300 that can be used with the process 1200. The decision tree 1300 comprises condition nodes 1301 and 1303, and task nodes 1305. FIG. 13A is merely an example of one way in which a decision tree can be implemented. Other types of decision tree structures can also be used with process 1200. Further, the decision tree 1300 is a simplified example; in practice, a decision tree could be much larger. The condition node 1301 corresponds to the root of the decision tree 1300 and may be configured to evaluate one or more conditions which, if true, trigger further evaluation by the condition nodes 1303. In particular, each of the condition nodes 1303 could be activated by a different condition or set of conditions that are evaluated by the condition node 1301. Multiple condition nodes 1303 can be activated in this manner at any given time. Alternatively, the condition node 1301 could be configured such that only one condition node 1303 is activated at a time. A condition can be based on the value or state of any type of information represented in an internal map. Conditions can, for example, relate to attributes of the autonomous vehicle or other objects in the environment, such as size, shape, volume, density, temperature, color, speed, acceleration, distance, etc. Each condition node 1303 may be associated with its own condition or set of conditions. Upon activation, each condition node 1303 may evaluate its own condition(s) to determine whether to proceed with an action represented by a task node 1305 to which the condition node 1303 is connected.

Task nodes 1305 represent actions that can be taken in furtherance of a goal that is the objective for which the decision tree 1301 is designed. Each task node 1305 can represent a single action or set of actions (e.g., an action sequence) for achieving the goal. For instance, if the goal is to make a turn, a first action t1 could include setting a particular steering angle, a second action t2 could include setting a different steering angle, a third action could include setting the same steering angle as t1, but with a certain amount of acceleration or braking, and so on. Thus, a task node may correspond to one or more instructions or commands that can be executed by at least one vehicle system (e.g., vehicle systems 112 in FIG. 2A). These instructions or commands can effect driving maneuvers or other actions that the autonomous vehicle is capable of performing such as, for example, activating a crane or drill.

At 1204, sensor input is obtained (e.g., from the sensors 110) to generate or update a first internal map. The obtaining of the sensor input at 1204 and the generating of the internal map can be performed in the same manner described above with respect to blocks 502 and 506 of FIG. 5, respectively.

At 1206, the decision tree is pruned based on the specifics of the goal in 1202. As mentioned above, in practice a decision tree can be quite large—possibly even infinite due to the potentially unlimited number of actions that could potentially be taken and/or conditions that could be evaluated. To constrain the decision tree to a more manageable size, the decision tree may be pruned to eliminate from consideration those conditions and/or actions which do not relate to the specifics of the goal. For example, the decision tree could be for making turning maneuvers in general, but if the goal is to make a right turn or change to the lane on the right side of the autonomous vehicle, then conditions and/or actions pertaining to the left side of the vehicle can be ignored. Pruning can be accomplished by modifying a stored representation of the decision tree to delete pruned nodes. Alternatively, instead of modifying the decision tree, the vehicle management system can simply keep track of which nodes have been pruned in order to prevent the pruned nodes from being activated.

Figure 13B:
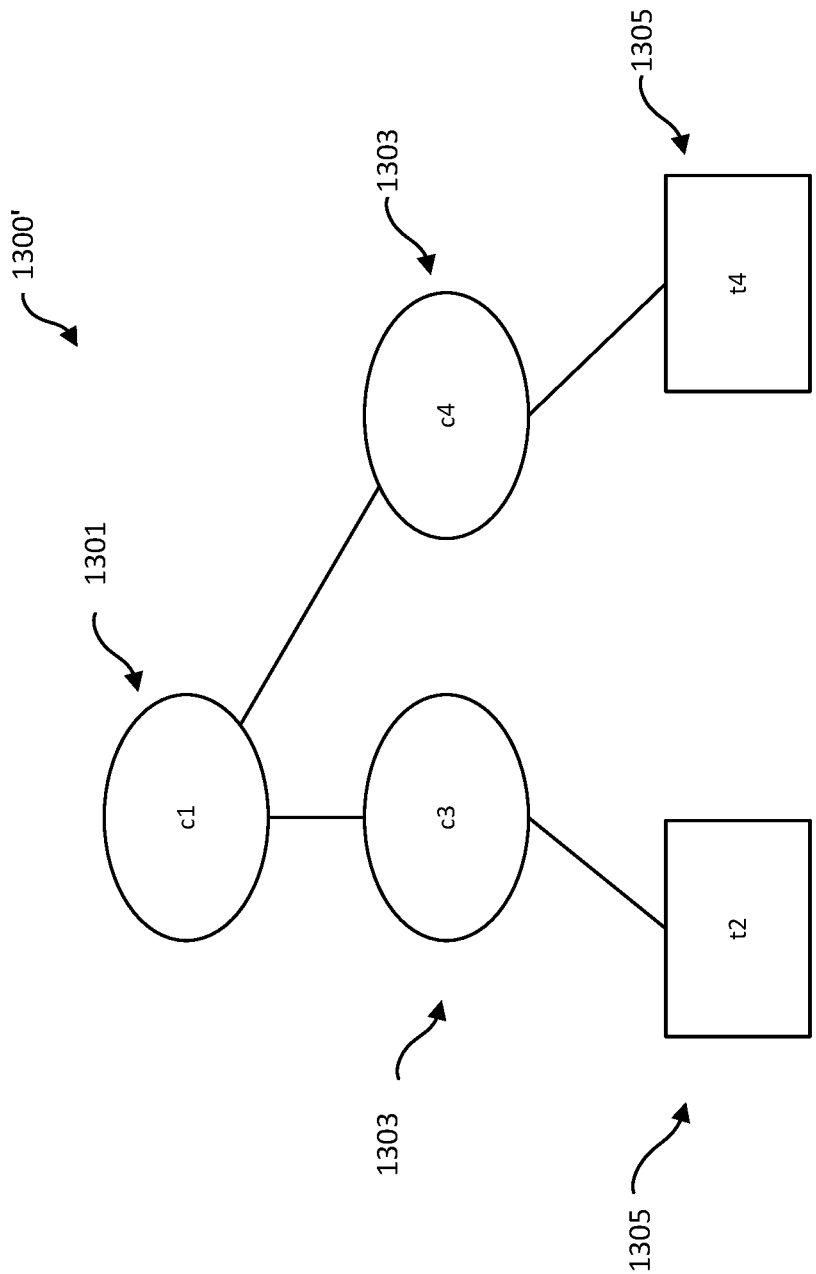
FIG. 13B depicts an example of pruning the decision tree from FIG. 13A.

FIG. 13B shows an example of a decision tree 1300' corresponding to what the decision tree 1300 could look like after the pruning in block 1206. The decision tree 1300 has been pruned by removing certain condition nodes 1303 and task nodes 1305.

At 1208, at least one parameter of the first internal map is identified for modification. In certain embodiments, the at least one parameter is a parameter that pertains to the conditions of the condition nodes that remain after pruning the decision tree. For instance, if the goal is to change to the right side lane, internal map parameters relating to the environment on the left side of the autonomous vehicle (e.g., the speed of a neighboring vehicle on the left) can be eliminated from consideration. Instead, one or more parameters relating to the environment on the right side of the autonomous vehicle can be identified as being relevant to the goal. For example, a relevant parameter can be the speed of a neighboring vehicle approaching from behind on the right side of the autonomous vehicle. The speed of this neighboring vehicle could be adjusted to analyze what would happen if, for example, the neighboring vehicle were to increase its speed by a certain amount within a certain time period. As another example, a relevant parameter could be the position of the neighboring vehicle within its lane, and the position of the neighboring vehicle could be adjusted to simulate what would happen if the neighboring vehicle were to deviate from its current lane position, e.g., by a certain distance towards the left edge of the lane. Thus, what parameter to select for modification, as well as how the parameter is modified, may depend on the particular goal being achieved. Speed and position of a neighboring vehicle are just a few examples of parameters that could be modified. Other examples include parameters relating to pedestrians or other objects with which the autonomous vehicle could potentially interact, as well as a direction of an object (e.g., different paths that the object could potentially take).

At 1210, an additional internal map is generated using the first internal map and based on modification of the at least one parameter identified in 1208. The at least one parameter can be modified by selecting a value within a certain range of parameter values that are likely or possible given the situation represented by the first internal map. For instance, if the first internal map indicates that the neighboring vehicle is currently traveling at twenty miles per hour, it is highly unlikely, perhaps even impossible, that the neighboring vehicle will increase its speed to eighty miles per hour within the next five seconds. In such a situation, the modification could be constrained to, for example, an increase to sixty miles per hour. Such modification enables scenarios that are not represented in the first internal map to be evaluated. Thus, the additional internal map represents the result of simulating a possible scenario that could occur, for example, seven seconds from now or at some other point in the future. How far to look ahead may vary depending on the goal being achieved, the current state of the autonomous vehicle (e.g., how fast the vehicle is traveling), the current state of the environment around the autonomous vehicle (e.g., how close an object is currently), or other factors.

The additional internal map can be generated by cloning the first internal map and then updating the clone to reflect the modification of the at least one parameter. Because the additional internal map is derived from the first internal map, the additional internal map can be computed relatively efficiently without, for example, having to process any additional sensor input. Further, it can be expected that much of the information contained in the first internal map will remain the same after modifying the at least one parameter. In certain embodiments, the additional internal map generated at 1210 can represent a subset of the volumetric space around the autonomous vehicle. For instance, the additional internal map can be generated by zooming into a specific region represented in the first internal map based on the goal to be achieved (e.g., zooming into a region on the right side if the goal is to turn right or zooming into a region behind the autonomous vehicle if the goal is to drive the autonomous vehicle in reverse).

In certain embodiments, multiple additional internal maps are generated at 1210 to simulate a plurality of potential scenarios. Additional internal maps could be generated to evaluate the effects of adjusting the same parameter by different amounts and/or different combinations of parameters. For instance, the first internal map could be used to derive a map based on the assumption that the neighboring vehicle will increase its speed to fifty miles per hour while moving two feet to the left, plus another map based on the assumption that the neighboring vehicle will increase its speed to sixty miles per hour without any lateral movement.

At 1212, the decision tree is evaluated using each internal map generated at 1210 in order to reach a decision as to which action or set of actions to take. The evaluation of the decision tree can be incorporated into the decision making performed by the planning subsystem 206, e.g., to select an action that maximizes a rewards function. The evaluation of the decision tree may involve further pruning the decision tree and/or identifying certain conditional branches to take based on the occurrence or non-occurrence of certain conditions, as indicated by the additionally generated internal map(s). For instance, if a condition requires that the neighboring vehicle be within five feet of the autonomous vehicle at the time of initiating the turn or lane change, but the additional internal map indicates that the neighboring vehicle will be twenty feet away after increasing its speed to sixty miles per hour, then it can be assumed that the condition will not occur. Any actions that depend on the occurrence of that condition will therefore be eliminated from consideration.

The additional internal map(s) can be evaluated in conjunction with the original internal map, i.e., the first internal map from block 1204. In this manner, the original internal map and the additional internal map(s) generated at 1210 may be applied as inputs for determining, using the decision tree, one or more actions to be performed. The use of additional internal maps generated for what-if scenarios enables look-ahead planning so that the decision is made not only based on the current state of things, but also based on events that could occur in the near future. In certain embodiments, the additional internal maps are generated to reflect the state of the environment around the autonomous vehicle several seconds in the future, e.g., to determine the state of a neighboring vehicle seven seconds from now.

As mentioned earlier, various types of information may be output to a user of an autonomous vehicle including, in certain embodiments, information about future planned actions to be performed by the autonomous vehicle. In particular, the actions indicated by the information output to the user may correspond to actions included in a plan of action generated by one or more components (e.g., planning subsystem 206) within an autonomous vehicle management system. One example mentioned earlier is the output of information indicative of a future action of lowering the speed of the autonomous vehicle, together with information indicating why the speed is going to be lowered. Any number of combinations of a planned action plus a reason for taking the planned action may be available for output depending on the decision making capabilities of the autonomous vehicle management system. The reason for the action may relate to a rule triggered based on information stored in an internal map. In certain embodiments, the future action indicated by a user interface is an action planned several seconds ahead of time. As explained in connection with the example process of FIG. 19, the planned action may not necessarily be an action that the autonomous vehicle management system has committed to performing at the time the user interface is presented to the user. Instead, the planned action may, in certain embodiments, be confirmed or canceled through further processing by the autonomous vehicle management system or through user intervention.

FIGS. 15 to 18 show various examples of user interfaces that can be used to output information about a planned action together with information indicating a reason for the action. The user interfaces depicted in FIGS. 15 to 18 correspond to graphical user interfaces (GUIs) that can be output on a display device in the autonomous vehicle and/or a display device remotely located from the autonomous vehicle. For example, in certain embodiments, a GUI can be output on an in-vehicle display for viewing by a vehicle occupant (e.g., the in-vehicle driver or a passenger). This would enable the occupant to not only anticipate the action being performed, but also understand why the autonomous vehicle management system is planning to take the action. As mentioned earlier, this can help the user feel safe while the vehicle is being autonomously controlled, as well increase the user's trust in the safety of the autonomous vehicle. Similarly, the GUI can be output on a display viewed by a remote user to enhance the remote user's understanding of how the autonomous vehicle management system is behaving. The remote user could be a remote operator or someone interested in monitoring the operation of the autonomous vehicle in real time. For example, the autonomous vehicle could be a mining or construction vehicle operating in conditions where it is unsafe or impractical to have the user be inside the vehicle. As another example, the autonomous vehicle could be part of a fleet of vehicles managed by an administrator who can request a service recall for the autonomous vehicle or generate an analytics report, based on insights learned through observing the output provided through the user interface.

Further, in certain embodiments, the user may be provided with the ability to manually override a planned action, for example, if the user believes the planned action is inappropriate or would prefer taking a different action. In certain embodiments, the ability to manually override a planned action may be limited, for example, to initiating an unscheduled stop using an emergency stop feature. Thus, the user could provide input that causes the planned action to be aborted, but may not necessarily be able to provide a manual substitute for the planned action. Outputting the information indicating the planned action together with the information indicating the reason for the action assists the user in such manual decisions by providing relevant information early on, thereby potentially avoiding the need for sudden manual intervention including, for example, overriding a planned action after the planned action has already begun to be performed. The inclusion of an indication of the reason for the planned action is particularly useful in this regard because such indicators can provide the user with a basis for determining whether the planned action makes sense.

Figure 15:
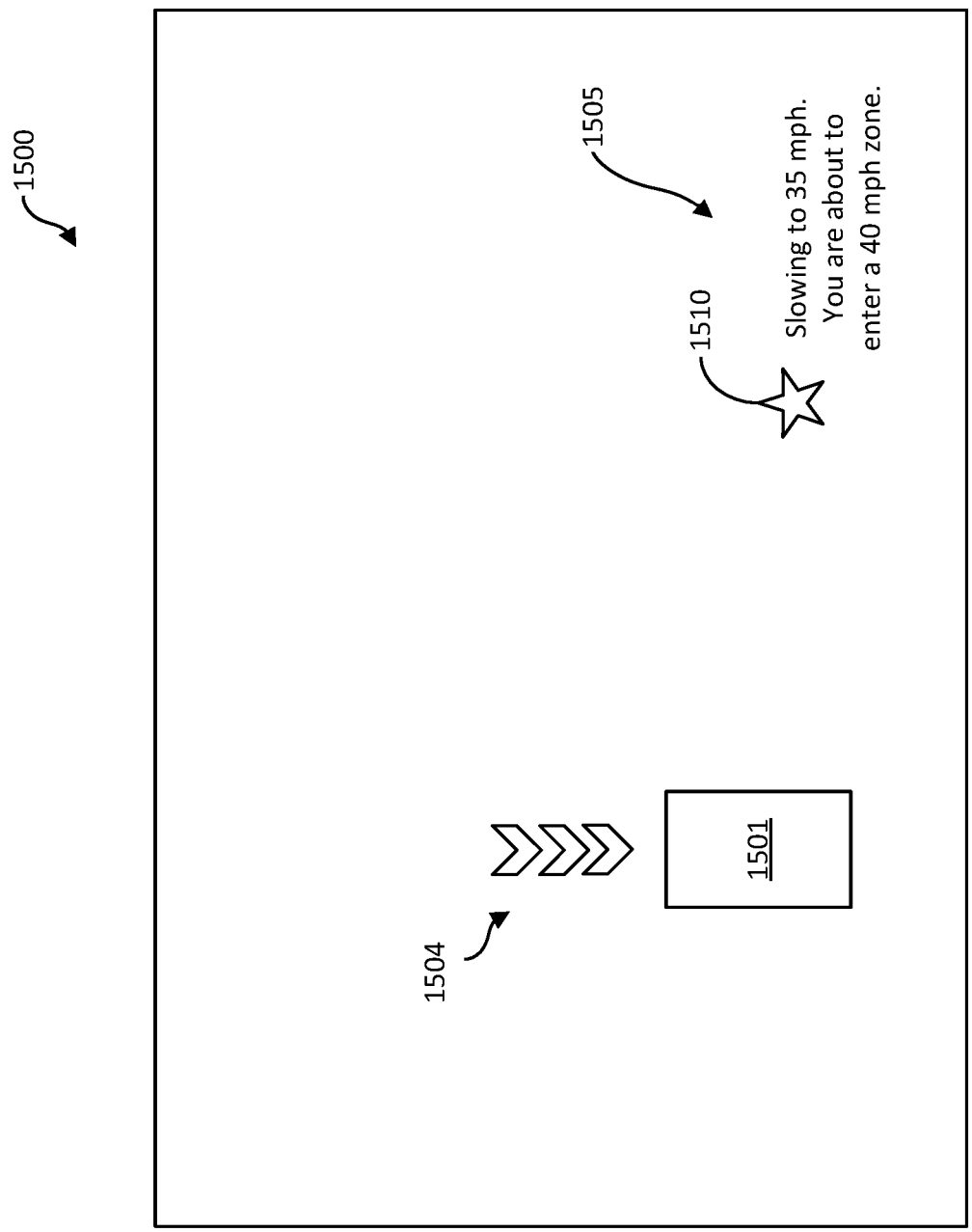
FIGS. 15 to 18 depict example user interfaces according to certain embodiments.

FIG. 15 illustrates an example user interface 1500 comprising graphical elements indicating a planned action and a reason for taking the action. In the example of FIG. 15, the planned action comprises slowing down to thirty five miles per hour, and is indicated in part by a graphical element 1501 representing the autonomous vehicle together with a graphical element 1504 representing the action of slowing down. The planned action is further indicated by text output 1505, which also indicates the reason for slowing to thirty five miles per hour: "You are about to enter a 40 mph zone." As depicted in FIG. 15, the text output 1505 may be accompanied by a graphical icon 1510 to draw the user's attention to the text. The user interface 1500 is a simplified illustration, as are each of the user interfaces depicted in FIGS. 16 to 18.

As FIG. 15 illustrates, the user interface may provide a certain level of detail about the planned action. For instance, in some situations, it may be sufficient to simply inform the user that the vehicle will be slowing down. In other situations, it may be more appropriate to provide additional detail on the planned action. For example, if slowing down to thirty five miles per hour requires abrupt, "hard" braking, the user interface 1500 could indicate how the autonomous vehicle management system intends to bring about the decrease in speed (e.g., an indication of friction braking). The amount of information presented to the user may therefore vary depending on the complexity of the action, the context in which the action is being performed, the number of reasons for taking the action, and/or other factors.

In certain embodiments, a user interface may include additional elements not depicted in FIGS. 15 to 18. For example, the graphical element 1501 representing the autonomous vehicle and the graphical element 1504 representing the action of slowing down could be overlaid on a geographic map of the environment around the autonomous vehicle. Additionally, although the examples depicted in FIGS. 15 to 18 comprise still images, in certain embodiments, a user interface may include one or more animations, for example, to show how the autonomous vehicle will move in relation to, or otherwise interact with, objects in the environment.

Figure 16:
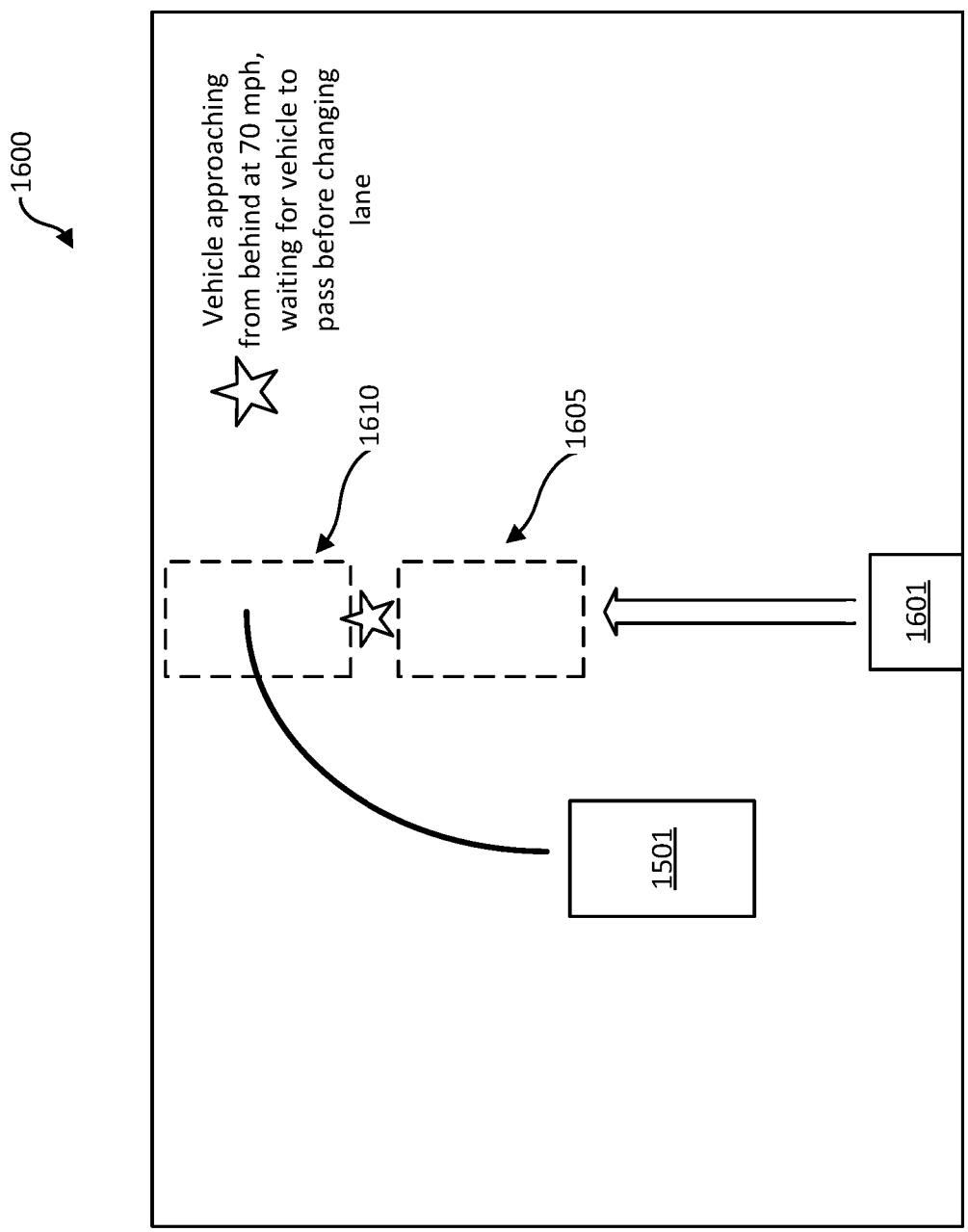

FIG. 16 illustrates an example user interface 1600 depicting an object in the environment. In this example, the object is a neighboring vehicle represented by a graphical element 1601, and the planned action is to wait for the neighboring vehicle to pass before changing lanes. A possible state of the neighboring vehicle is represented by a graphical element 1605 which, as shown in FIG. 16, can be an outline of a body of the neighboring vehicle. A possible state of the autonomous vehicle can similarly be represented using a graphical element 1610. The lane change is represented by a curved path connecting the graphical element 1501 to the graphical element 1610. The possible state of autonomous vehicle and/or the neighboring vehicle could be determined, for example, using the process illustrated in FIG. 12. In particular, one or more future scenarios can be simulated by deriving additional internal maps from a base internal map containing present information to determine the likely state of the autonomous vehicle and/or another object, such as the neighboring vehicle represented by graphical element 1601, at a certain point in the future (e.g., seven seconds from now).

Figure 17:
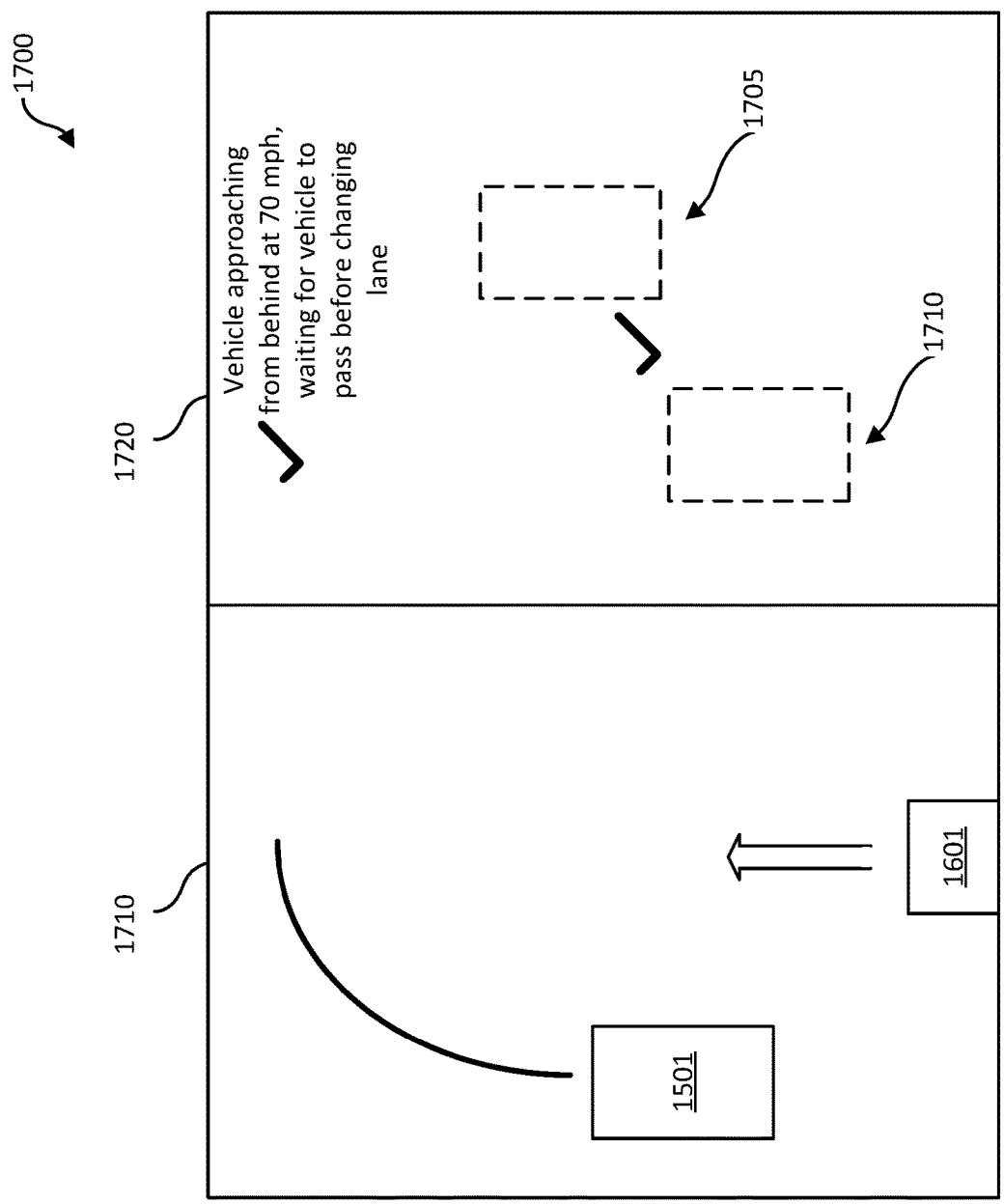

The scenario depicted in FIG. 16 represents what would likely occur if the autonomous vehicle were to attempt a lane change without waiting for the neighboring vehicle to pass. Thus, a user interface can depict a possible scenario that can be avoided by taking a particular action (in this example, waiting for the neighboring vehicle to pass). In the example of FIG. 16, the possible scenario involves an interaction between the autonomous vehicle and the neighboring vehicle in the absence of performing the indicated action. Alternatively or additionally, a user interface can depict what would happen as a result of taking the action. For instance, the user interface 1600 could be modified to show the predicted position of neighboring vehicle after it has passed the autonomous vehicle, as shown in FIG. 17. As with the example of FIG. 15, text output can be shown in order to explain the reason for taking the action (e.g., "Vehicle approaching from behind at 70 mph").

In certain embodiments, a user interface may indicate a range of possible states for the autonomous vehicle and/or an object in the environment. For instance, in FIG. 16, if the position of the neighboring vehicle cannot be predicted with absolute certainty, the user interface 1600 may indicate possible positions for the neighboring vehicle by drawing a boundary around the locations where the neighboring vehicle could be located at a certain point in the future.

FIG. 17 illustrates an example user interface 1700 with multiple segments. The user interface 1700 comprises a first screen 1710 and a second screen 1720. The screen 1710 shows the same indicators 1501 and 1601 described in connection with FIG. 16. The screen 1720 comprises the same text output from FIG. 16, plus graphical elements 1705 and 1710 that respectively represent the possible positions of the neighboring vehicle and the autonomous vehicle after postponing the lane change, e.g., after waiting for seven seconds.

Figure 18:
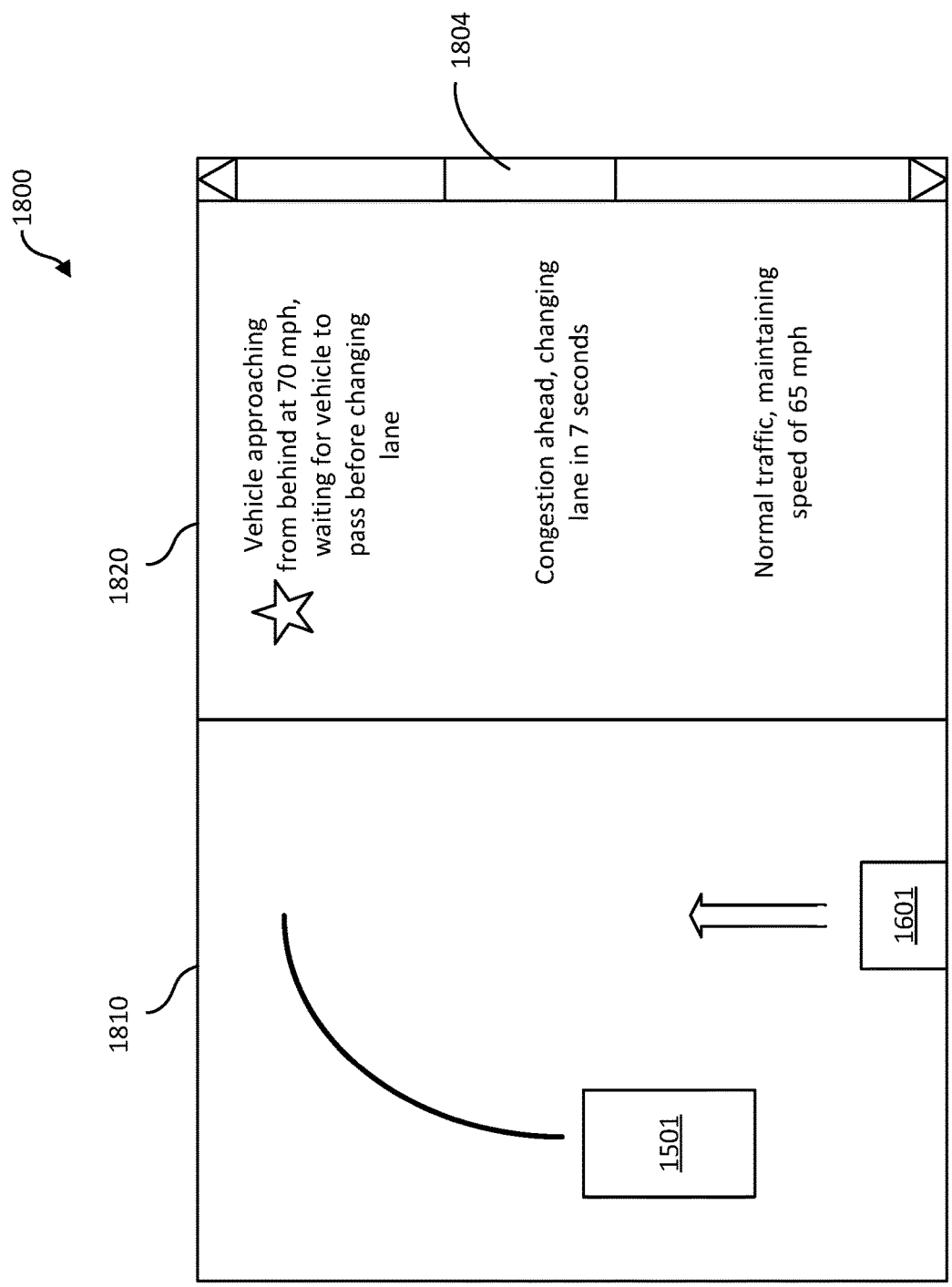

FIG. 18 illustrates an example of a user interface 1800 with multiple segments. The user interface 1800 comprises a first screen 1810 and a second screen 1820. The screen 1810 is identical to the screen 1710 in FIG. 17. The screen 1820 is a message window containing messages generated in connection with actions planned by the autonomous vehicle management system. The messages can be stored in a log file for subsequent use, e.g., for vehicle diagnostics. In certain embodiments, messages may be stored together with a copy of one or more internal maps that were used for determining a planned action. The autonomous vehicle management system could therefore generate a log file that stores more information than that which is indicated to the user. In certain embodiments, the log file may include a list of rules that were triggered or conditions that were evaluated in determining the planned action. Such logging would enable more detailed evaluation of the decisions made by the autonomous vehicle management system at a later time. The screen 1820 may also include a scroll bar 1804 or other navigation element that enables the user to browse through the messages, which may be arranged in a certain order, e.g., chronologically with the most recent message at the top of the screen 1820.

The messages shown in screen 1820 can include messages indicating reasons for a planned action to be performed in the future as well as messages indicating reasons for past actions that were planned but not performed, or past actions that have already been performed. This enables the user to understand the progression of reasoning behind the decisions made by the autonomous vehicle management system. For example, it may have been decided, based on detecting normal traffic flow thirty seconds ago, that the autonomous vehicle should maintain a speed of sixty five miles per hour without changing course of direction. Subsequently, a decision to change lanes could have been made, e.g., ten seconds ago, based on detecting congestion ahead. After making the decision to change lanes, a decision to wait for the neighboring vehicle to pass before changing lanes could have been made based on determining that the neighboring vehicle is traveling at a speed and/or acceleration that does not leave sufficient room to safely perform the lane change. As discussed above in connection with FIG. 16, such a determination can be made by simulating future scenarios based on presently known information, a process described in further detail with respect to FIG. 12. Thus, the user interface can indicate the next action to be performed in addition to actions that have been performed to completion or superseded by subsequently determined actions.

Figure 19:
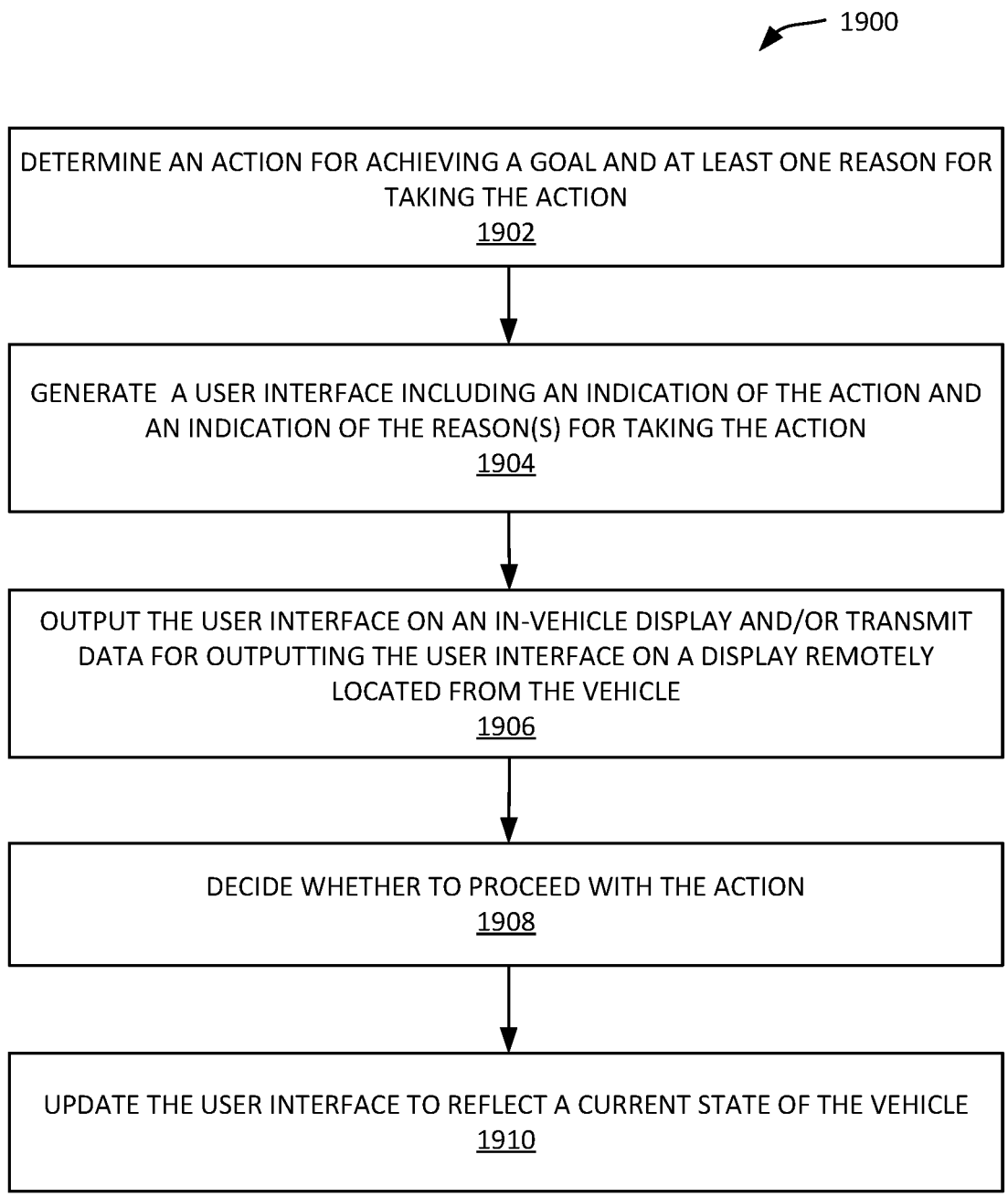
FIG. 19 depicts a simplified dataflow diagram showing processing performed by an autonomous vehicle management system for generating a user interface according to certain embodiments.

FIG. 19 illustrates an example process 1900 for generating a user interface according to certain embodiments. The processing depicted in FIG. 19 can, in some embodiments, be performed by autonomous vehicle management system 122 and, in particular, the planning subsystem 206. The processing depicted in FIG. 19 may be implemented in software (e.g., code, instructions, program) executed by one or more processing units (e.g., processors, cores) of the respective systems, hardware, or combinations thereof. The software may be stored on a non-transitory storage medium (e.g., on a memory device). The method presented in FIG. 19 and described below is intended to be illustrative and non-limiting. Although FIG. 19 depicts the various processing steps occurring in a particular sequence or order, this is not intended to be limiting. In certain alternative embodiments, the steps may be performed in some different order or some steps may also be performed in parallel.

At 1902, an action is determined for achieving a goal, together with at least one reason for taking the action. The reason can be a reason which served as a basis for the determination of the action. Therefore, the determining of the reason can be performed as part of determining the action. For example, the action could be to reduce the speed of the autonomous vehicle and the reason for reducing the speed could be because a slower speed zone is sensed, because it is determined that another vehicle in front of the autonomous vehicle is slowing down, or because the presence of one or more people is sensed in the vehicle's environment (e.g., presence of a road working crew or a pedestrian), and the like. In certain embodiments, the determination of the action and its corresponding reason can be performed using the process 1200 of FIG. 12. In particular, the autonomous vehicle management system may decide to take a particular action based on simulating a possible scenario, using one or more internal maps derived from a first internal map that has been generated based on current sensor input. Alternatively, the action and reason could be determined without performing a "what-if" analysis. For example, a decision to slow down could be made as part of the plan of action generated at block 508 of FIG. 5, but without incorporating the processing depicted in FIG. 12.

At 1904, a user interface is generated to include an indication of the action determined at 1902 and an indication of the reason or reasons determined at 1902. Various examples of indicators have been described in connection with FIGS. 15 to 18. Accordingly, the user interface generated at 1904 may comprise graphical icons, text information, static images, animations, and the like. In situations where there are multiple reasons for the action, the user interface could be generated so as to indicate only a subset of the reasons, e.g., by ranking the reasons in order of importance or level of contribution to the determination of the action, and then selecting one or more top ranking reasons for output through the user interface. Additionally, in certain embodiments, the user interface can include audio content. For example, the text output 1505 in FIG. 15 could be supplemented or replaced with an audio message generated using text-to-speech. Thus, output of a user interface is not limited to display devices, but can involve other types of output devices such as audio speakers.

At 1906, the user interface may be output on an in-vehicle display. Data for outputting the user interface on a display remotely located from the autonomous vehicle may also be transmitted, e.g., to a computer system of a remote user, for rendering the user interface on the remote display. In certain embodiments, the user interface may be output through multiple displays. For example, each of the screens 1710 and 1720 in FIG. 17 could be shown on a separate display screen/device inside the autonomous vehicle.

At 1908, a decision is made whether to proceed with the action. This decision can be based on updated sensor information received after the determining of the action in 1902. For instance, in the example of FIG. 18, an earlier version of the user interface 1800 may have been generated to indicate a lane change as the next action to be performed based on detection of congestion. In response to updated sensor information received after making the decision to change lanes (e.g., sensor information indicating that the neighboring vehicle is approaching from behind at seventy miles per hour), a decision could then have been made to postpone the lane change by waiting for the neighboring vehicle to pass.

At 1910, the user interface is updated to reflect a current state of the autonomous vehicle. For example, if the decision in 1908 was to perform the action, the user interface can be updated after the action is completed (e.g., to show the position of the autonomous vehicle after making a right turn) or while the action is underway (e.g., to show the autonomous vehicle turning). Similarly, if the decision was to abort or postpone the action, the user interface can be updated to show that the autonomous vehicle is maintaining a certain state, e.g., staying on the same path and at the same speed as that which may have been set prior to the determination of the action in 1902. If the user intervened by overriding the action, an outcome of the user intervention can also be shown in the updated user interface. In this manner, the user interface can provide information on the current state of the autonomous vehicle and/or the current environment around the autonomous vehicle, and information on actions that may be performed in the near future (e.g., actions planned for five to ten seconds ahead).

Figure 8:
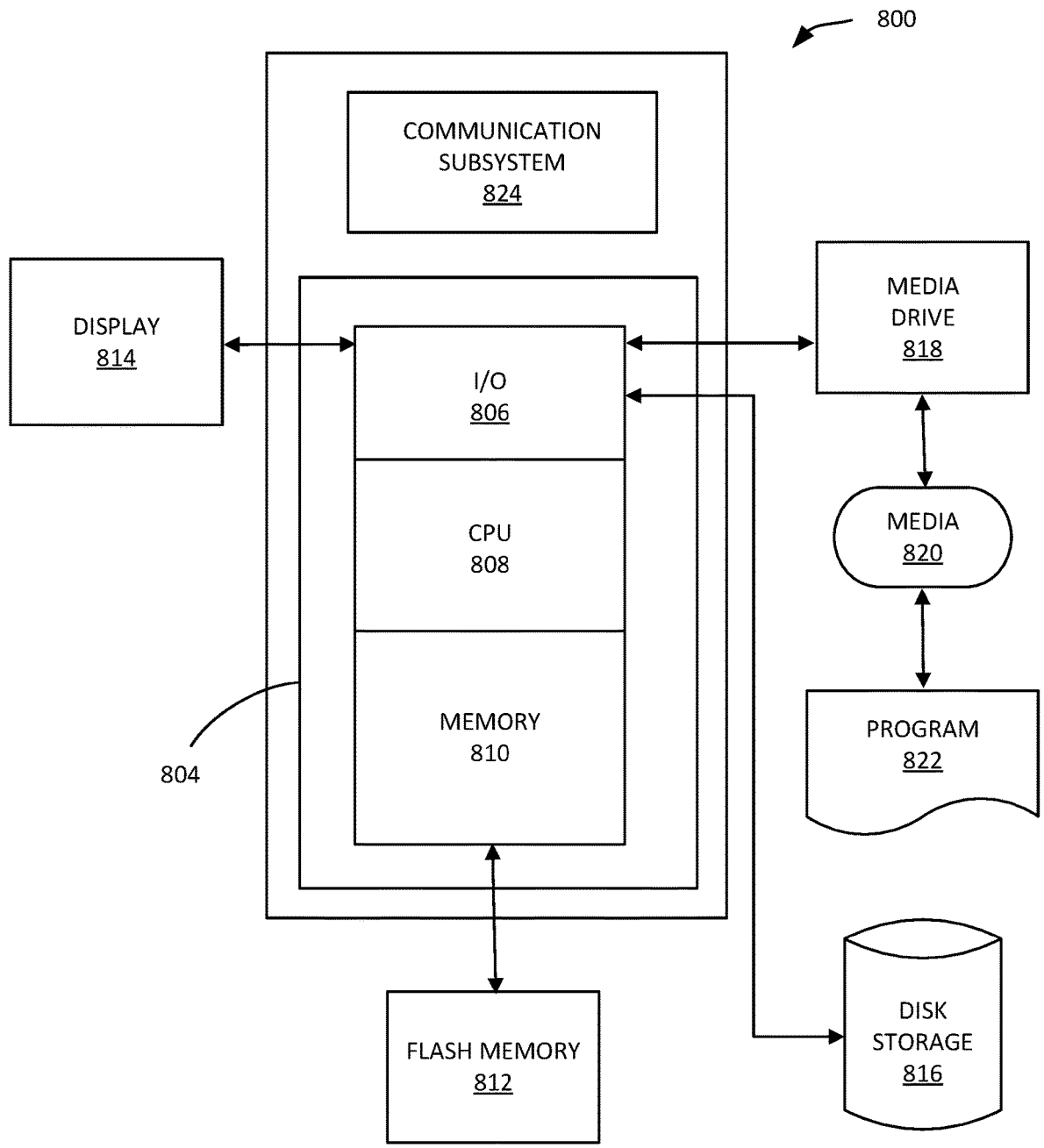
FIG. 8 depicts a simplified block diagram of an exemplary computing system that can be used to implement one or more of the systems and subsystems described in this disclosure and/or to perform any one of the processes or methods described herein.

FIG. 8 depicts a simplified block diagram of an exemplary computing system 800 that can be used to implement one or more of the systems and subsystems described in this disclosure and/or to perform any one of the processes or methods described herein. For example, in embodiments where autonomous vehicle management system 122 is implemented in software, the software may be executed by a computing system such as computing system 800 depicted in FIG. 8. Computing system 800 may include, for example, a processor, memory, storage, and I/O devices (e.g., monitor, keyboard, disk drive, Internet connection, etc.). In some instances, computing system 800 may also include other components, circuitry, or other specialized hardware for carrying out specialized functions. In some operational settings, computing system 800 may be configured as a system that includes one or more units, each of which is configured to carry out some aspects of the processes either in software only, hardware only, or some combination thereof. Computing system 800 can be configured to include additional systems in order to fulfill various functionalities.

As depicted in embodiment in FIG. 8, computing system 800 includes one or more processors or central processing units (CPU) 808, a set of memories (including system memory 810, computer-readable media 820, and disk storage 816), and an I/O subsystem 806. These components may be communicatively coupled to each other via a bus subsystem that provides a mechanism for the various systems and subsystems of computing system 800 to communicate with each other as intended. The bus subsystem can be any of several types of bus structures including a memory bus or memory controller, a peripheral bus, a local bus using any of a variety of bus architectures, and the like. In some embodiments, components 808, 810 and 806 may be located on a motherboard 804.

CPU or processors 808 may include one or more processors. The processors may be single or multicore processors. Processors 808 can also be implemented using customized circuits, such as application specific integrated circuits (ASICs), or field programmable gate arrays (FPGAs). The processors are configured to execute instructions (e.g., programs, code, etc.) stored in the various memories, such as in system memory 810, on computer readable storage media 820, or on disk 816. The programs or processes may be executed sequentially or in parallel. In certain embodiments, computing system 800 may provide a virtualized computing environment executing one or more virtual machines. In such embodiments, one or more of processors 808 or cores of processors may be allocated to each virtual machine. In some embodiments, processors 808 may include special purpose co-processors such as graphics processors, digital signal processors (DSPs), or the like.

The set of memories can include one or more non-transitory memory devices, including volatile and non-volatile memory devices. Software (programs, code modules, instructions) that, when executed by one or more processors 808 provide the functionality described herein, may be stored in one or more of the memories. Flash memory 812 may also be included in certain embodiments. System memory 810 may include a number of memories including a volatile main random access memory (RAM) (e.g., static random access memory (SRAM), dynamic random access memory (DRAM), and the like) for storage of instructions and data during program execution and a non-volatile read only memory (ROM) or flash memory in which fixed instructions are stored. In some implementations, a basic input/output system (BIOS), containing the basic routines that help to transfer information between elements within computer system 800, such as during start-up, may typically be stored in the ROM. The RAM typically contains data and/or program modules that are presently being operated and executed by processor 808.

Executable code, program instructions, applications, and program data may be loaded into system memory 810 and executed by one or more processors 808. One or more operating systems may also be loaded into system memory 810. Examples of operating systems include, without limitation, different versions of Microsoft Windows®, Apple Macintosh®, Linux operating systems, and/or mobile operating systems such as iOS, Windows® Phone, Android® OS, BlackBerry® OS, Palm® OS operating systems, and others.

In certain embodiments, programming modules and instructions, data structures, and other data (collectively 822) that are used to provide the functionality of some embodiments may be stored on computer-readable media 820. A media drive 818 connected to computing system 800 may be provided for reading information from and/or writing information to computer-readable media 820. Computer-readable media 820 may include non-volatile memory such as a magnetic disk drive, an optical disk drive such as a CD ROM, DVD, a Blu-Ray® disk, or other optical media, Zip® drives, various types of memory cards and drives (e.g., a USB flash drive, SD cards), DVD disks, digital video tape, solid-state drives (SSD), and the like.

I/O subsystem 806 may include devices and mechanisms for inputting information to computing system 800 and/or for outputting information from or via computing system 800. In general, use of the term input device is intended to include all possible types of devices and mechanisms for inputting information to computing system 700. Input mechanisms may include, for example, a keyboard, pointing devices such as a mouse or trackball, a touchpad or touch screen incorporated into a display, a scroll wheel, a click wheel, a dial, a button, a switch, a keypad, audio input devices with voice command recognition systems, microphones, cameras, digital camcorders, portable media players, webcams, image scanners, fingerprint scanners, barcode readers, and the like. In general, use of the term output device is intended to include all possible types of devices and mechanisms for outputting information from computing system 800 to a user or other computer. User interface output devices may include one or more types of displays, indicator lights, or non-visual displays such as audio output devices, printers, speakers, headphones, voice output devices, etc.

Computing system 800 may include a communications subsystem 824 that provides an interface for computing system 800 to communicate (e.g., receive data, send data) with other computer systems and networks. Communication subsystem 824 may support both wired and/or wireless communication protocols. For example, communication subsystem 824 may enable computing system 800 to be communicatively coupled with remote sensors, with a network such as the Internet, and the like. Various different communication protocols and formats may be used for the communications such Wi-Fi, Bluetooth® (and/or other standards for exchanging data over short distances includes those using short-wavelength radio transmissions), USB, Ethernet, cellular, an ultrasonic local area communication protocol, etc.

Computing system 800 can be one of various types, including a mobile device (e.g., a cellphone, a tablet, a PDA, etc.), a personal computer, a workstation, or any other data processing system. Due to the ever-changing nature of computers and networks, the description of computer system 800 depicted in FIG. 8 is intended only as a specific example. Many other configurations having more or fewer components than the system depicted in FIG. 8 are possible.

At least some values based on the results of the above-described processes can be saved for subsequent use. Additionally, a computer-readable medium can be used to store (e.g., tangibly embody) one or more computer programs for performing any one of the above-described processes by means of a computer. The computer program may be written, for example, in a general-purpose programming language (e.g., Pascal, C, C++, Java, Python) and/or some specialized application-specific language (PHP, JavaScript, XML). It is noted that JavaScript has been used as an example in several embodiments. However, in other embodiments, another scripting language and/or JavaScript variants can be utilized as well.

The described features, structures, or characteristics of described in this disclosure may be combined in any suitable manner in one or more embodiments. In the description herein, numerous specific details are provided, such as examples of programming, software modules, user selections, network transactions, database queries, database structures, hardware modules, hardware circuits, hardware chips, etc., to provide a thorough understanding of various embodiments. One skilled in the relevant art will recognize, however, that the features may be practiced without one or more of the specific details, or with other methods, components, materials, and so forth. In other instances, well-known structures, materials, or operations are not shown or described in detail to avoid obscuring novel aspects.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although specific embodiments have been described, various modifications, alterations, alternative constructions, and equivalents are possible. Embodiments are not restricted to operation within certain specific data processing environments, but are free to operate within a plurality of data processing environments. Additionally, although certain embodiments have been described using a particular series of transactions and steps, it should be apparent to those skilled in the art that this is not intended to be limiting. Although some flowcharts describe operations as a sequential process, many of the operations can be performed in parallel or concurrently. In addition, the order of the operations may be rearranged. A process may have additional steps not included in the figure. Various features and aspects of the above-described embodiments may be used individually or jointly.

Further, while certain embodiments have been described using a particular combination of hardware and software, it should be recognized that other combinations of hardware and software are also possible. Certain embodiments may be implemented only in hardware, or only in software, or using combinations thereof. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques including but not limited to conventional techniques for inter-process communications, and different pairs of processes may use different techniques, or the same pair of processes may use different techniques at different times.

Specific details are given in this disclosure to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of other embodiments. Rather, the preceding description of the embodiments will provide those skilled in the art with an enabling description for implementing various embodiments. Various changes may be made in the function and arrangement of elements.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
   determining, by a controller system configured to control an autonomous operation of a vehicle, a goal to be achieved by the autonomous operation of the vehicle;
   obtaining, by the controller system, a decision tree comprising nodes that represent conditions to be evaluated for making a decision on what action to take in order to achieve the goal;
   generating, by the controller system, a first internal map based on sensor data from a plurality of sensors, the first internal map comprising a three-dimensional representation of an environment around the vehicle, information on a current state of the vehicle, and information about the environment;
   pruning, by the controller system, the decision tree to prevent one or more of the conditions from being evaluated, wherein the decision tree is pruned based on the goal to be achieved;
   modifying, by the controller system, one or more parameters of the first internal map that pertain to the conditions of the nodes that remain after pruning the decision tree;
   generating, by the controller system, a second internal map from the first internal map, based on modification of the one or more parameters; and
   evaluating, by the controller system, the pruned decision tree using the second internal map to make the decision on one or more actions for the vehicle to perform in order to achieve the goal.

2. The method of claim 1, further comprising presenting, by the controller system and a user interface, the one or more actions to a user.

3. The method of claim 1, further comprising controlling, by the controller system, the autonomous operation of the vehicle to achieve the goal using the one or more actions.

4. The method of claim 1, wherein the modifying the one or more parameters comprises changing an attribute of at least one of a speed of an object, a direction of the object, or a distance of the object to simulate a possible scenario.

5. The method of claim 4, wherein the object is located in the environment, wherein the one or more parameters correspond to the attribute of the object, and wherein the second internal map represents a possible state of the object.

6. The method of claim 5, wherein multiple internal maps are generated from the first internal map, the multiple internal maps include the second internal map, each of the multiple internal maps representing a different possible state of the object, and wherein the one or more actions are determined based on evaluation of each of the multiple internal maps.

7. The method of claim 1, further comprising selecting, by the controller system, an action from the one or more actions that maximizes a reward function, and controlling, by the controller system, the autonomous operation of the vehicle to achieve the goal using the selected action.

8. A non-transitory computer-readable medium storing instructions that, when executed by one or more processors, cause the one or more processors to perform operations including:
   determining a goal to be achieved by autonomous operation of a vehicle;
   obtaining a decision tree comprising nodes that represent conditions to be evaluated for making a decision on what action to take in order to achieve the goal;
   generating a first internal map based on sensor data from a plurality of sensors, the first internal map comprising a three-dimensional representation of an environment around the vehicle, information on a current state of the vehicle, and information about the environment;
   pruning the decision tree to prevent one or more of the conditions from being evaluated, wherein the decision tree is pruned based on the goal to be achieved;
   modifying one or more parameters of the first internal map that pertain to the conditions of the nodes that remain after pruning the decision tree;
   generating a second internal map from the first internal map, based on modification of the one or more parameters; and
   evaluating the pruned decision tree using the second internal map to make the decision on one or more actions for the vehicle to perform in order to achieve the goal.

9. The non-transitory computer-readable medium of claim 8, wherein the operations further include presenting, by a user interface, the one or more actions to a user.

10. The non-transitory computer-readable medium of claim 8, wherein the operations further include controlling the autonomous operation of the vehicle to achieve the goal using the one or more actions.

11. The non-transitory computer-readable medium of claim 8, wherein the modifying the one or more parameters comprises changing an attribute of at least one of a speed of an object, a direction of the object, or a distance of the object to simulate a possible scenario.

12. The non-transitory computer-readable medium of claim 11, wherein the object is located in the environment, wherein the one or more parameters correspond to the attribute of the object, and wherein the second internal map represents a possible state of the object.

13. The non-transitory computer-readable medium of claim 12, wherein multiple internal maps are generated from the first internal map, the multiple internal maps include the second internal map, each of the multiple internal maps representing a different possible state of the object, and wherein the one or more actions are determined based on evaluation of each of the multiple internal maps.

14. The non-transitory computer-readable medium of claim 8, wherein the operations further include selecting an action from the one or more actions that maximizes a reward function, and controlling, by the controller system, the autonomous operation of the vehicle to achieve the goal using the selected action.

15. A system comprising:
one or more processors;
a memory coupled to the one or more processors, the memory storing a plurality of instructions executable by the one or more processors, the plurality of instructions comprising instructions that when executed by the one or more processors cause the one or more processors to perform processing comprising:
determining a goal to be achieved by autonomous operation of a vehicle;
obtaining a decision tree comprising nodes that represent conditions to be evaluated for making a decision on what action to take in order to achieve the goal;
generating a first internal map based on sensor data from a plurality of sensors, the first internal map comprising a three-dimensional representation of an environment around the vehicle, information on a current state of the vehicle, and information about the environment;
pruning the decision tree to prevent one or more of the conditions from being evaluated, wherein the decision tree is pruned based on the goal to be achieved;
modifying one or more parameters of the first internal map that pertain to the conditions of the nodes that remain after pruning the decision tree;
generating a second internal map from the first internal map, based on modification of the one or more parameters; and
evaluating the pruned decision tree using the second internal map to make the decision on one or more actions for the vehicle to perform in order to achieve the goal.

16. The system of claim 15, wherein the processing further comprises presenting, by a user interface, the one or more actions to a user.

17. The system of claim 15, wherein the processing further comprises controlling the autonomous operation of the vehicle to achieve the goal using the one or more actions.

18. The system of claim 15, wherein the modifying the one or more parameters comprises changing an attribute of at least one of a speed of an object, a direction of the object, or a distance of the object to simulate a possible scenario.

19. The system of claim 18, wherein the object is located in the environment, wherein the one or more parameters correspond to the attribute of the object, and wherein the second internal map represents a possible state of the object.

20. The system of claim 19, wherein multiple internal maps are generated from the first internal map, the multiple internal maps include the second internal map, each of the multiple internal maps representing a different possible state of the object, and wherein the one or more actions are determined based on evaluation of each of the multiple internal maps.

* * * * *